United States Patent
Yuzuriha

(10) Patent No.: US 6,723,641 B2
(45) Date of Patent: Apr. 20, 2004

(54) METHOD OF MANUFACTURING SEMICONDUCTOR DEVICE AND METHOD OF DETERMINING FILM FORMATION TIME, CHAMBER, CHEMICAL VAPOR DEPOSITION APPARATUS AND BOAT THEREOF, ETCHING APPARATUS, AND FILM FORMATION PROCESS SYSTEM

(75) Inventor: Kojiro Yuzuriha, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/159,999

(22) Filed: Jun. 4, 2002

(65) Prior Publication Data

US 2003/0109134 A1 Jun. 12, 2003

(30) Foreign Application Priority Data

Dec. 12, 2001 (JP) ........................................ 2001-378232

(51) Int. Cl.$^7$ ............................................... H01L 21/44
(52) U.S. Cl. ...................... 438/680; 438/762; 438/770; 438/787; 438/790; 257/635; 257/639; 257/640
(58) Field of Search ................................ 438/680, 787, 438/770, 762, 790; 257/411, 635, 639, 640

(56) References Cited

U.S. PATENT DOCUMENTS 6,246,095 B1 * 6/2001 Brady et al. ................. 257/411

FOREIGN PATENT DOCUMENTS

| JP | 9-55480 | 2/1997 |
| JP | 9-275139 | 10/1997 |
| JP | 2001-217306 | 8/2001 |

* cited by examiner

Primary Examiner—David Nelms
Assistant Examiner—Reneé R. Berry

(57) ABSTRACT

After forming a phosphor-doped amorphous silicon film and before forming a bottom silicon oxide film, a heat treatment is performed while exhausting a gas from the vicinity of the silicon substrate. The heat treatment is performed at a temperature equal to or higher than that for forming the bottom silicon oxide film and at a pressure equal to or lower than that for forming the bottom silicon oxide film. Alternatively, after forming the phosphor-doped amorphous silicon film and before forming the bottom silicon oxide film, a TEOS oxide film and a phosphor-doped amorphous silicon film deposited on the back surface of the silicon substrate are removed. Further alternatively, these films deposited on the back surface of the silicon substrate are covered with a film which prevents gas desorption under the film formation condition for the bottom silicon oxide film.

11 Claims, 37 Drawing Sheets

F I G. 3
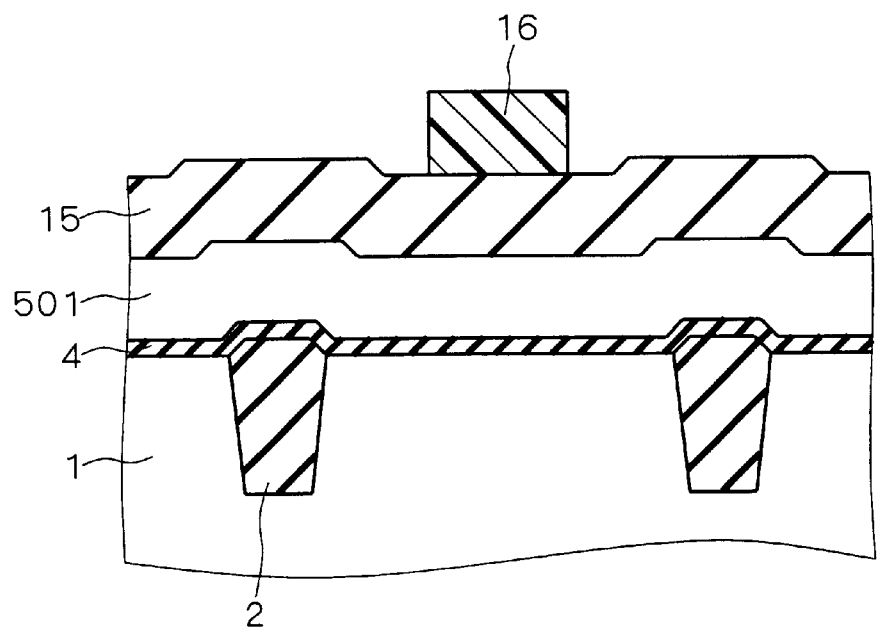
F I G. 4
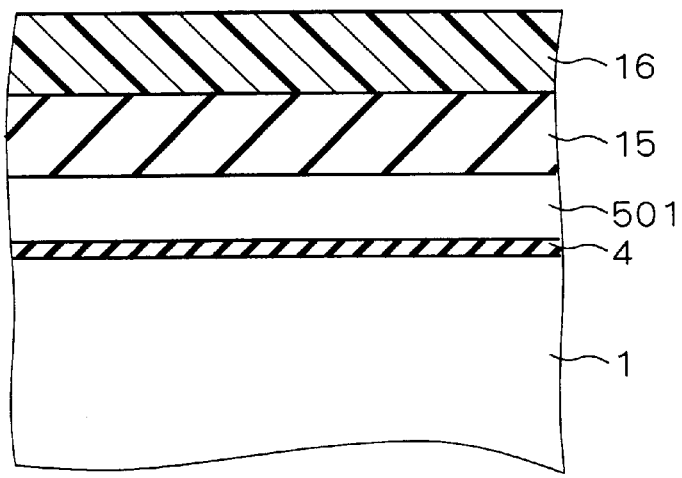

F I G. 24
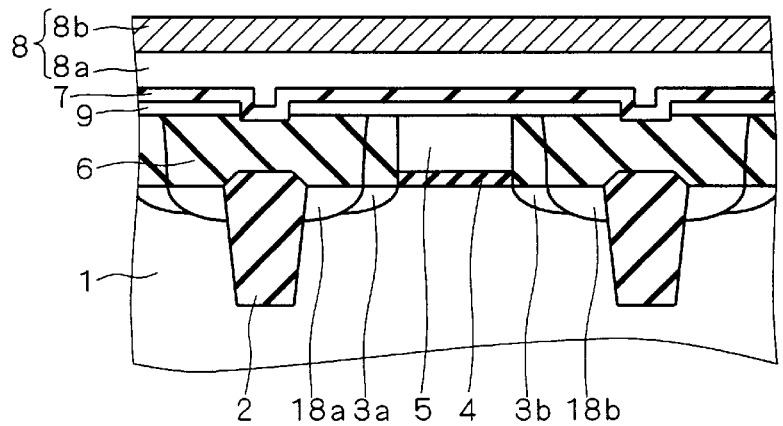
F I G. 25
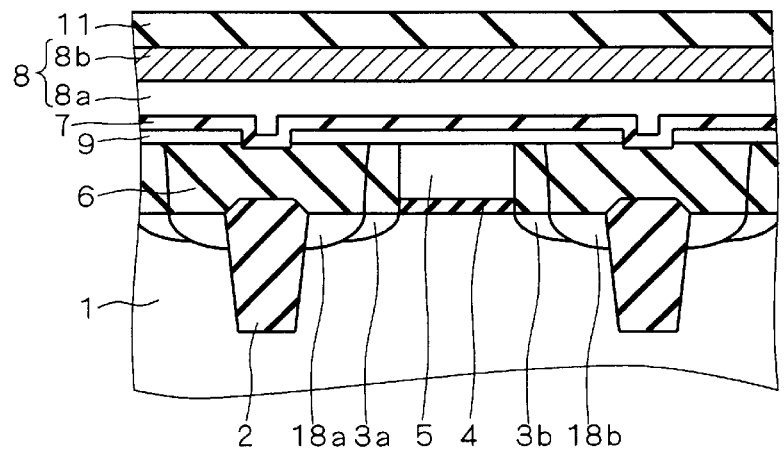
F I G. 26
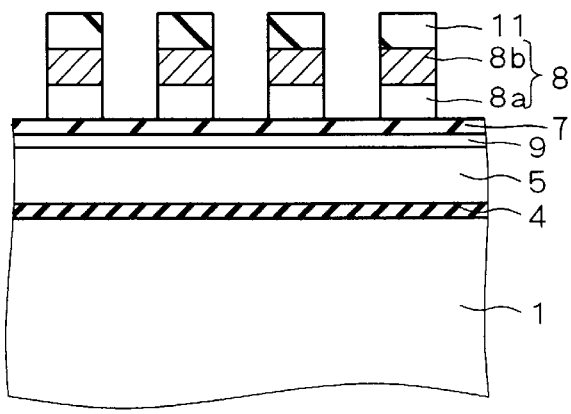

F I G. 39
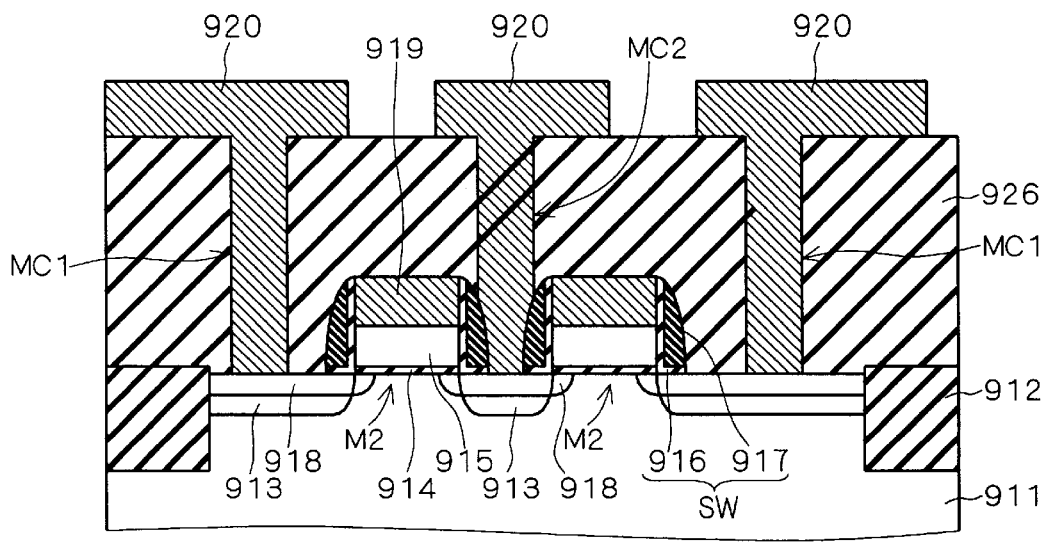
F I G. 40
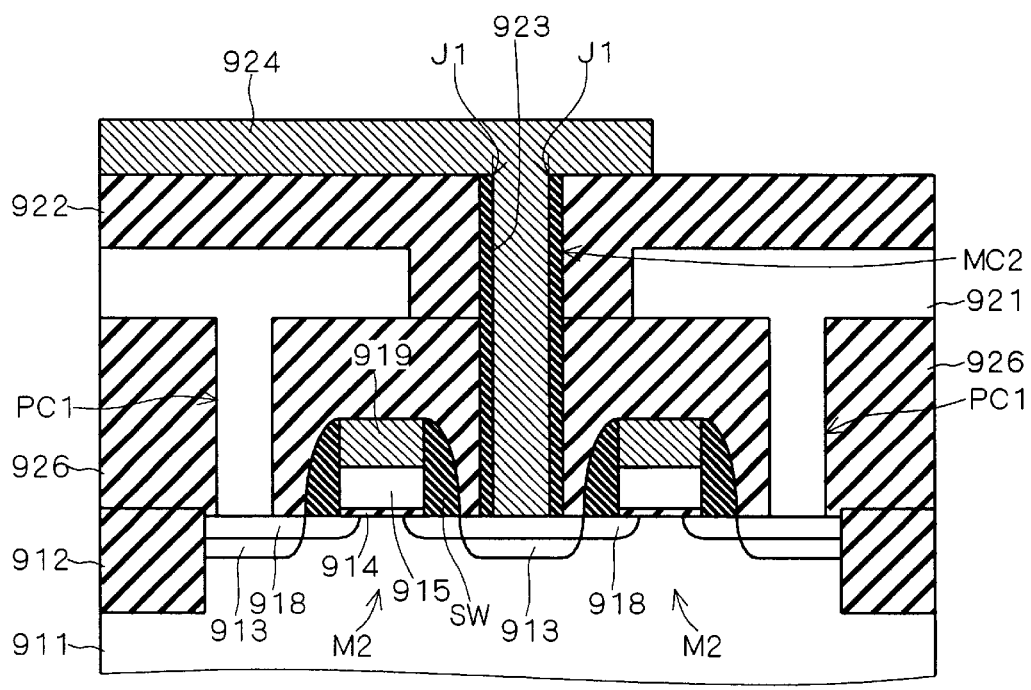

F I G. 43
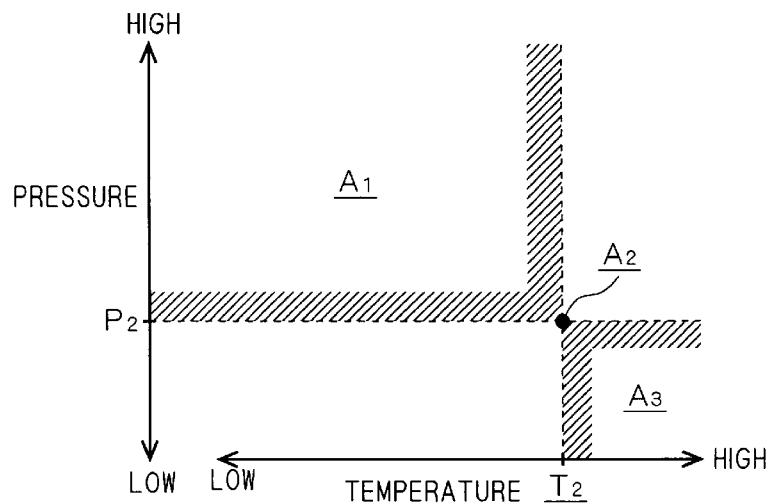
F I G. 44
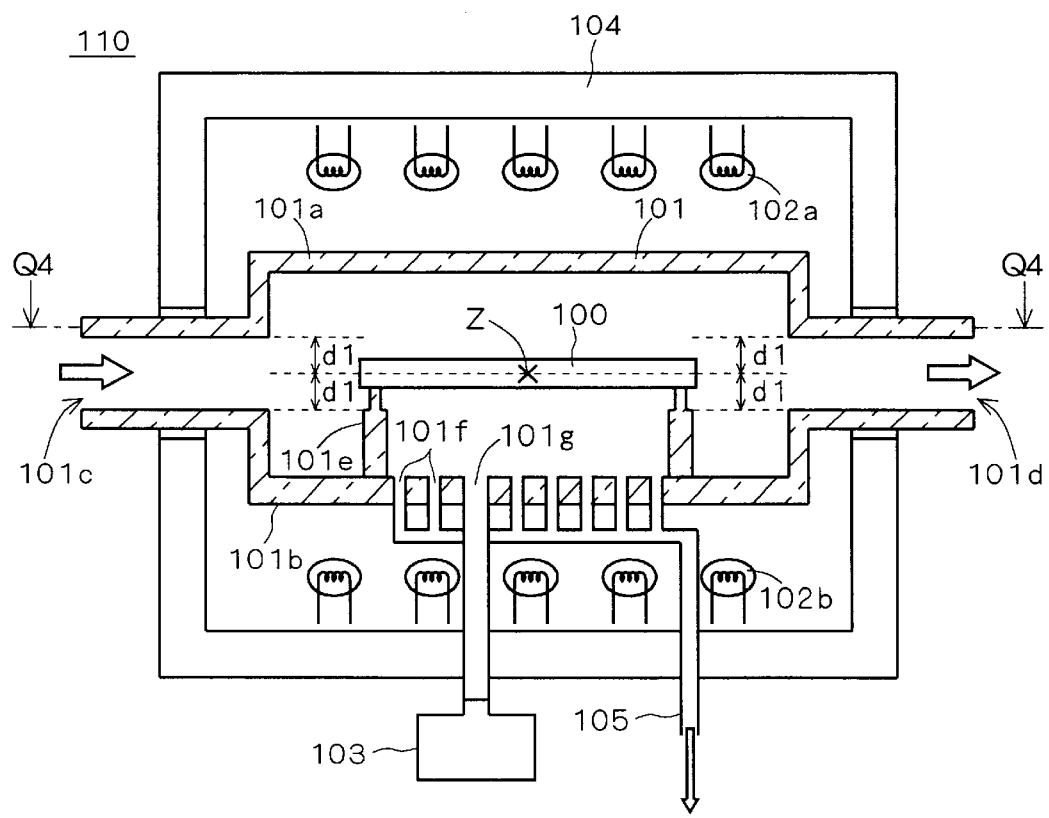

F I G. 45
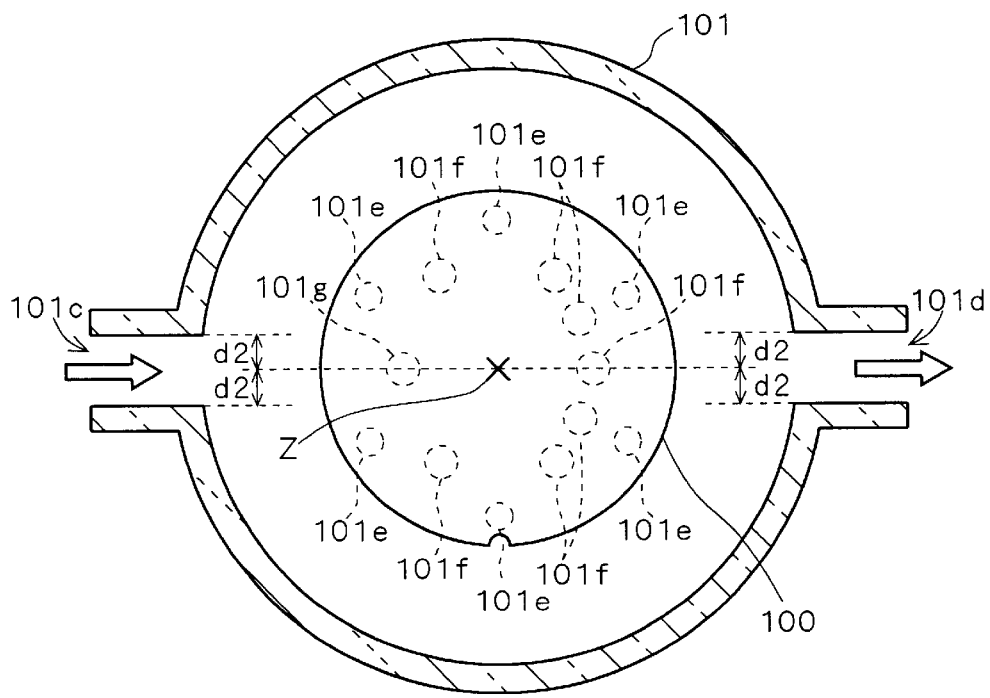
F I G. 46
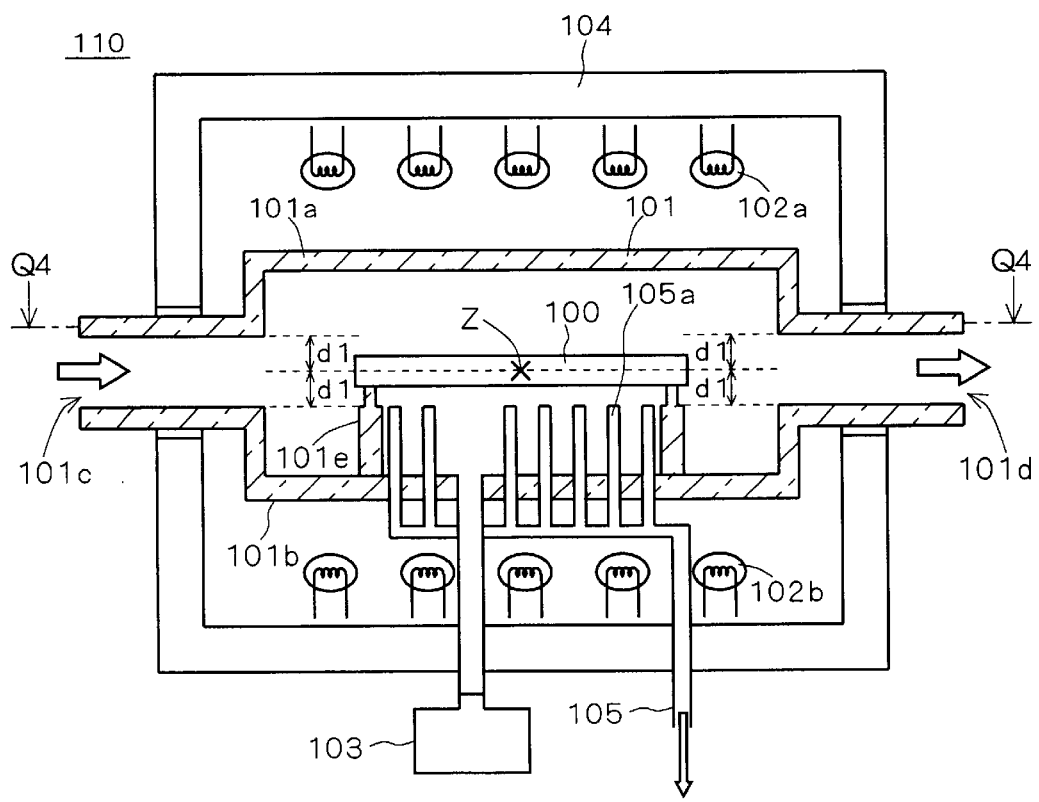

F I G. 50
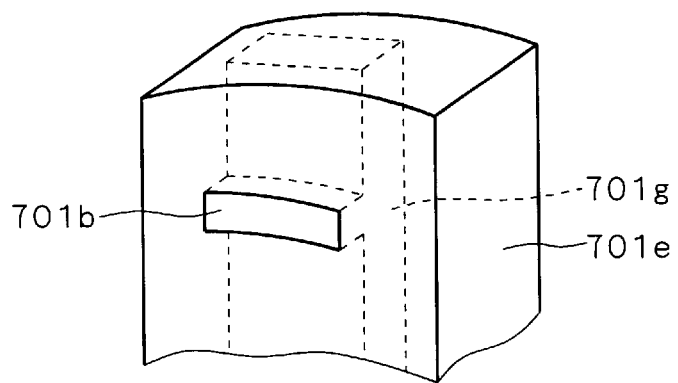
F I G. 51
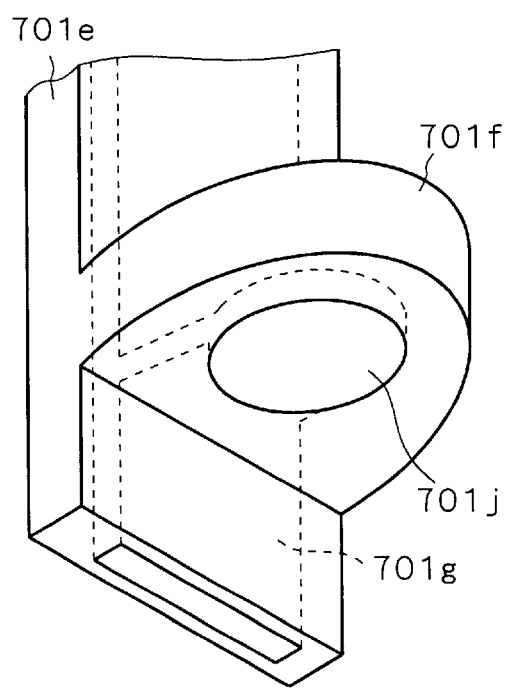

F I G. 52
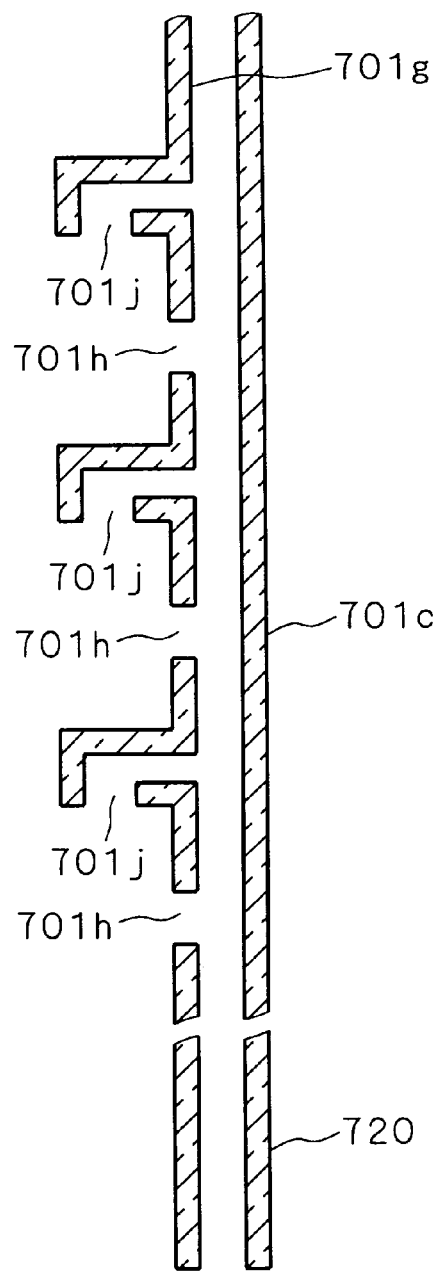

F I G. 53
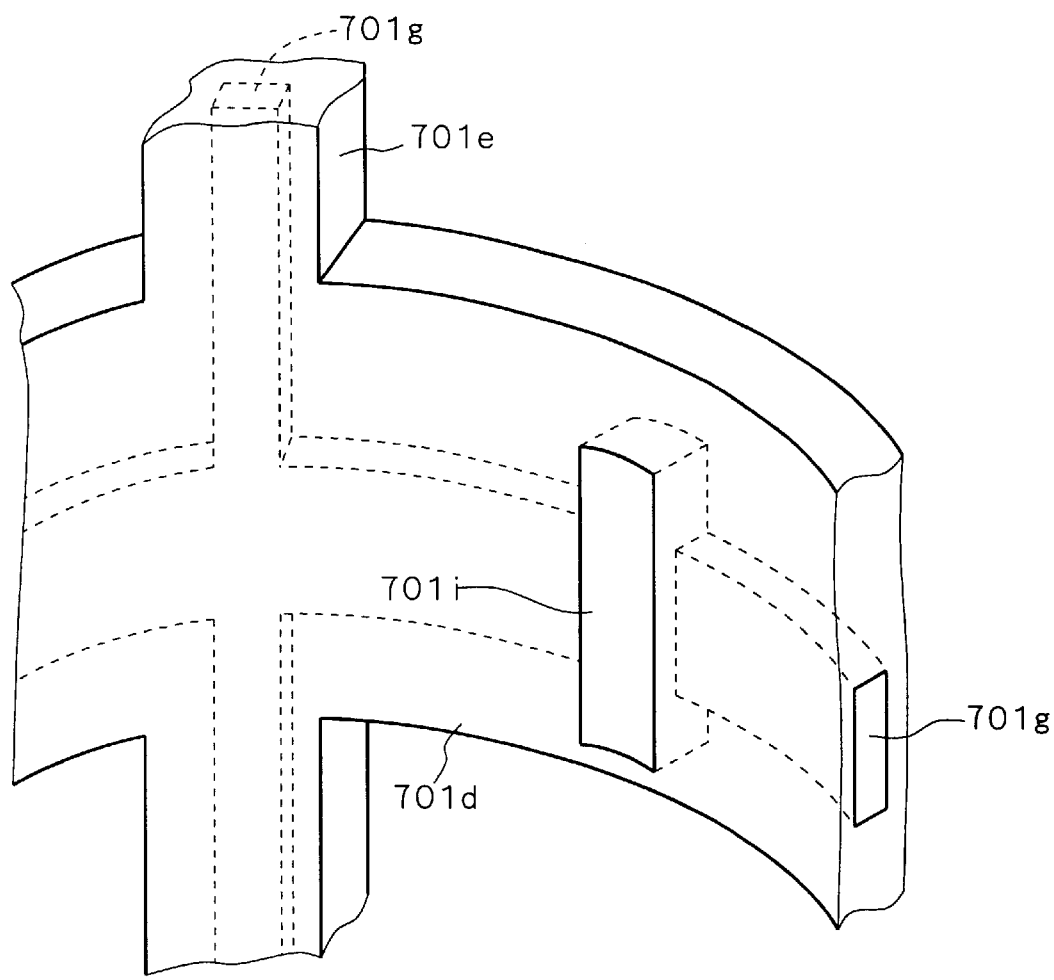

F I G. 54
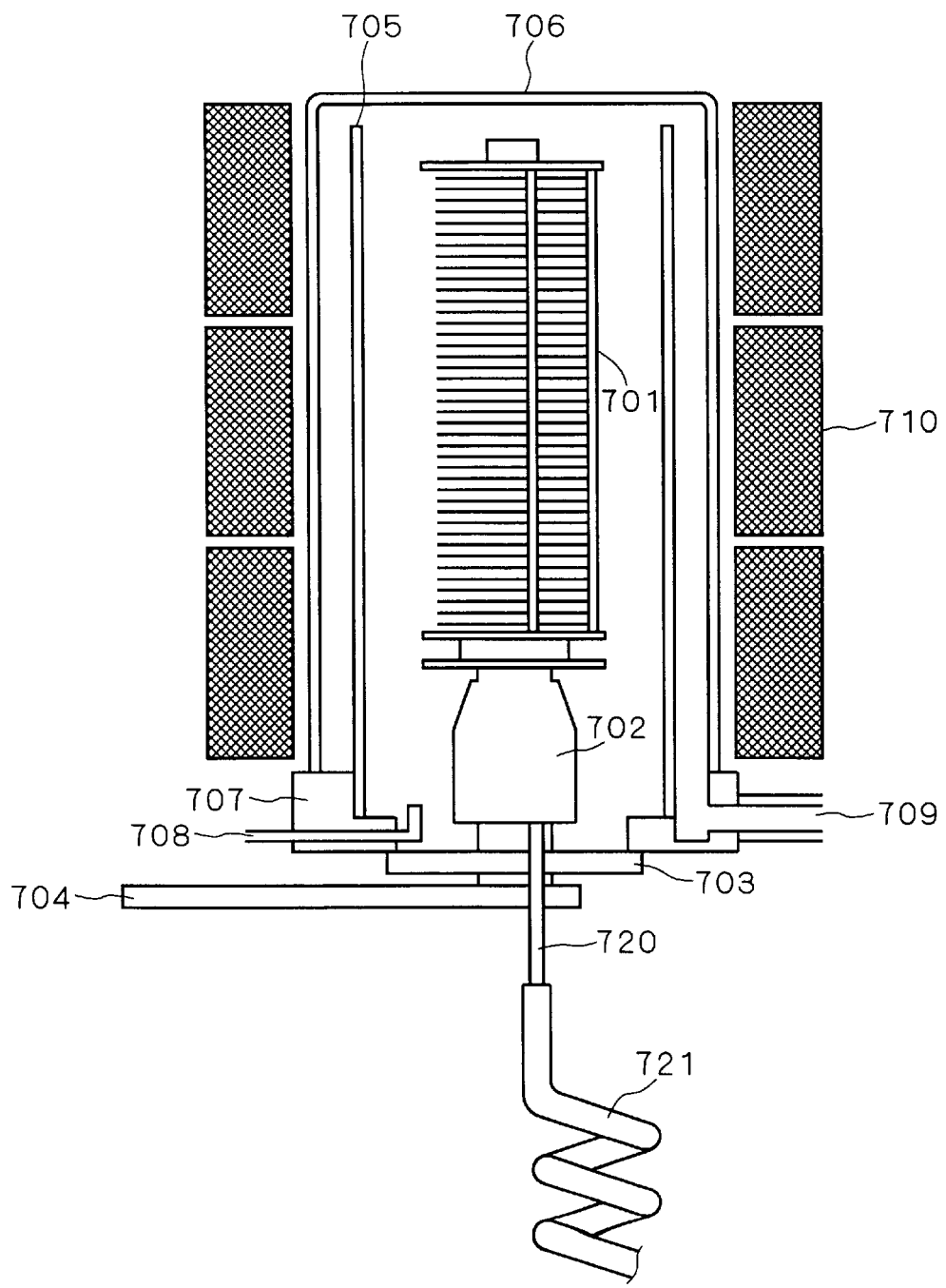

F I G. 63

| | MAIN SURFACE SIDE | BACK SURFACE SIDE |
|---|---|---|
| PROCESS 1A | FILM STRUCTURE $X_{1A}$ | FILM STRUCTURE $Y_{1A}$ |
| PROCESS 2A | FILM STRUCTURE $X_{2A}$ | FILM STRUCTURE $Y_{2A}$ |
| ⋮ | ⋮ | ⋮ |
| PROCESS NA | FILM STRUCTURE $X_{NA}$ | FILM STRUCTURE $Y_{NA}$ |

(Tabs: DEVICE TYPE A, DEVICE TYPE B, DEVICE TYPE C, ...)

F / G. 64

METHOD OF MANUFACTURING SEMICONDUCTOR DEVICE AND METHOD OF DETERMINING FILM FORMATION TIME, CHAMBER, CHEMICAL VAPOR DEPOSITION APPARATUS AND BOAT THEREOF, ETCHING APPARATUS, AND FILM FORMATION PROCESS SYSTEM

BACKGROUND OF THE INVENTION

1. Field of the Invention

The present invention relates to a technique for manufacturing a semiconductor device, and more particularly to a technique to reduce defective film formation.

2. Description of the Background Art

FIGS. 68 and 69 are a plan view and a cross section, respectively, showing an exemplary structure of an AND-type flash memory. FIG. 69 is the cross section taken along the position Q1—Q1 of FIG. 68.

For example, in a surface of a silicon substrate 1, element formation regions are insulated from one another by a plurality of trench isolation oxide films 2. On a surface of the element formation region, sources 3a and 18a serving as a source line and drains 3b and 18b serving as a bit line are formed, being spaced from one another. The sources 3a and 18a and the drains 3b and 18b are extended almost in parallel to one another in a longitudinal direction of FIG. 68. A plurality of control gates 8 serving as word lines are formed in a traverse direction of FIG. 68, being insulated from one another. The position Q1—Q1 is determined along the control gates 8.

On the sources 3a and 18a, the drains 3b and 18b and the trench isolation oxide films 2, an oxide film made of TEOS (Tetra Ethyl Ortho Silicate: $Si(C_2H_5O)_4$) (hereinafter referred to as "TEOS oxide film") is formed as a thick insulating film 6. A channel region 1a is located in a region of the silicon substrate 1 sandwiched between the sources 3a and 18a and the drains 3b and 18b. A floating gate 5 is formed over the channel region 1a with a tunnel oxide film 4 interposed therebetween. On the floating gate 5, a phosphor-doped amorphous silicon film 9, an ONO (Oxide-Nitride-Oxide) film 7 and a control gate 8 are layered in this order. The control gate 8 includes a polysilicon film 8a and a tungsten silicide film 8b formed thereon.

A silicon oxide film 11 is formed as an insulating film on the control gate 8. Further on the silicon oxide film 11, an interlayer insulating film 21 is formed. Memory cell transistors (Tr1, Tr2, . . . ) each include the sources 3a and 18a, the drains 3b and 18b, the floating gate 5 and the control gate 8. In order to read information stored in the transistor Tr2, a predetermined voltage is applied to the sources 3a and 18a and a predetermined voltage is applied to the control gate 8 corresponding to the transistor Tr2. At this time, whether the transistor Tr2 is turned on or not depends on the amount of electrons accumulated in the floating gate 5 of the transistor Tr2. When the transistor Tr2 is turned on, currents flow between the sources 3a and 18a and the drains 3b and 18b.

A plurality of memory cell transistors Tr1, Tr2, . . . share the sources 3a and 18a and the drains 3b and 18b, and are connected in parallel to one another to constitute an AND-type flash memory.

In a flash memory, there are capacitance between the floating gate 5 and the silicon substrate 1 (mainly consisting of the capacitance of the tunnel oxide film 4: hereinafter referred to as "first gate capacitance") and capacitance between the floating gate 5 and the control gate 8 (hereinafter referred to as "second gate capacitance"). Generally required is a flash memory which allows fast write and fast erase to/from memory cells. To satisfy this requirement, it is desirable that the second gate capacitance should be stably larger than the first gate capacitance.

Specifically, it is required that the film thickness of the ONO film 7 should be thin, allowing excellent repeatability and uniformity. For example, a target value of film thickness for each of a bottom silicon oxide film (closer to the silicon substrate 1), a silicon nitride film and a top silicon oxide film (away from the silicon substrate 1) constituted of the ONO film 7 is about 5 nm, aiming for a very thin thickness. Very strict film characteristics are required, that variation of film thickness obtained in one process (one batch) should be within the target value ±5% or lower with excellent repeatability.

SUMMARY OF THE INVENTION

An object of the present invention is to provide a technique for film formation with film thickness easily controlled in the chemical vapor deposition method, for example, a technique applicable to a case where a silicon oxide film such as the bottom silicon oxide film of the ONO film 7 is formed on a semiconductor substrate on which a TEOS oxide film such as the thick insulating film 6 exists. As obviously can be seen from the following preferred embodiments, however, the present invention is intended not only for use in film formation of an oxide film but also for use in other film formation, for example, of a nitride film with its film thickness easily controlled.

The present invention is directed to a method of manufacturing a semiconductor device. According to a first aspect of the present invention, the method of manufacturing a semiconductor device includes steps (a) to (c). In the step (a), a first layer is formed by performing the chemical vapor deposition method on a semiconductor substrate at a first temperature and a first pressure for a first period. In the step (b), a heat treatment is performed under an inert gas atmosphere while exhausting a gas from the vicinity of the semiconductor substrate. In the step (c), a second layer is formed by performing the chemical vapor deposition method at a second temperature and a second pressure for a second period. The second temperature is higher than the first temperature and the second pressure is lower than the first pressure. The heat treatment is performed in the step (b) at a third temperature and a third pressure. The third temperature is equal to or higher than the second temperature and the third pressure is equal to or lower than the second pressure.

The gas used for forming the first layer in the step (a) is desorbed from the first layer in the step (b). Therefore, it is possible to reduce an ill effect of the gas in the film formation of the second layer of the step (c).

According to a second aspect of the present invention, the method of manufacturing a semiconductor device includes steps (a) to (c). In the step (a), a first layer is formed on both a main surface and a back surface of the semiconductor substrate by performing the chemical vapor deposition method on the semiconductor substrate at a first temperature and a first pressure. In the step (b), the first layer formed on the back surface is removed. In the step (c), a second layer is formed by performing the chemical vapor deposition method at a second temperature and a second pressure for a second period. The second temperature is higher than the first temperature and the second pressure is lower than the first pressure.

The ill effect of the gas contained in the first layer, which is used for forming the first layer, on the film formation of the second layer in the step (c) becomes smaller.

According to a third aspect of the present invention, the method of manufacturing a semiconductor device includes steps (a) to (c). In the step (a), a first layer is formed on both a main surface and a back surface of a semiconductor substrate by performing the chemical vapor deposition method on the semiconductor substrate at a first temperature and a first pressure. In the step (b), the first layer formed on the back surface is covered. In the step (c), a second layer is formed by performing the chemical vapor deposition method at a second temperature and a second pressure. The second temperature is higher than the first temperature and the second pressure is lower than the first pressure. The first layer is covered in the step (b) with a film which prevents gas desorption from the first layer in the step (c).

The ill effect of the gas contained in the first layer, which is used for forming the first layer, on the film formation of the second layer in the step (c) becomes smaller.

According to a fourth aspect of the present invention, the method of manufacturing a semiconductor device is a method for forming a first layer and a second layer on a semiconductor substrate in this order. A gas used for forming the first layer is desorbed in forming the second layer. The fourth aspect of the present invention includes steps (a) to (d). In the step (a), obtained is a film formation condition under which the second layer is formed to have a predetermined thickness on a dummy wafer not having the first layer. In the step (b), the second film is formed on the semiconductor substrate having the first layer under the film formation condition obtained in the step (a). In the step (c), the film formation condition is modified on the basis of the thickness of the second layer actually formed in the step (b). In the step (d), the second layers are formed on the dummy wafer not having the first layer and subsequently on the semiconductor substrate having the first layer under the film formation condition modified in the step (c).

The ill effect of desorption of the gas used for forming the first layer on the film formation of the second layer is estimated in the step (c). Therefore, it is possible to form the second layer with a predetermined film thickness on the semiconductor substrate, subsequently to the dummy batch, in the step (d).

The present invention is directed to a method of determining a film formation time. According to a fifth aspect of the present invention, the method is to determine a film formation time in a film formation process performed on a semiconductor substrate on which a semiconductor device is materialized. The fifth aspect of the present invention includes steps (a) to (d). In the step (a), obtained is wafer information on the type of semiconductor device and process steps which have been performed on the semiconductor substrate before the film formation process. In the step (b), a film structure that the semiconductor substrate has had before the film formation process is obtained on the basis of the wafer information. In the step (c), whether gas desorption should occur or not in the film formation process is predicted on the basis of the film structure and the details of the film formation process. In the step (d), a film formation time in the film formation process is determined on the basis of the result of the step (c).

It is possible to determine the film formation time for obtaining a predetermined film thickness, regardless of whether gas desorption occurs or not.

The present invention is still directed to a chamber. According to a sixth aspect of the present invention, the chamber has an upper surface, a lower surface, a gas introduction port and a gas exhaust port. The upper and lower surfaces are translucent. The lower surface has lift pins and an exhaust hole.

Since lamp annealing can be performed from both the upper surface and the lower surface and the wafer can be supported by the lift pins, a rapid thermal annealing is performed on both sides of the wafer. Further, the gas desorbed from the wafer can be efficiently exhausted from the exhaust hole.

The present invention is yet directed to a boat of a chemical vapor deposition apparatus. According to a seventh aspect of the present invention, the boat includes at least one body, a protrusion piece and an exhaust pipe. The at least one body is extended and has a first opening. The protrusion piece is supported by the at least one body. The exhaust pipe conducts to the first opening.

The first opening is located near the semiconductor substrate to be subjected to the chemical vapor deposition, which is placed on the protrusion piece. Therefore, the gas desorbed from the semiconductor substrate is exhausted from the exhaust pipe in parallel to the chemical vapor deposition.

The present invention is further directed to a chemical vapor deposition apparatus. According to an eighth aspect of the present invention, the chemical vapor deposition apparatus includes a reaction pipe, a pressure vessel, a first base, a second base, a boat and a heat source. In the reaction pipe, chemical vapor deposition is performed. The pressure vessel conducts to the reaction pipe, and allows exhaustion. The first base is movable, which allows the pressure vessel to be sealed when comes into contact with the pressure vessel. The second base is movable from the first base to the reaction pipe, and closes the reaction pipe when comes into contact with the reaction pipe. On the boat, mounted is a semiconductor substrate which is subjected to the chemical vapor deposition. The boat moves together with the second base to enter the reaction pipe. The heat source is placed at the position of the pressure vessel away from the reaction pipe.

The annealing is performed by using the heat source in the exhausted pressure vessel immediately before the chemical vapor deposition is performed in the reaction pipe on the semiconductor substrate placed on the boat. Therefore, the method of manufacturing a semiconductor device of the first aspect of the present invention can be carried out for a short time.

The present invention is furthermore directed to an etching apparatus. According to a ninth aspect, the etching apparatus includes a chamber and a ring-like susceptor. The chamber has two surfaces opposed to each other. The ring-like susceptor is mounted on one of the two surfaces. An etching is performed by using plasma generated between the two surfaces.

The semiconductor substrate's surface that is supported by the susceptor, is not exposed to plasma. Therefore, while the surface is protected, etching is performed on the other surface of the semiconductor substrate.

According to a tenth aspect, the etching apparatus includes a rotation mechanism, a first supply unit and a second supply unit. The rotation mechanism rotates a semiconductor substrate. The first supply unit supplies a liquid etchant to one surface of the semiconductor substrate. The second supply unit sprays a gas to the other surface of the semiconductor substrate.

When one surface is etched, it is possible to prevent the etchant from going around to the other surface.

The present invention is also directed to a film formation process system. According to an eleventh aspect, the film formation process system includes a film formation apparatus, a data base and a control body. The film formation apparatus performs a film formation process on a semiconductor substrate on which a semiconductor device is materialized. The database stores the history of the film formation process. The control body sends and receives information to/from the database to determine a time for the film formation process on the basis of a film structure of the semiconductor substrate and the history of the film formation process.

It is possible to predict whether gas desorption depending on the film structure occurs or not in the film formation process and automatically determine the film formation time for obtaining a predetermined film thickness from the history of the film formation process.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 3 to 17 are cross sections showing an exemplary method of manufacturing an AND-type flash memory to which the present invention is applicable;

FIGS. 19 to 33 are cross sections showing an exemplary method of manufacturing an AND-type flash memory to which the present invention is applicable;

FIGS. 39 and 40 are cross sections each showing a structure of the MOS transistor to which the present invention is applicable;

FIG. 43 is a graph used for explaining a first preferred embodiment of the present invention;

FIGS. 44 to 46 are cross sections showing a structure of a RTA (Rapid Thermal Anneal) apparatus applicable to the first preferred embodiment;

FIGS. 47 to 53 are perspective views showing a boat in accordance with a second preferred embodiment of the present invention;

FIG. 54 is a schematic diagram showing a structure of a CVD (Chemical Vapor Deposition) apparatus in accordance with the second preferred embodiment of the present invention;

FIG. 63 is a diagram schematically showing recipe data in accordance with the eleventh preferred embodiment of the present invention;

DESCRIPTION OF THE PREFERRED EMBODIMENTS

Prior to detailed discussion on preferred embodiments of the present invention, the basic ideas of the present invention and semiconductor devices to which the present invention is applicable will be discussed.

A. Basic Ideas of Present Invention

Figure 68:
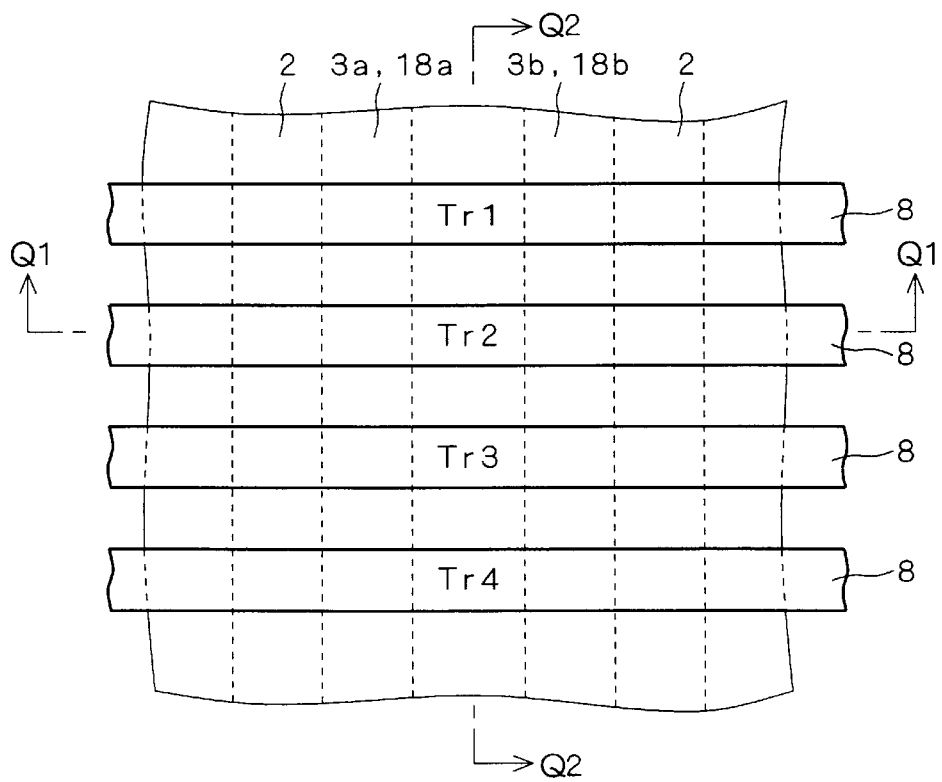
FIG. 68 is a plan view showing a background art.
Figure 70:
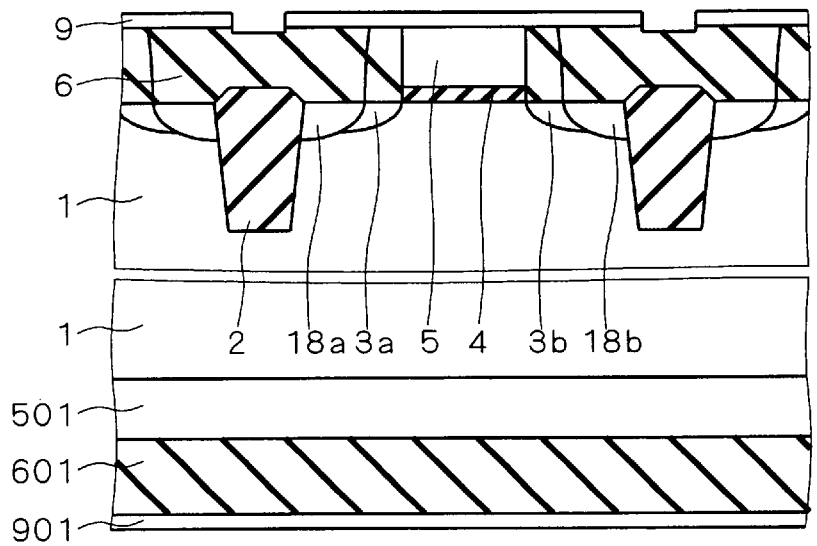
FIG. 70 is a cross section showing the basic idea of the present invention.

FIG. 70 is a cross section showing a structure of the above-discussed flash memory on the way of manufacturing process, correspondingly to the position of Q1—Q1 of FIG. 68.

In a main surface of the silicon substrate 1, the sources 3a and 18a, the drains 3b and 18b, trench isolation oxide film 2 are formed and further the tunnel oxide film 4, the floating gate 5, the thick insulating film 6 and the phosphor-doped amorphous silicon film 9 are formed thereabove with a predetermined pattern.

On the other hand, on a back surface of the silicon substrate 1, a phosphor-doped amorphous silicon film 501 formed in a process for forming the floating gate 5, a TEOS oxide film 601 formed in a process for forming the thick insulating film 6 and a phosphor-doped amorphous silicon film 901 formed in a process for forming the phosphor-doped amorphous silicon film 9 are deposited in this order.

After that, a high temperature oxide film (hereinafter referred to as "HTO film") is formed as a bottom silicon oxide film by the low pressure chemical vapor deposition (hereinafter abbreviated as "LPCVD") method at high temperature with dichlorosilane ($SiH_2Cl_2$: hereinafter abbreviated as "DCS") gas. The HTO film formed by using the DCS gas is hereinafter abbreviated as "DCS-HTO film".

Adopting the LPCDV method at a high temperature, $H_2O$, OH, SiO, $CO_2$ and $C_2H_5O$ are desorbed as gases from the TEOS oxide film 601 and the phosphor-doped amorphous silicon film 901. Therefore, the atmosphere in which the bottom silicon oxide film is formed is contaminated. In FIG. 70, the phosphor-doped amorphous silicon film 9 is selectively removed over the trench isolation oxide film 2, to expose the thick insulating film 6. Since some gas is desorbed from the exposed thick insulating film 6, the bottom silicon oxide film formed on the phosphor-doped amorphous silicon film 9 has a tendency to become thicker by, e.g., 20 to 50% on side surfaces of the phosphor-doped amorphous silicon film 9, in particular at a portion near the thick insulating film 6, than at a portion immediately above the phosphor-doped amorphous silicon film 9.

The increase in thickness of the bottom silicon oxide film is caused by the desorbed gas, and the rate of increase in film thickness is not necessarily stable, making the second gate capacitance unstable and smaller than the first gate capacitance. Therefore, write and erase to/from the memory cells become slower. Further, since the thickened film is slightly different in quality from the originally desired film, the reliability such as repeat resistance for write and erase to/from the memory cells and data holding characteristics is deteriorated.

Figure 71:
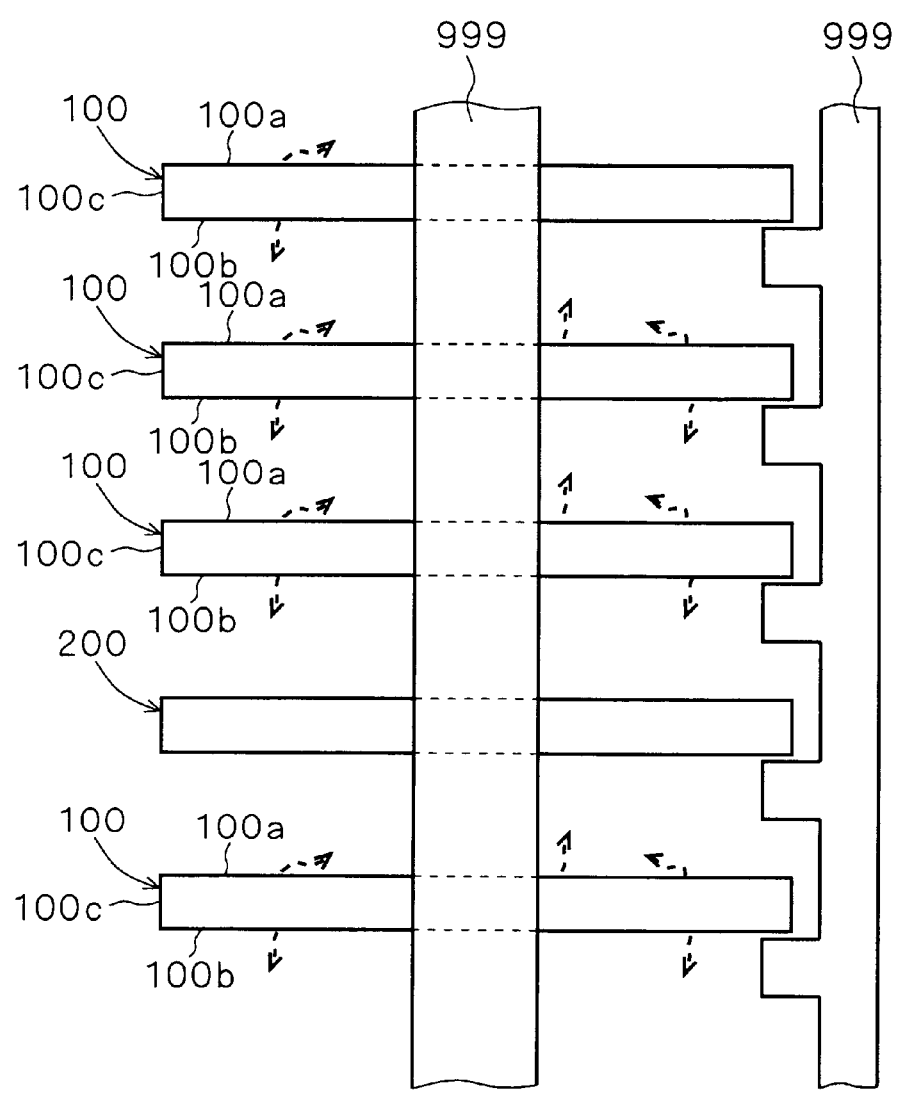
FIG. 71 is a side view showing the basic idea of the present invention.

Furthermore, not only the gas desorbed from the main and back surfaces of one wafer but also a gas desorbed from other wafer causes problems. FIG. 71 is a side view showing an arrangement of wafers 100 and 200 in a CVD apparatus for forming the bottom silicon oxide film. The wafer 100 is a wafer actually used for forming memory cells and the wafer 200 is a wafer used for monitoring the thickness of a film formed by the CVD apparatus. A support mount 999 supporting the wafers 100 and 200 is made of quartz because of high-temperature resistance and little impurity diffusion.

A target value of film thickness set for the wafers 100 and 200 is the same as that in a film formation process using a dummy wafer, which precedes the film formation process on these wafers 100 and 200. Usually, a bare silicon wafer or a wafer on which a DCS-HTO film is formed on the bare silicon wafer is adopted as the dummy wafer.

On a main surface 100a, a back surface 100b and side surfaces 100c of the wafer 100, however, the film formation caused by the gas (schematically indicated by an arrow of broken line in the figure) desorbed from the TEOS oxide film takes place on the wafer 200. Therefore, the film thickness monitored on the wafer 200 (evaluated as the film thickness of the bottom silicon oxide film formed on the wafer 100) becomes thicker than that in the preceding process using the dummy wafer. For example, even if a value of 5.0 nm is adopted as the target value of film thickness at the center portion of the bottom silicon oxide film, the film thickness monitored on the wafer 200 exceeds by 0.5 nm or thicker beyond the standard limits of ±5%.

Figure 1:
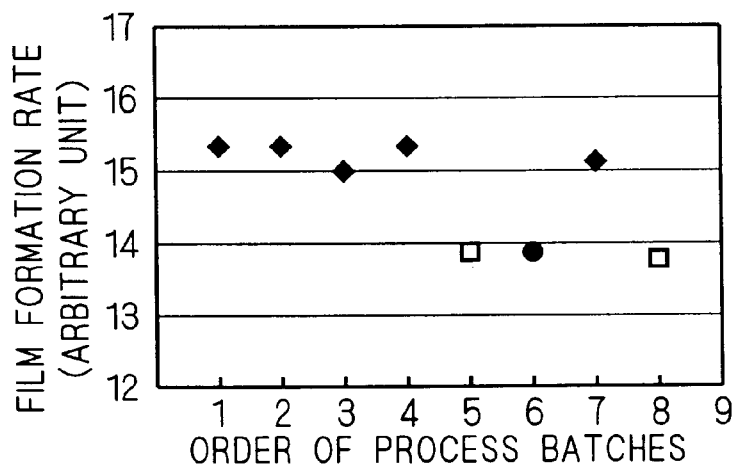
FIGS. 1 and 2 are graphs showing a basic idea of the present invention.
Figure 2:
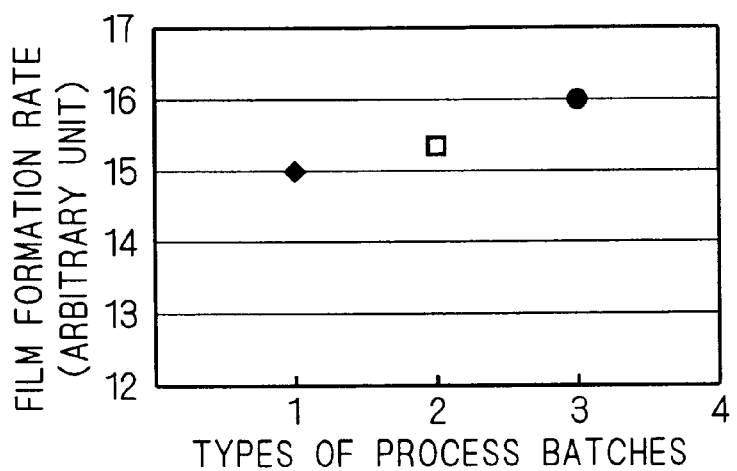

FIGS. 1 and 2 are graphs showing dependency of film formation rate of the DCS-HTO film formed by the LPCDV method on the type of batch. This film formation is performed with mixed gas of DCS, $N_2O$ and $N_2$ under the condition at a pressure of 60 to 110 Pa and a temperature of 700° to 850° C.

In FIG. 1, the first to fourth and seventh processes (indicated by solid squares in the figure) are performed using 100 wafers of 4 lots as one batch, each lot including 24 wafers 100 and one wafer 200, totally 25 wafers. Further, the fifth and eighth processes (indicated by blank squares in the figure) are performed using 100 wafers as one batch, consisting of 4 wafers 100 and one wafer 200, totally 5 wafers, and 95 dummy wafers. The sixth process (indicated by solid circle in the figure) is performed using one wafer 200 and 99 dummy wafers.

Regardless of order of executions, the processes in which one batch includes 5 wafers 100, 200 have almost the same film formation rate as the process in which one batch consists of dummy wafers, and the processes in which one batch consists of 4 lots have a film formation rate higher than that of those processes by about 10%. This rate corresponds to the difference of about 0.5 nm with respect to the film thickness of 5.0 nm.

FIG. 2 shows results on wafers having a plurality of different films. This graph illustrates three cases of a wafer on which an HTO film is formed (indicated by a solid square in the figure), a wafer on which a doped amorphous silicon film is formed (indicated by a blank square in the figure) and a wafer on which a TEOS oxide film is formed (indicated by a solid circle in the figure). The TEOS oxide film is formed at a pressure of 130 to 270 Pa and a temperature of 600° to 700° C., and the phosphor-doped amorphous silicon film is formed of $SiH_4$ and $PH_3$ gases at a pressure of 130 to 400 Pa and a temperature of 500° to 600° C. From these results, the presence of doped amorphous silicon film also contributes to an increase in film formation rate, though not as greatly as the presence of the TEOS oxide film.

The pressure required for forming both the TEOS oxide film and the doped amorphous silicon film is higher and the temperature required for forming these films is lower than those for the DCS-HTO film formed by the LPCDV method. In other words, the above problem results from an unnecessary film formation (hereinafter referred to as "film reformation") occurring on the wafers 100 and 200, which is caused by a film forming gas desorbed from the films which are precedently formed ahead under the condition of the pressure and temperature for forming the DCS-HTO film by the LPCDV method.

When the DCS-HTO film is formed by the LPCDV method, the gas used for forming the TEOS oxide film is desorbed from the thick insulating film 6. The film reformation occurs if the desorbed gas is neither quickly nor exhausted enough.

For example, Japanese Patent Application Laid Open Gazette No. 2000-294551 discloses a technique to remove organic substances, which is produced on a surface of an underlying film, in forming an interlayer insulating film under the condition at atmospheric pressure and a temperature equal to or lower than that required for the following film formation. Further, Japanese Patent Application Laid Open Gazette No. 9-55480 discloses a technique to perform a heat treatment of 200° to 700° C. under inert gas atmosphere equal to lower than $10^{-3}$ Torr ($=133 \times 10^{-3}$ Pa) in a CVD furnace so as to desorb $H_2O$ and OH base from a surface of a polysilicon and silicon substrate. These two documents, however, do not pay sufficient attention to degassing from the back surface of the wafer.

Furthermore, Japanese Patent Application Laid Open Gazette No. 9-275139 discloses a technique to perform sputtering after annealing a wafer at a pressure and a temperature equal to or lower than the condition for the sputtering so as to degas an insulating layer on a surface of the wafer and monitoring whether the gas is desorbed or not. The gazette further discloses that it is possible to confirm that the gas is desorbed when the total pressure is not higher than $10^{-5}$ Pa ($7.5 \times 10^{-8}$ Torr). In order to achieve such a low pressure state, however, an expensive pump such as a cryopump is needed.

Then, it is supposed, as the first basic idea of the present invention, that between the two processes for forming the first layer and the second layer in this order by performing the chemical vapor deposition (hereinafter also referred to as "CVD") on a semiconductor substrate (wafer), a heat treatment should be performed at a temperature equal to or higher than that for forming the second layer and a pressure equal to or lower than that for forming the second layer while exhausting a gas from the vicinity of the semiconductor substrate. This allows the gas to be desorbed prior to the formation of the second layer through the heat treatment under the condition where the gas is desorbed more easily than the film formation condition of the second layer. In particular, the exhaustion from the vicinity of the semiconductor substrate eliminates the necessity of expensive pump such as a cryopump and makes maintenance, such as recovery of a pump, easier and cheaper. In other words, using the method of manufacturing a semiconductor device and the apparatus for manufacturing a semiconductor device in accordance with the present invention makes it possible to reduce the cost for the semiconductor device.

Further, it is supposed, as the second basic idea of the present invention, that the first layer deposited on the back surface of the semiconductor substrate should be removed. Furthermore, it is supposed, as the third basic idea of the present invention, that the first layer deposited on the back surface of the semiconductor substrate should be covered with a film which prevents gas desorption. These methods can also reduce an ill effect of the gas desorbed from the first layer in formation of the second layer.

Further, it is supposed, as the fourth basic idea of the present invention, that the increase in film thickness by film reformation is predicted and the film formation time should be determined on the basis of the prediction. This method allows a film formation process with the film thickness controlled with high precision.

Figure 17:
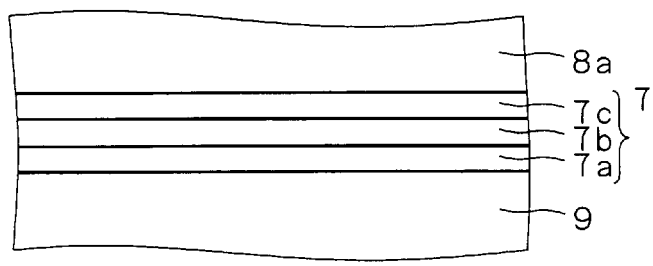
Figure 18:
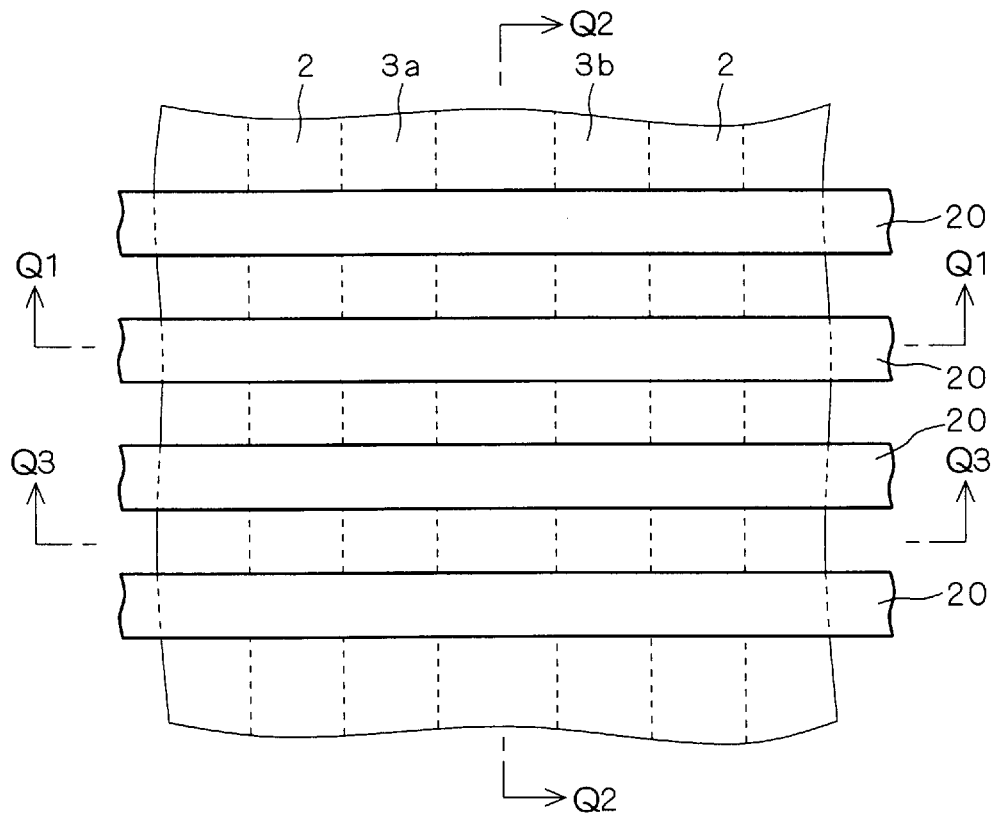
FIG. 18 is a plan view showing an exemplary method of manufacturing an AND-type flash memory to which the present invention is applicable.
Figure 69:
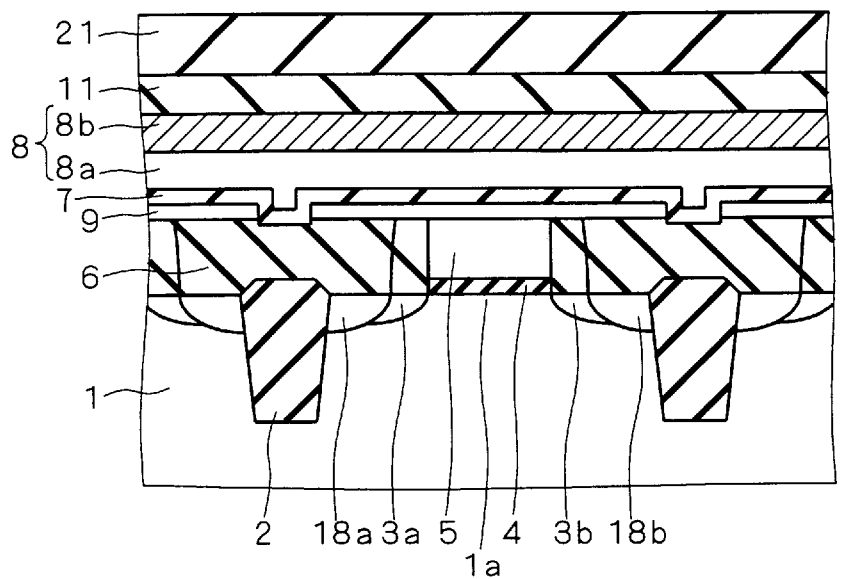
FIG. 69 is a cross section showing the background art.

B. Semiconductor Devices that Present Invention is Applicable to (b-1) AND-Type Flash Memory As an example of semiconductor devices to which the present invention is applicable, an AND-type flash memory shown in FIGS. 68 and 69 is taken. FIGS. 3 to 17 and FIGS. 19 to 33 are cross sections showing an exemplary method of manufacturing an AND-type flash memory to which the present invention is applicable, and FIG. 18 is a plan view showing a process step of the method of manufacturing an AND-type flash memory.

FIGS. 3 and 4 are cross sections taken along the positions Q1—Q1 and Q2—Q2 of FIG. 68, respectively. The position Q2—Q2 is determined along the drain 3b. In a predetermined region of the silicon substrate 1, the trench isolation oxide films 2 are formed to section the element formation region. After that, on surfaces of the trench isolation oxide films 2 and the silicon substrate 1, the tunnel oxide film 4 is formed to have a film thickness of about 9.5 nm by a thermal oxidation method.

Next, on the tunnel oxide film 4, the phosphor-doped amorphous silicon film 501 is formed by the CVD method. As shown in FIG. 70, the phosphor-doped amorphous silicon film 501 is also formed on the back surface of the silicon substrate 1. In FIG. 70, however, the tunnel oxide film 4 which may intervene between the back surface of the silicon substrate 1 and the phosphor-doped amorphous silicon film 501 is not shown.

A silicon nitride film 15 is formed on the phosphor-doped amorphous silicon film 501. A pattered photoresist 16 is formed on the silicon nitride film 15.

Figure 5:
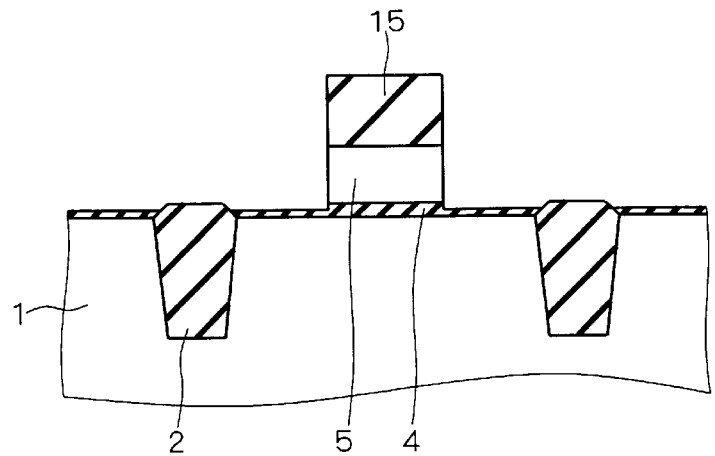
Figure 6:
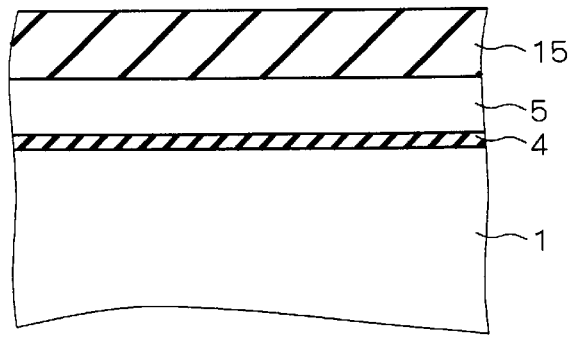

FIGS. 5 and 6 are cross sections showing structures obtained by performing various processes on the structures shown in FIGS. 3 and 4. An anisotropic etching is performed on the silicon nitride film 15 with the photoresist 16 used as a mask, to pattern the silicon nitride film 15. After that, the photoresist 16 is removed and an anisotropic etching is performed on the phosphor-doped amorphous silicon film 501 with the patterned silicon nitride film 15 used as a mask, to expose the tunnel oxide film 4. The left phosphor-doped amorphous silicon film 501 becomes the floating gate 5.

Figure 7:
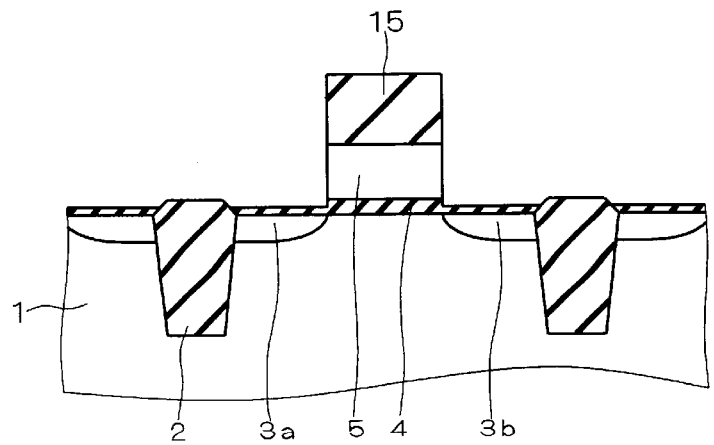
Figure 8:
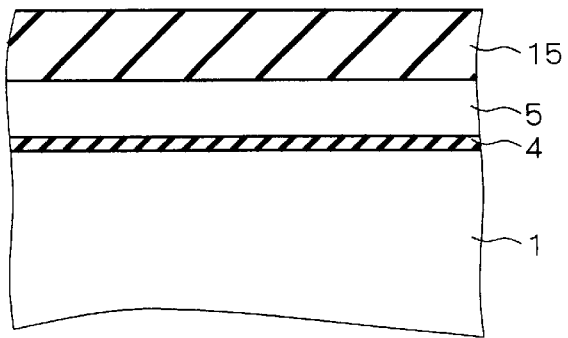

FIGS. 7 and 8 are cross sections showing structures obtained by performing various processes on the structures shown in FIGS. 5 and 6. An impurity is introduced into the silicon substrate 1 with the silicon nitride film 15 and the floating gate 5 left through the anisotropic etching used as a mask, to form the source 3a and the drain 3b. As the impurity introduction, for example, when the silicon substrate 1 is p type, arsenic (As) is implanted at an energy of 30 KeV at a dose of $5 \times 10^{13}$ cm$^2$. Through this impurity implantation, the n-type source 3a and n-type drain 3b are formed in the surface of the silicon substrate 1 between the trench isolation oxide film 2 and the floating gate 5.

Figure 9:
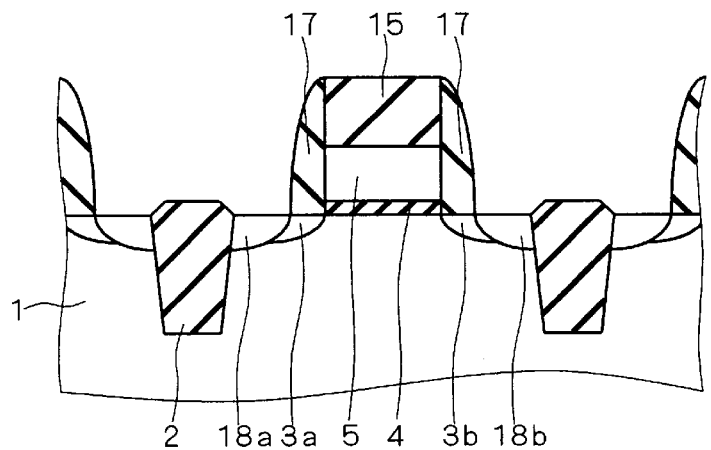
Figure 10:
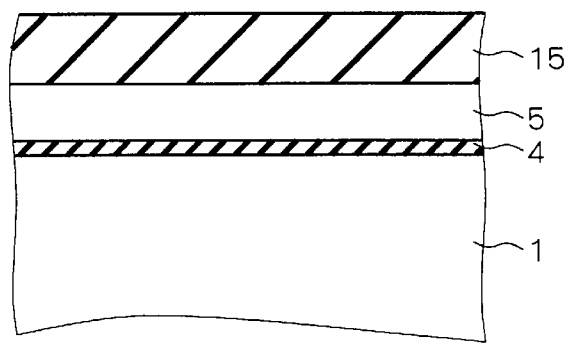

FIGS. 9 and 10 are cross sections showing structures obtained by performing various processes on the structures shown in FIGS. 7 and 8. A silicon oxide film (not shown) is so formed on the silicon substrate 1 as to cover the floating gate 5 and the silicon nitride film 15. At this time, a silicon oxide film which may be formed on the back surface of the silicon substrate 1 is not shown in FIG. 70. An anisotropic etching is performed on the silicon oxide film, to form sidewall insulating films 17 on both side surfaces of the floating gate 5 and the silicon nitride film 15. An impurity is introduced into the silicon substrate 1 with the sidewall insulating films 17, the silicon nitride film 15 and the floating gate 5 used as a mask, to form the source 18a and the drain 18b. As the impurity introduction, for example, arsenic (As) is implanted at an energy of 30 KeV at a dose of $1 \times 10^{15}$/cm$^2$.

Thus, the sources 3a and 18a serving as the source line and the drains 3b and 18b serving as the bit line are formed. Formation of the source 18a and the drain 18b through further implantation of arsenic is desirable in terms of reducing the resistance of wires in the case where the source lines and the bit lines are formed by using impurity diffusion layers.

Figure 11:
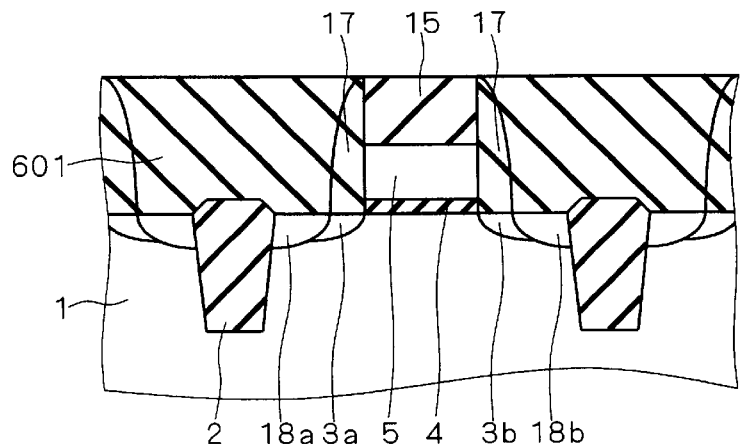
Figure 12:
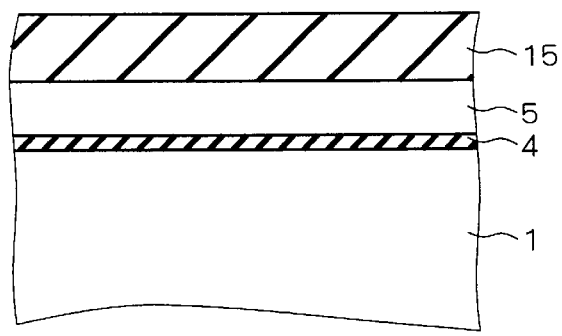

FIGS. 11 and 12 are cross sections showing structures obtained by performing various processes on the structures shown in FIGS. 9 and 10. The TEOS oxide film 601 is formed to have a film thickness of about 400 nm by the CVD method. CMP (Chemical Mechanical Polishing) is performed on the TEOS oxide film 601, to expose a surface of the silicon nitride film 15. The film formation condition of the TEOS oxide film 601 is, for example, a pressure of 130 to 270 Pa and a temperature of 600° to 700° C. In this case, as shown in FIG. 70, there is a possibility of forming the TEOS oxide film 601 also on the back surface of the silicon substrate 1.

Figure 13:
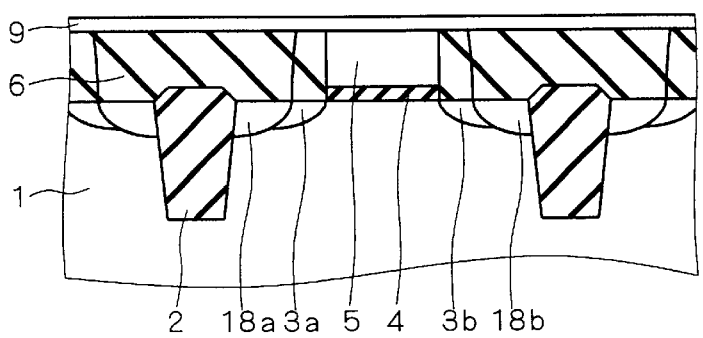
Figure 14:
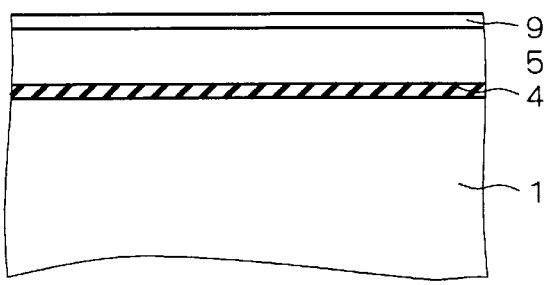

FIGS. 13 and 14 are cross sections showing structures obtained by performing various processes on the structures shown in FIGS. 11 and 12. A dry etching is performed to etch the TEOS oxide film 601 by about 180 nm and obtain the thick insulating film 6 as a residue. The silicon nitride film 15 is also etched by this dry etching. Further, the left silicon nitride film 15 is almost completely removed by thermal phosphoric acid and a surface of the floating gate 5 is cleaned by hydrofluoric acid (HF).

The phosphor-doped amorphous silicon film 9 is formed on the cleaned surface of the floating gate 5. At this time, as shown in FIG. 70, there is a possibility of forming the phosphor-doped amorphous silicon film 901 also on the back surface of the silicon substrate 1.

Figure 15:
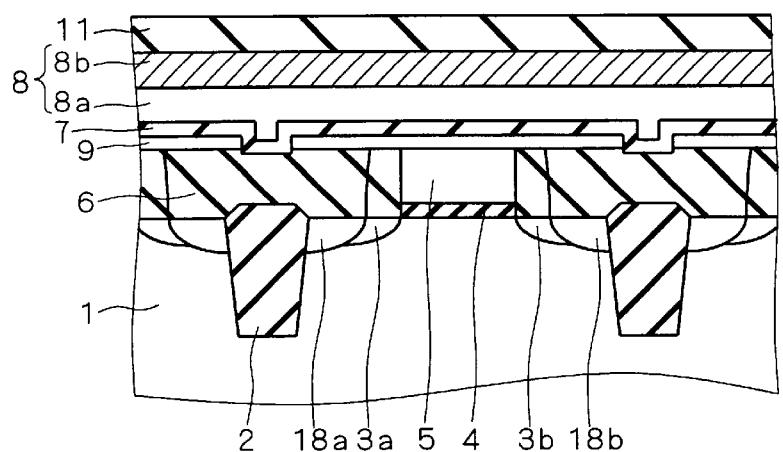
Figure 16:
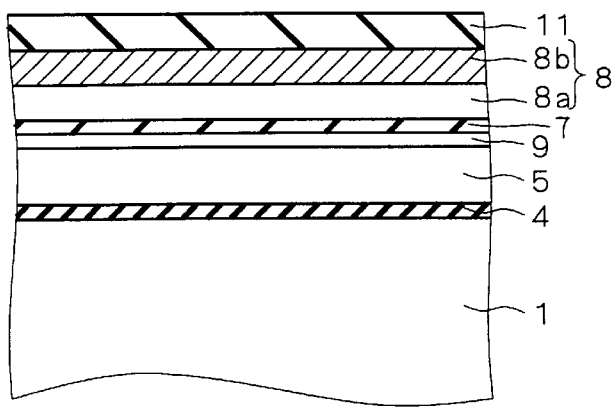

FIGS. 15 and 16 are cross sections showing structures obtained by performing various processes on the structures shown in FIGS. 13 and 14. A photoresist with a predetermined pattern (not shown) is formed on the phosphor-doped amorphous silicon film 9. It is desirable that the photoresist should have a pattern with openings at portions above the trench isolation oxide films 2. An etching is performed on the phosphor-doped amorphous silicon film 9 with the photoresist used as a mask. Through this etching, as shown in FIG. 15, the phosphor-doped amorphous silicon film 9 is divided by transistors which are sectioned by the trench isolation oxide films 2. In a cross section along the bit line formed as the drain 3b, however, as shown in FIG. 16, the phosphor-doped amorphous silicon film 9 is connected to the floating gate 5. The phosphor-doped amorphous silicon film 9 and the floating gate 5 may be together grasped as a floating gate.

After that, the ONO film 7 is formed on the phosphor-doped amorphous silicon film 9. FIG. 17 is a cross section showing a detailed structure of the ONO film 7. The ONO film 7 is constituted of a bottom silicon oxide film 7a, a silicon nitride film 7b and a top silicon oxide film 7c formed in this order from the closer side of the phosphor-doped amorphous silicon film 9. The bottom silicon oxide film 7a is a DCS-HTO film formed by the LPCDV method under a film formation condition, e.g., at a pressure of 60 to 100 Pa and a temperature of 700° to 850° C., using a mixed gas of DCS, $N_2O$ and $N_2$. At this time, as discussed above, a film forming gas is desorbed from the thick insulating film 6 at least on the main surface side. Further, there is a possibility of gas desorption from the TEOS oxide film 601 and the phosphor-doped amorphous silicon film 901 on the back surface side.

Next, a memory cell region is entirely covered with a photoresist (not shown) and then the ONO film 7, the phosphor-doped amorphous silicon film 9 and the tunnel oxide film 4 in a peripheral circuit region (not shown) are removed by sequentially performing dry-etching or wet-etching. After that, the photoresist is removed and a gate oxide film for the transistor is formed in the peripheral circuit region by the thermal oxidation method (not shown).

After that, the polysilicon film 8a is formed, e.g., by the CVD method to have a film thickness of about 100 nm. On the polysilicon film 8a, the tungsten silicide film 8b is formed to have a film thickness of about 100 nm. On the tungsten silicide film 8b, the silicon oxide film 11 is formed by the CVD method to have a film thickness of about 250 nm.

Figure 19:
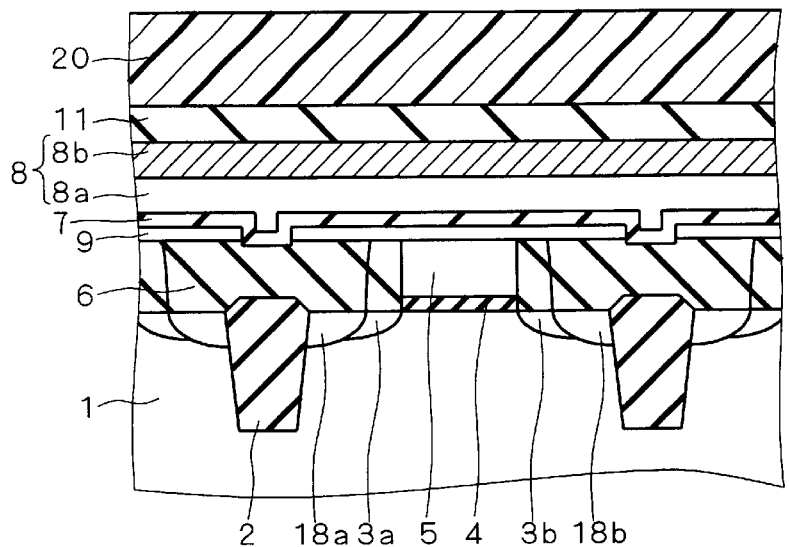
Figure 20:
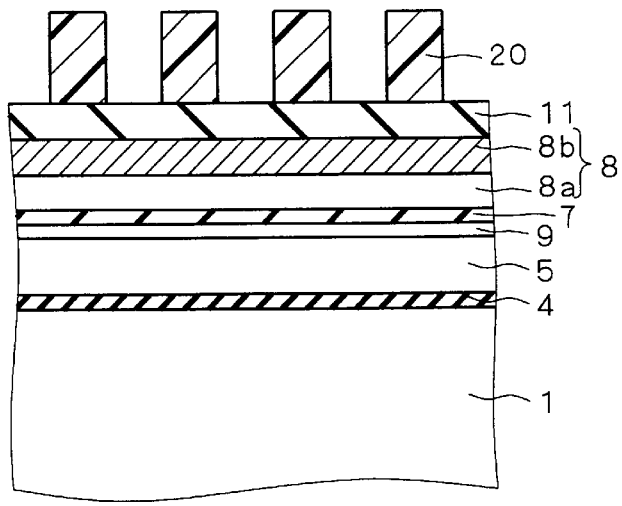
Figure 21:
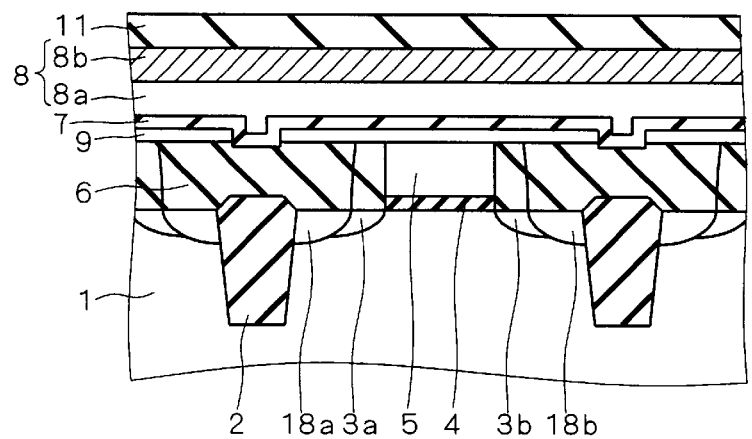

FIG. 18 is a plan view showing a photoresist 20 used for patterning a word line. The photoresist 20 is present at the position Q1—Q1. Since the position Q2—Q2 is determined along a direction substantially orthogonal to a direction where the word line is formed, a plurality of photoresists 20 appear in the cross section taken along the position Q2—Q2. Further, at the position Q3—Q3 along a region where no word line is formed, no photoresist 20 is formed. FIGS. 19, 20 and 21 are cross sections taken along the positions Q1—Q1, Q2—Q2 and Q3—Q3, respectively.

Figure 22:
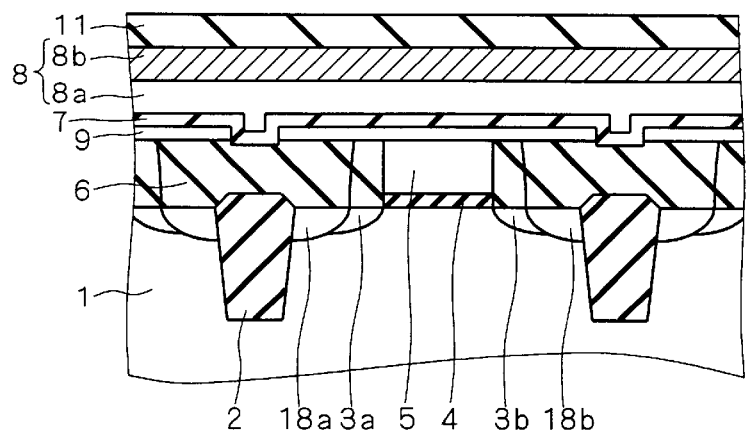
Figure 23:
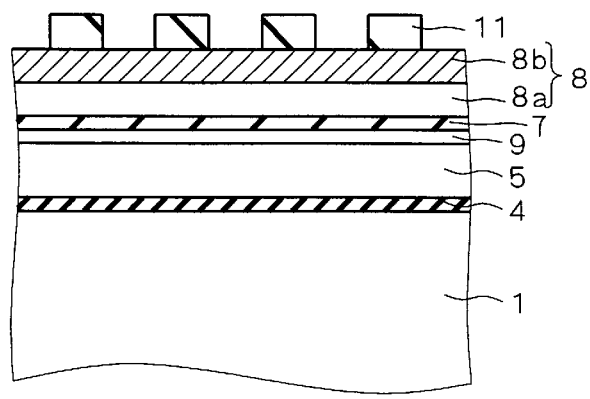

FIGS. 22, 23 and 24 are cross sections showing structures obtained by performing an anisotropic etching on the silicon oxide film 11 with the photoresist 20 used as a mask in the structures shown in FIGS. 19, 20 and 21. The left silicon oxide film 11 serves as a mask for patterning the polysilicon film 8a and the tungsten silicide film 8b by etching.

Figure 27:
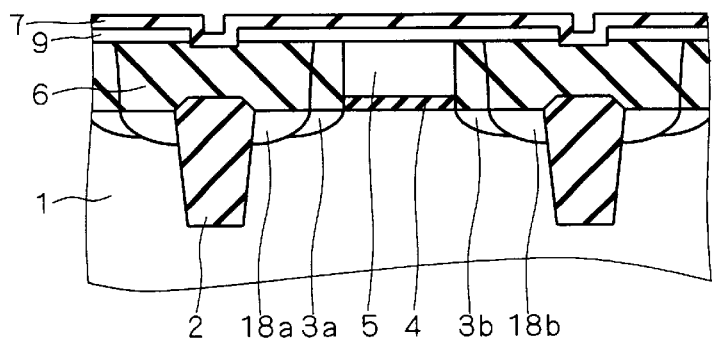

FIGS. 25, 26 and 27 show structures obtained by performing various processes after obtaining the structures shown in FIGS. 22, 23 and 24. The polysilicon film 8a and the tungsten silicide film 8b are dry-etched with the silicon oxide film 11 used as a mask, to expose a surface of the ONO film 7, i.e., a surface of the top silicon oxide film 7c (not shown in FIGS. 25, 26 and 27). The polysilicon film 8a and the tungsten silicide film 8b left through the dry etching become the control gate 8 serving as the word line in the memory cells and become gates of the transistors in the not-shown peripheral circuit region.

Figure 28:
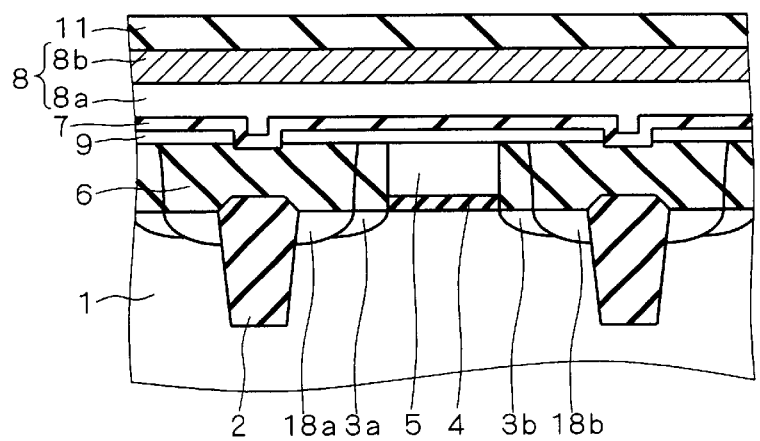
Figure 29:
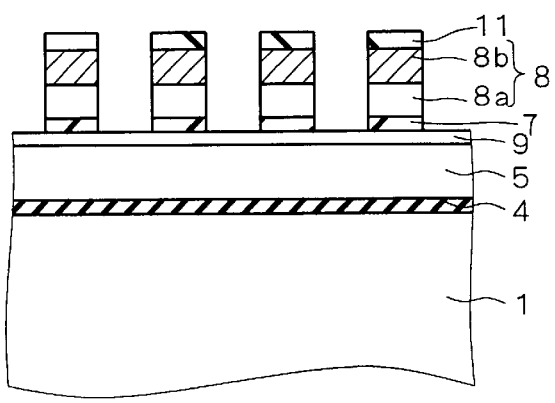
Figure 30:
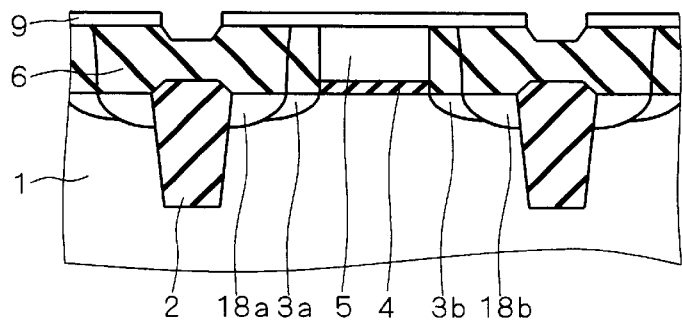

Next formed is a photoresist (not shown) having openings at memory cell regions and covering the peripheral circuit region. The ONO film 7 which is exposed, not being covered with the silicon oxide film 11, is removed by an anisotropic etching with the photoresist used as a mask. Through this anisotropic etching, the phosphor-doped amorphous silicon film 9 is exposed at a portion where the silicon oxide film 11 is not left. The cross sections of the structure obtained through the foregoing processes along the positions Q1—Q1, Q2—Q2 and Q3—Q3 are shown in FIGS. 28, 29 and 30, respectively.

Figure 31:
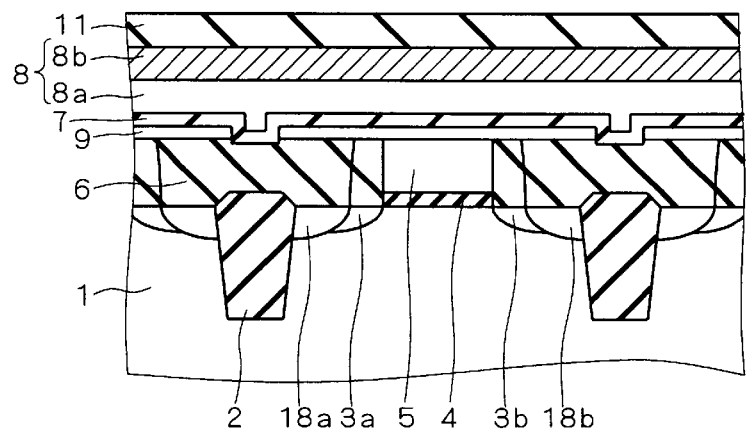
Figure 32:
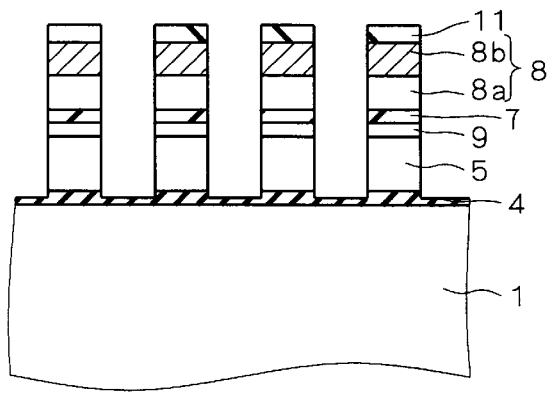
Figure 33:
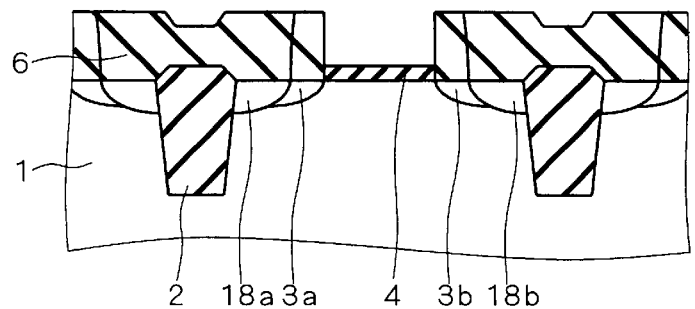

A further dry etching is performed to remove the phosphor-doped amorphous silicon film 9 and the floating gate 5 in the portion where the silicon oxide film 11 is not left. This dry etching, however, is stopped when the tunnel oxide film 4 is exposed. Through this dry etching, the floating gates 5 of the transistors arranged in parallel are divided from one another. The cross sections of the structure obtained through this process along the positions Q1—Q1, Q2—Q2 and Q3—Q3 are shown in FIGS. 31, 32 and 33, respectively. After that, the interlayer insulating film 21 is formed on the silicon oxide film 11, and at the position Q1—Q1, the structure shown in FIG. 69 is obtained.

Applying the present invention to the AND-type flash memory which is thus manufactured, it becomes easier to control the film thickness of the bottom silicon oxide film 7a with high precision. Specifically, after forming the phosphor-doped amorphous silicon film 9 and before forming the bottom silicon oxide film 7a, a heat treatment is performed while exhausting a gas from the vicinity of the silicon substrate 1. The heat treatment is performed at a temperature equal to or higher than that for forming the bottom silicon oxide film 7a and at a pressure equal to or lower than that for forming the bottom silicon oxide film 7a. Through such a heat treatment, it is possible to reduce the ill effect of the film forming gas desorbed from the thick insulating film 6, the TEOS oxide film 601 and the phosphor-doped amorphous silicon film 901 in forming the bottom silicon oxide film 7a.

Alternatively, after forming the phosphor-doped amorphous silicon film 9 and before forming the bottom silicon oxide film 7a, the TEOS oxide film 601 and the phosphor-doped amorphous silicon film 901 deposited on the back surface of the silicon substrate 1 are removed. Further alternatively, these films deposited on the back surface of the silicon substrate 1 are covered with a film which prevents gas desorption under the film formation condition of the bottom silicon oxide film 7a. These methods can also reduce the ill effect of the film forming gas in forming the bottom silicon oxide film 7a.

(b-2) Stacked Gate Flash Memory

Figure 34:
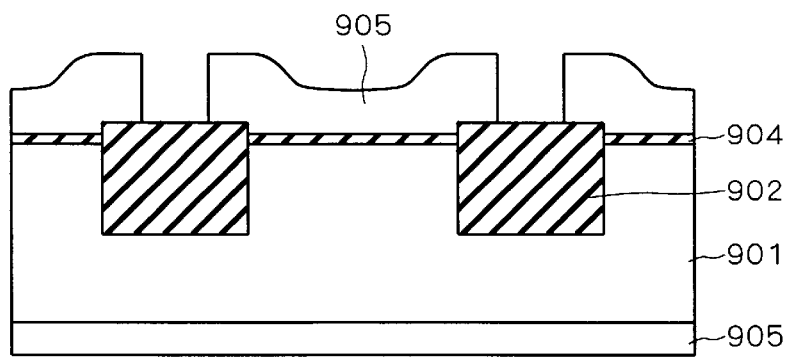
FIGS. 34 and 35 are cross sections showing a process for manufacturing a stacked gate flash memory to which the present invention is applicable step by step.
Figure 35:
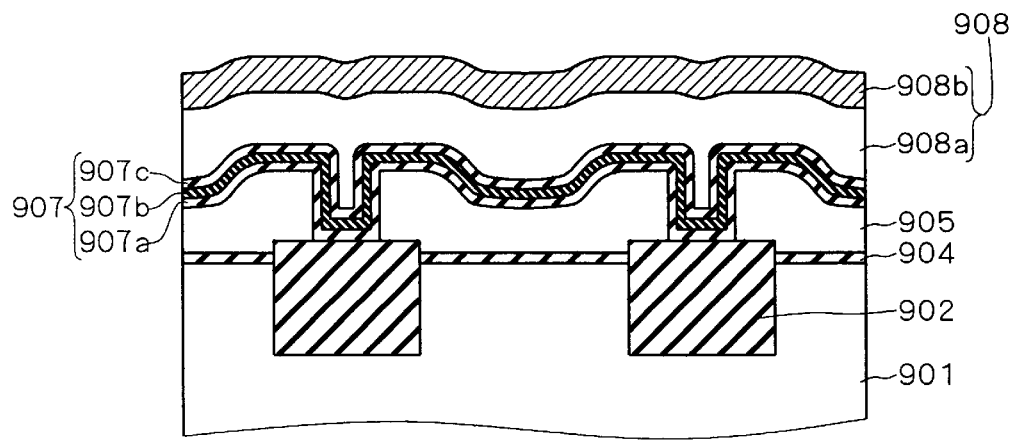

FIGS. 34 and 35 are cross sections showing a process for manufacturing a stacked gate flash memory to which the present invention is applicable step by step. A main surface of a silicon substrate 901 is selectively etched to form trenches and the trenches are filled with silicon oxide film by the HDP (High Density Plasma) method to form trench isolation oxide films 902. After that, a tunnel oxide film 904 is formed. In this figure, the tunnel oxide film 904 which is in contact with the trench isolation oxide films 902 is not shown, and apparently the tunnel oxide films 904 are sectioned by the trench isolation oxide films 902. On the trench isolation oxide films 902 an the tunnel oxide film 904, a doped amorphous silicon film 905 is provided and patterned to have openings which allow the vicinities of the center portions of the trench isolation oxide films 902 to be selectively exposed (FIG. 34). The left doped amorphous silicon film 905 serves as a floating gate.

An ONO film 907 is formed entirely on the doped amorphous silicon film 905 and the exposed trench isolation oxide films 902. Further, a doped polysilicon film 908a and a doped tungsten silicide film 908b are formed in this order. The doped polysilicon film 908a and the doped tungsten silicide film 908b constitute a control gate 908. The ONO film 907 is constituted of a bottom silicon oxide film 907a, a silicon nitride film 907b and a top silicon oxide film 907c formed in this order from the closer side of the doped amorphous silicon film 905.

Also in the stacked gate flash memory having the above-discussed structure, the doped amorphous silicon film 905 is formed and then the bottom silicon oxide film 907a is formed. Applying the present invention, after forming the doped amorphous silicon film 905 and before forming the bottom silicon oxide film 907a, a heat treatment is performed while exhausting a gas from the vicinity of the silicon substrate 901. The heat treatment is performed at a temperature equal to or higher than that for forming the trench isolation oxide films 902 and the doped amorphous silicon film 905 and at a pressure equal to or lower than that for forming the trench isolation oxide films 902 and the doped amorphous silicon film 905. Through such a heat treatment, it is possible to reduce an ill effect of the gas desorbed from the doped amorphous silicon film 905 in forming the bottom silicon oxide film 907a.

Alternatively, after forming the doped amorphous silicon film 905 and before forming the bottom silicon oxide film 907a, the doped amorphous silicon film 905 deposited on a back surface of the silicon substrate 901 is removed. Further alternatively, the doped amorphous silicon film 905 deposited on the back surface of the silicon substrate 901 is covered with a film which prevents gas desorption under the film formation condition of the bottom silicon oxide film 907a. These methods can also reduce the ill effect of the film forming gas in forming the bottom silicon oxide film 907a.

(b-3) MOS Transistor

Figure 36:
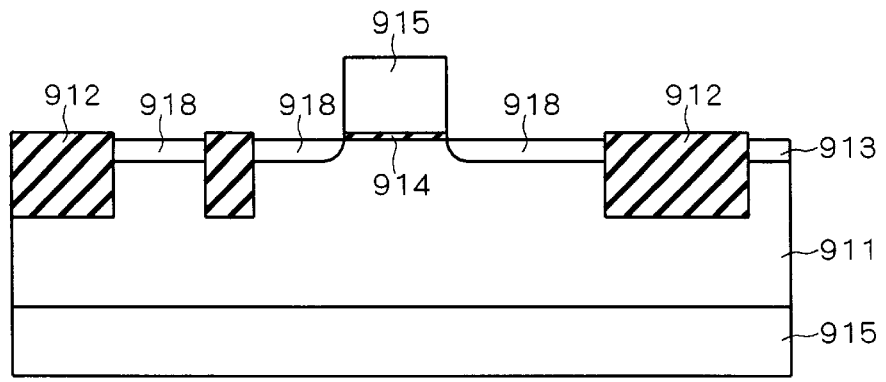
FIGS. 36 to 38 are cross sections showing a process for manufacturing a MOS transistor to which the present invention is applicable step by step.
Figure 37:
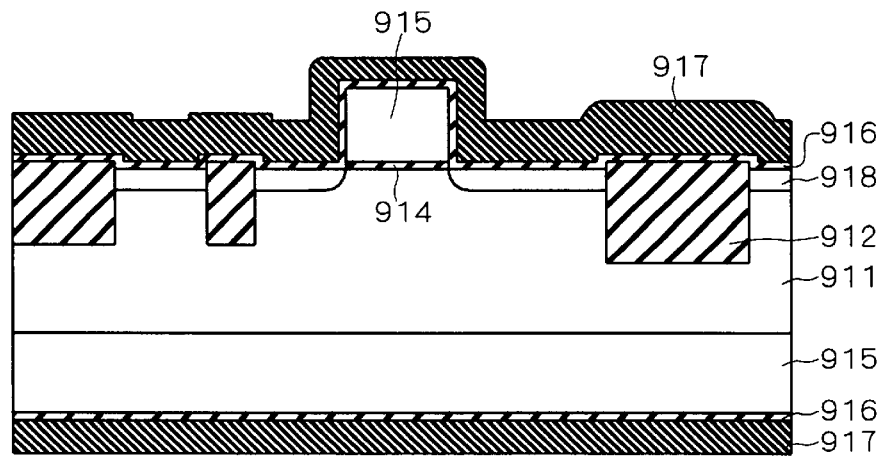
Figure 38:
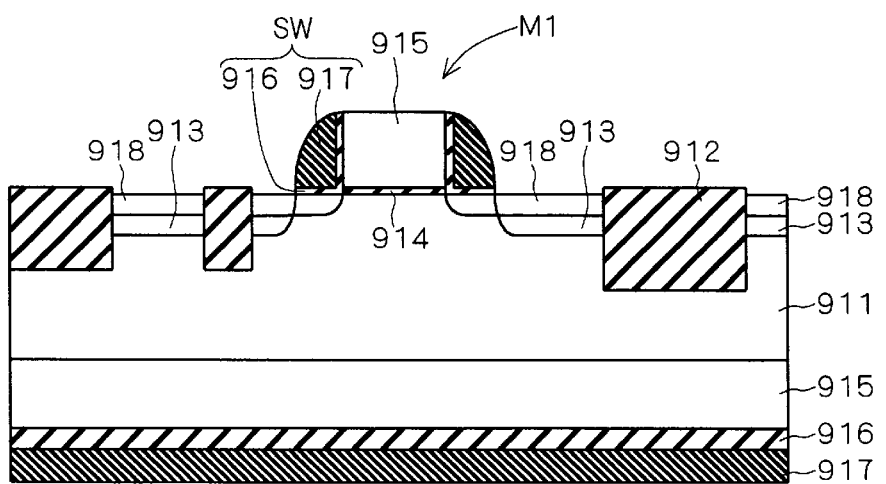

FIGS. 36 to 38 are cross sections showing a process for manufacturing a MOS transistor to which the present invention is applicable step by step. In a main surface of a silicon substrate 911, trench isolation oxide films 912 are formed. After that, a gate oxide film 914 and a doped polysilicon film 915 are formed in this order. If the doped polysilicon film 915 is formed by the CVD method, the doped polysilicon film 915 is also deposited on a back surface of the silicon substrate 911.

After that, the gate oxide film 914 and the doped polysilicon film 915 are patterned and left between a pair of adjacent trench isolation oxide films 912. Then, an impurity is introduced into the main surface of the silicon substrate 911 with the left gate oxide film 914 and doped polysilicon film 915 used as a mask, to form an impurity diffusion layer 918. The impurity diffusion layer 918 has, e.g., an n$^-$ conductivity type (FIG. 36). The left doped polysilicon film 915 serves as a gate.

After that, a TEOS oxide film 916 and a silicon nitride film 917 are entirely formed by the CVD method in this order. At this time, the TEOS oxide film 916 and the silicon nitride film 917 are also deposited on the back surface of the silicon substrate 911 (FIG. 37). The TEOS oxide film 916 is formed to have a film thickness of 30 nm under the condition, e.g., at a pressure of 130 to 270 Pa and a temperature of 600° to 700° C. The silicon nitride film 917 is formed of $SiH_4$ (or DCS) and $NH_3$ to have a film thickness of 20 nm under the condition, e.g., at a pressure of about 100 Pa and a temperature of 600® to 800° C.

Then, the TEOS oxide film 916 and the silicon nitride film 917 are selectively removed by anisotropic dry etching, leaving these films only on the side surfaces of the gate oxide film 914 and the doped polysilicon film 915, to form sidewalls SW. An impurity is introduced into the main surface of the silicon substrate 911 with the doped polysilicon film 915 and the sidewalls SW used as a mask, to form an impurity diffusion layer 913. The impurity diffusion layer 913 has, e.g., an n$^+$ conductivity type. The impurity diffusion layers 913 and 918, the gate oxide film 914 and the doped polysilicon film 915 constitute an NMOS transistor M1 (FIG. 38).

The temperature for forming the silicon nitride film 917 is equal to or higher than that for forming the TEOS oxide film 916, and the pressure for forming the silicon nitride film 917 is equal to or lower than that for forming the TEOS oxide film 916. Then, when these films are sequentially formed, the gas desorbed form the TEOS oxide film 916 causes film reformation in forming the silicon nitride film 917.

Then, applying the present invention, after forming the TEOS oxide film 916 and before forming the silicon nitride film 917, a heat treatment is performed while exhausting a gas from the vicinity of the silicon substrate 911. The heat treatment is performed at a temperature equal to or higher than that for forming the silicon nitride film 917 and at a pressure equal to or lower than that for forming the silicon nitride film 917. Through such a heat treatment, it is possible to reduce film reformation, making the width of the sidewalls SW stable, and achieve transistors with stable characteristics.

Alternatively, after forming the TEOS oxide film 916 and before forming the silicon nitride film 917, the TEOS oxide film 916 deposited on the back surface of the silicon substrate 911 is removed. Further alternatively, the TEOS oxide film 916 deposited on the back surface of the silicon substrate 911 is covered with a film which prevents gas desorption under the film formation condition of the silicon nitride film 917. These methods can also reduce the ill effect of the film forming gas in forming the silicon nitride film 917.

FIG. 39 is a cross section showing a structure where MOS transistors M2 are arranged close to each other. The MOS transistor M2 is constituted of the impurity diffusion layers 913 and 918, the gate oxide film 914 and the doped polysilicon film 915, like the MOS transistor M1. In the MOS transistor M2, however, a metal film 919 is formed on the doped polysilicon film 915 and the sidewalls SW are formed on the side surfaces of the gate oxide film 914, the doped polysilicon film 915 and the metal film 919. The adjacent MOS transistors M2 share the impurity diffusion layers 913 and 918 located therebetween.

On the MOS transistors M2 and the trench isolation oxide films 912, a TEOS oxide film 926 is formed. The TEOS oxide film 926 may be made of BPTEOS gas. The TEOS oxide film 926 has openings to expose the impurity diffusion layers 913 and 918. The openings are filled with metal wires 920, to form metal contacts MC1 and MC2. The metal contact MC2 has a structure where the metal wire 920 is connected to the impurity diffusion layers 913 and 918 that the adjacent transistors M2 share. The metal contact MC1 has a structure where the metal wire 920 is connected to the impurity diffusion layers 913 and 918 that the adjacent transistors M2 do not share.

If the width of the sidewall SW is stable, even if the distance between the adjacent transistors M2 is narrow, it becomes easier to provide the metal contact MC2 at a predetermined position and it is possible to reduce the possibility that the metal wire 920 and the metal film 919 might come into contact with each other.

FIG. 40 is a cross section showing a structure where metal wires 924 provided above the metal wires 920 (on the opposite side of the silicon substrate 911) are used, instead of the metal wires 920, to form the metal contact MC2. Like the structure shown in FIG. 39, the transistors M2 are provided adjacently to each other. The TEOS oxide film 926 is formed on the transistors M2 and the trench isolation oxide films 912. There is a possibility that the TEOS oxide film 926 might be deposited also on the not-shown back surface of the silicon substrate 911.

A polysilicon wire 921 is formed, penetrating the TEOS oxide film 926, and its lower end comes into contact with the impurity diffusion layers 913 and 918 that the transistors M2 do not share, to form a polysilicon contact PC1. The polysilicon wire 921 is provided also above the TEOS oxide film 926.

The polysilicon wire 921 and the TEOS oxide film 926 are covered with a TEOS oxide film 922. The TEOS oxide film 922 may be made of BPTEOS gas. There is a possibility that the TEOS oxide film 922 might be deposited also on the not-shown back surface of the silicon substrate 911.

The TEOS oxide films 922 and 926 have an opening conducting to both films, which is filled with the metal wire 924. The metal wire 924 is located between the adjacent transistors M2, being in contact with the impurity diffusion layers 913 and 918 that the transistors M2 share, to form the metal contact MC2. The metal wire 924 is provided also above the TEOS oxide film 922.

More detailed discussion will be presented on the metal contact MC2. After forming the TEOS oxide film 922 covering the polysilicon wire 921 and the TEOS oxide film 926, the opening for the metal contact MC2 is provided and a film having hydrofluoric acid (HF) resistance, such as a silicon nitride film 923 is formed thinly, e.g., to have a film thickness of 10 nm. After that, an anisotropic etching is entirely performed to leave the silicon nitride film 923 only on the side surfaces of the opening. Subsequently, a natural oxide film formed on the impurity diffusion layers 913 and 918 exposed in the opening is removed by using hydrofluoric acid. After this hydrofluoric acid treatment, the opening is filled with the metal wire 924 with the silicon nitride film 923 interposed therebetween, to form the metal contact MC2.

In this hydrofluoric acid treatment, since the polysilicon wire 921 and the TEOS oxide films 922 and 926 are covered with the silicon nitride film 923 at the position on the side surfaces of the opening, it is possible to prevent extension of the opening due to the hydrofluoric acid and accordingly contact between the metal wire 924 which fills the opening and the metal film 919.

In the MOS transistor semiconductor device having such a structure, the TEOS oxide films 922 and 926 are formed to have a film thickness of 30 nm under the condition, e.g., at a pressure of 130 to 270 Pa and a temperature of 600° to 700° C. The silicon nitride film 923 is formed of $SiH_4$ (or DCS) and $NH_3$ to have a film thickness of 20 nm under the condition, e.g., at a pressure of about 100 Pa and a temperature of 600° to 800° C. The temperature for forming the silicon nitride film 923 is equal to or higher than that for forming the TEOS oxide films 922 and 926, and the pressure for forming the silicon nitride film 923 is equal to or lower than that for forming the TEOS oxide films 922 and 926. Then, when these films are sequentially formed, the gas desorbed form the TEOS oxide films 922 and 926 causes film reformation in forming the silicon nitride film 923. In particular, at a position J1 near the opening of the TEOS oxide film 922, an unnecessarily thick insulating film is likely to be deposited.

Then, applying the present invention, after forming the TEOS oxide film 922 and before forming the silicon nitride film 923, a heat treatment is performed while exhausting a gas from the vicinity of the silicon substrate 911. The heat treatment is performed at a temperature equal to or higher than that for forming the silicon nitride film 923 and at a pressure equal to or lower than that for forming the silicon nitride film 923. Through such a heat treatment, it is possible to reduce film reformation and accordingly suppress unnecessary narrowing of an upper portion of the opening in the metal contact MC2. Therefore, when the opening is filled with the metal wire 924 with the silicon nitride film 923 interposed therebetween, no overhang occurs and this accordingly reduces the possibility of creating a cavity in the metal contact MC2.

Alternatively, after forming the TEOS oxide film 922 and before forming the silicon nitride film 923, the TEOS oxide films 922 and 926 deposited on the back surface of the silicon substrate 911 are removed. Further alternatively, these films deposited on the back surface of the silicon substrate 911 are covered with a film which prevents gas desorption under the film formation condition of the silicon nitride film 923. These methods can also reduce the ill effect of the film forming gas in forming the silicon nitride film 923.

(b-4) Capacitor

Figure 41:
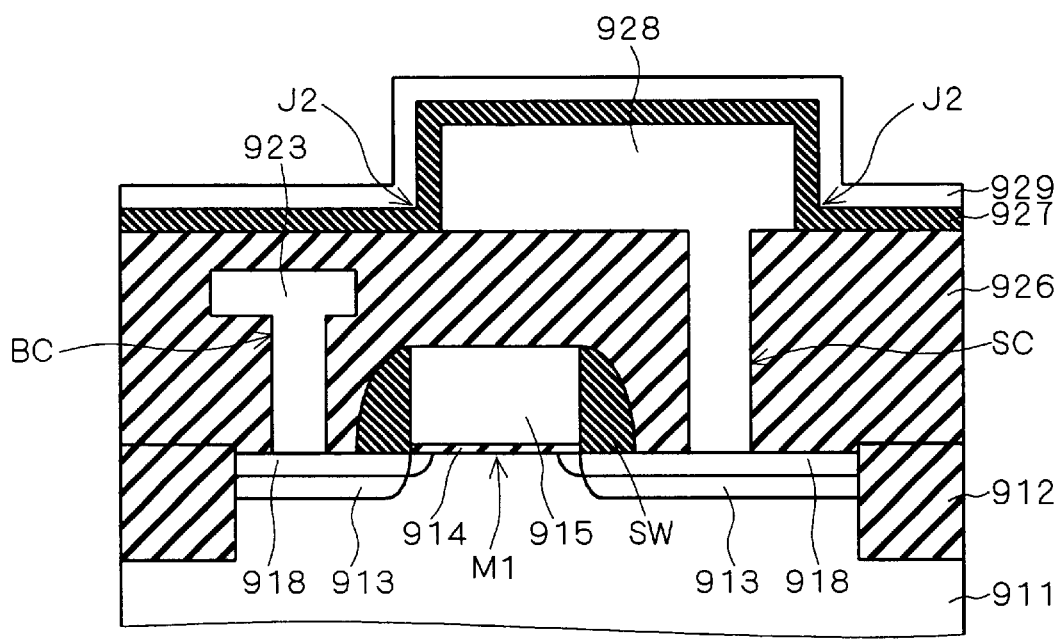
FIG. 41 is a cross section showing a structure of a capacitor of a DRAM to which the present invention is applicable on the way of manufacturing process.

FIG. 41 is a cross section showing a structure of a capacitor of a DRAM to which the present invention is applicable on the way of manufacturing process. The transistor M1 having the structure shown in FIG. 38 is adopted as a transfer gate transistor connected to a stacked capacitor.

The transistor M1, together with the trench isolation oxide film 912, is covered with the TEOS oxide film 926. The TEOS oxide film 926 may be made of BPTEOS gas. The TEOS oxide film 926 is formed to have a film thickness of, e.g., 500 nm by the CVD method, and there is a possibility that the TEOS oxide film 926 might be deposited also on the not-shown back surface of the silicon substrate 911.

The bit line 923 is provided in the TEOS oxide film 926 and connected to one of a pair of impurity diffusion layers 913 and 918 which constitute the transistor M1. In other words, the bit line 923 forms a bit line contact BC for the impurity diffusion layers 913 and 918. The TEOS oxide film 926 has an opening to expose the other of the pair of impurity diffusion layers 913 and 918, being filled with a storage node 928. In other words, the storage node 928 forms a storage node contact SC for the impurity diffusion layers 913 and 918. The storage node 928 is made of, e.g., a phosphor-doped polysilicon film.

The storage node 928 is covered with a capacitor insulating film 927. the capacitor insulating film 927 is made of an ONO film. A not-shown bottom silicon oxide film is formed by swallowing up the air when the silicon substrate 911 is entered into a CVD furnace to form a silicon nitride film. In the CVD furnace, a silicon nitride film having a film thickness of, e.g., 10 nm is formed. After that, a surface of the silicon nitride film is oxidized in the wet atmosphere, to form a top silicon oxide film.

The capacitor insulating film 927 is covered with a cell plate 929. The cell plate 929 is made of, e.g., a phosphor-doped polysilicon film.

The TEOS oxide film 926 is formed to have a film thickness of 30 nm under the condition, e.g., at a pressure of 130 to 270 Pa and a temperature of 600° to 700° C. The capacitor insulating film 927 is formed of $SiH_4$ (or DCS) and $NH_3$ to have a film thickness of 20 nm under the condition, e.g., at a pressure of about 100 Pa and a temperature of 600° to 800° C. The temperature for forming the capacitor insulating film 927 is equal to or higher than that for forming the TEOS oxide film 926, and the pressure for forming the capacitor insulating film 927 is equal to or lower than that for forming the TEOS oxide film 926. Then, when these films are sequentially formed, the gas desorbed from the TEOS oxide film 926 causes film reformation in forming the capacitor insulating film 927. In particular, at a position J2 near the TEOS oxide film 926, the film thickness of the capacitor insulating film 927 is likely to become unnecessarily thicker.

Then, applying the present invention, after forming the TEOS oxide film 926 and before forming the capacitor insulating film 927, a heat treatment is performed while exhausting a gas from the vicinity of the silicon substrate 911. The heat treatment is performed at a temperature equal to or higher than that for forming the capacitor insulating film 927 and at a pressure equal to or lower than that for forming the capacitor insulating film 927. Through such a heat treatment, it is possible to reduce film reformation. Since the film thickness of the capacitor insulating film 927 becomes stable and the possibility of depositing a film of undesired film quality becomes smaller, a stacked capacitor having a stable capacitance value can be achieved.

Figure 42:
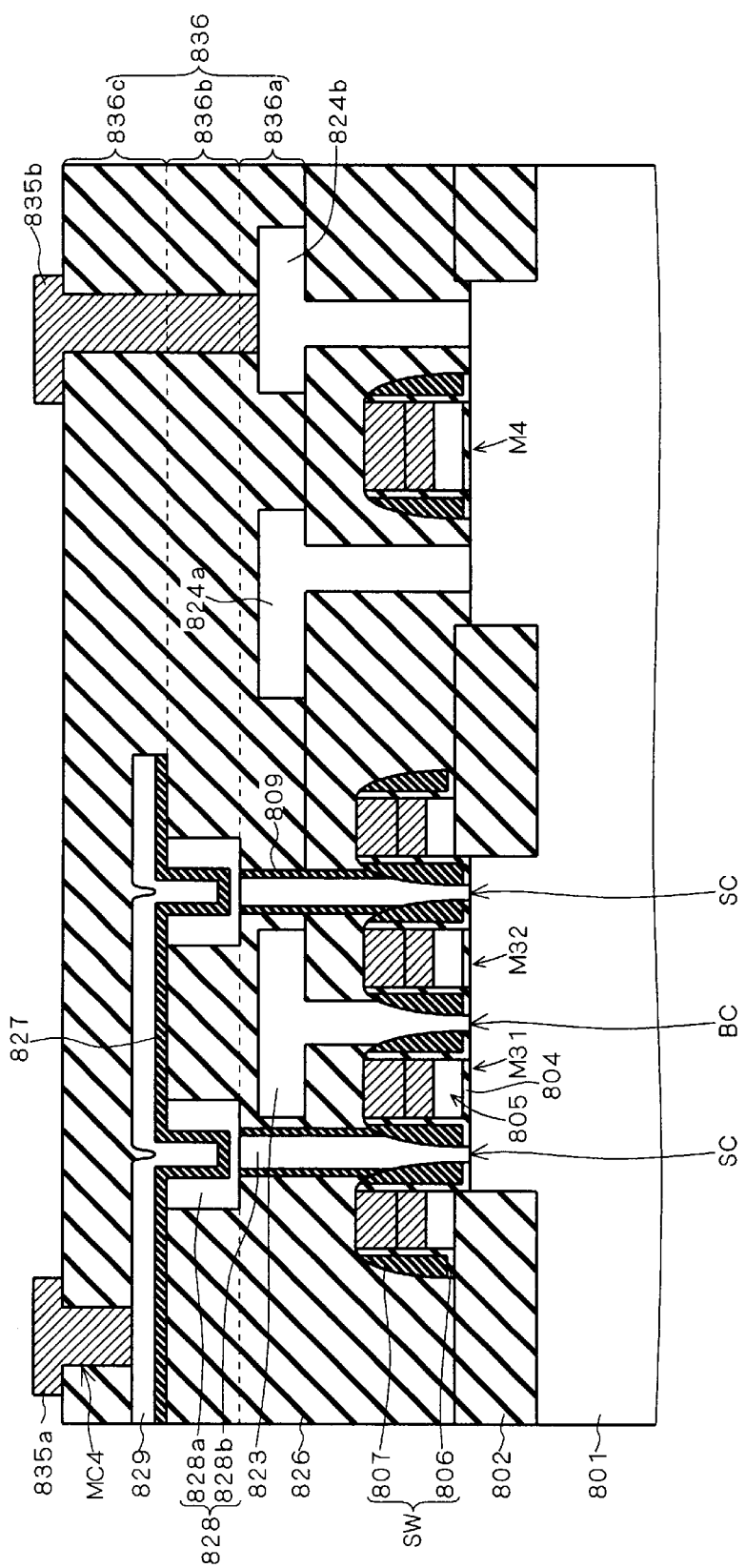
FIG. 42 is a cross section showing a structure of a capacitor of another DRAM to which the present invention is applicable on the way of manufacturing process.

FIG. 42 is a cross section showing a structure of a capacitor of another DRAM to which the present invention is applicable on the way of manufacturing process. In a main surface of a silicon substrate 801, trench isolation oxide films 802 are selectively formed. On the main surface of the silicon substrate 801 and the trench isolation oxide films 802, transfer gate transistors M31 and M32 and a transistor M4 of peripheral circuit are provided. The transistors M31, M32 and M4 each comprise a gate oxide film 804 and a gate 805 of multilayered structure. On side surfaces of the gate oxide film 804 and the gate 805, the main surface of the neighboring silicon substrate 801 and the trench isolation oxide films 802, a TEOS oxide film 806 is formed. The TEOS oxide film 806 is formed by, e.g., the CVD method, and there is a possibility that the TEOS oxide film 806 might be formed also on a not-shown back surface of the silicon substrate 801.

A silicon nitride film 807 is formed on the TEOS oxide film 806, and the TEOS oxide film 806 and the silicon nitride film 807 constitute sidewalls SW. In FIG. 42, impurity diffusion regions that the transistors M31, M32 and M4 each have and are formed in the main surface of the silicon substrate 801 are not shown.

Like the silicon nitride film 917 discussed with reference to FIG. 39, after forming the TEOS oxide film 806 and before forming the silicon nitride film 807, a heat treatment is performed while exhausting a gas from the vicinity of the silicon substrate 801. The heat treatment is performed at a temperature equal to or higher than that for forming the silicon nitride film 807 and at a pressure equal to or lower than that for forming the silicon nitride film 807. Through such a heat treatment, it is possible to reduce film reformation and make the width of the sidewall SW stable. Therefore, even if the distance between the adjacent transistors M31 and M32 is narrow, it becomes easier to provide the bit line direct contact BC at a predetermined position and it is possible to reduce the possibility that the bit line 823 and the gate 805 might come into contact with each other.

Alternatively, after forming the TEOS oxide film 806 and before forming the silicon nitride film 807, the TEOS oxide film 806 deposited on the back surface of the silicon substrate 801 is removed. Further alternatively, the TEOS oxide film 806 deposited on the back surface of the silicon substrate 801 is covered with a film which prevents gas desorption under the film formation condition of the silicon nitride film 807. These methods can also reduce the ill effect of the film forming gas in forming the silicon nitride film 807 and make the width of the sidewall SW stable.

The transistors M31, M32 and M4 are covered with a TEOS oxide film 826. The TEOS oxide film 826 is formed, e.g., by the CVD method to have a film thickness of 500 nm and have openings above not-shown impurity diffusion regions. In the opening, a phosphor-doped polysilicon film is so formed as to fill the opening in a self-aligned manner. By patterning the phosphor-doped polysilicon film, the bit line 823 is formed in the opening of the TEOS oxide film 826 between the transistors M31 and M32, to achieve the bit line direct contact BC. Further, the opening of the TEOS oxide film 826 above the impurity diffusion regions of the transistor M4 is filled with wires 824a and 824b. The bit line 823, the wires 824a and 824b are also provided above the TEOS oxide film 826.

The bit line 823, the wires 824a and 824b and the TEOS oxide film 826 are covered with a TEOS oxide film 836. The TEOS oxide film 836 is formed to have a film thickness of, e.g., 500 nm. The TEOS oxide film 836 includes storage nodes 828 each having a concave portion 828a extending towards the opposite side of the silicon substrate 801 and a pole-like portion 828b extending linearly from the concave portion 828a towards the silicon substrate 801. The storage nodes 828 are in contact with the not-shown impurity diffusion regions of the transistors M31 and M32 through the openings of the TEOS oxide film 826, to achieve storage node direct contacts SC. The pole-like portion 828b of the storage node 828, however, faces the TEOS oxide films 826 and 836 with the silicon nitride film 809 interposed therebetween.

The TEOS oxide film 836 has a triple-layered structure consisting of TEOS oxide films 836a, 836b and 836c which are layered in this order from the closer side of the silicon substrate 801. After forming the TEOS oxide film 836a, openings used for the storage node direct contact SC are provided in the TEOS oxide films 836a and 826. Then, the silicon nitride film 809 is provided only on the side surfaces of the openings.

Then, like the silicon nitride film 923 discussed with reference to FIG. 40, after forming the TEOS oxide film 836a, particularly after providing the openings for the storage node direct contact SC, and before forming the silicon nitride film 809, a heat treatment is performed while exhausting a gas from the vicinity of the silicon substrate 801. The heat treatment is performed at a temperature equal to or higher than that for forming the silicon nitride film 809 and at a pressure equal to or lower than that for forming the silicon nitride film 809. Through such a heat treatment, it is possible to reduce film reformation and suppress unnecessary narrowing of an upper portion of the pole-like portion 828b. Therefore, the possibilities that a cavity might be created in the storage node direct contact SC and electrical resistance of the storage node 828 might unnecessarily increase become smaller.

Alternatively, after forming the TEOS oxide film 836a, particularly after providing the openings for the storage node direct contact SC, and before forming the silicon nitride film 809, the TEOS oxide films 826 and 836a deposited on the back surface of the silicon substrate 801 are removed. Further alternatively, these films deposited on the back surface of the silicon substrate 801 are covered with a film which prevents gas desorption under the film formation condition of the silicon nitride film 809. These methods can also reduce the ill effect of the film forming gas in forming the silicon nitride film 809 and the possibility of unnecessarily increasing the electrical resistance of the storage node 828.

After forming the silicon nitride film 809, the pole-like portions 828b are formed and then the TEOS oxide film 836b is formed. In the TEOS oxide film 836b provided are openings to surround the openings for the storage node direct contact SC provided in the TEOS oxide films 826 and 836a, being wider than the openings. Then, the concave portions 828a are formed by using the phosphor-doped polysilicon film.

A capacitor insulating film 827 is formed on the storage nodes 828 and the TEOS oxide film 836b. The capacitor insulating film 827 is made of an ONO film and formed in the same manner as the capacitor insulating film 927 which is discussed with reference to FIG. 41.

Then, like the capacitor insulating film 927, after forming the TEOS oxide film 836b and before forming the capacitor insulating film 827, a heat treatment is performed while exhausting a gas from the vicinity of the silicon substrate 801. The heat treatment is performed at a temperature equal to or higher than that for forming the capacitor insulating film 827 and at a pressure equal to or lower than that for forming the capacitor insulating film 827. Through such a heat treatment, it is possible to reduce film reformation. Since the film thickness of the capacitor insulating film 827 becomes stable and the possibility of depositing a film of undesired film quality becomes smaller, a stacked capacitor having a stable capacitance value can be achieved.

After forming a cell plate 829 on the capacitor insulating film 827, the TEOS oxide film 836c is formed to cover the cell plate 829, the capacitor insulating film 827 and the TEOS oxide film 836b. Then, a metal wire 835a connected to the cell plate 829 and a metal wire 835b connected to the wire 824b are formed.

C. Various Preferred Embodiments

Now, discussion will be presented on various preferred embodiments which are applicable to the above-discussed various semiconductor devices.

The First Preferred Embodiment

The first preferred embodiment is based on the first basic idea of the present invention. Specifically, we consider a case where a first layer is formed on a main surface of a wafer or further on a back surface thereof by the CVD method at a first temperature and a first pressure and in a state where the first layer is exposed, a second layer is formed by the CVD method at a second temperature equal to or higher than the first temperature and a second pressure equal to or lower than the first pressure. Then, after forming the first layer and before forming the second layer, the whole wafer, particularly the main surface and the back surface thereof, is annealed at a third temperature equal to or higher than the second temperature and a third pressure equal to or lower than the second pressure, to desorb a film forming gas. In order to reduce film reformation on the wafer due to the gas, the gas should be quickly exhausted.

The conditions for forming these films by the CVD method and for annealing are shown in Table 1, for example.

TABLE 1

| | | Pressure (Pa) | Temperature (° C.) |
|---|---|---|---|
| First Layer | TEOS Oxide Film | 130–270 | 600–700 |
| | Doped Amorphous Silicon Film | 130–400 | 500–600 |
| Second Layer | DCS-HTO Film | 60–110 | 700–850 |
| | Silicon Nitride Film | 60–100 | 600–800 |
| | Annealing Condition | 40–60 | 800–1000 |

For anneal atmosphere, an inert gas atmosphere such as $N_2$ or Ar is adopted. The annealing time is desired to be not shorter than the film formation time, but the annealing condition requires at least that the third temperature should be equal to or higher than the second temperature and the third pressure should be equal to or lower than the second pressure.

FIG. 43 is a graph showing the relation between the film formation condition and the annealing condition. The horizontal axis indicates a temperature and the vertical axis indicates a pressure, and a dot $A_2$ indicating the second temperature $T_2$ and the second pressure $P_2$ is plotted. The area $A_1$ is an area for a temperature not higher than the second temperature $T_2$ and a pressure not lower than the second pressure $P_2$, and the first temperature and the first pressure are present in the area $A_1$. The area $A_3$ is an area for a temperature not lower than the second temperature $T_2$ and a pressure not higher than the second pressure $P_2$, and the third temperature and the third pressure are chosen from the area $A_3$. Such a technical viewpoint as the annealing condition is determined in accordance with the film formation condition for the second layer is not suggested in Japanese Patent Application Laid Open Gazettes Nos. 2000-294551 and 9-55480.

As a heat source, for example, a rapid thermal anneal (hereinafter referred to as "RTA") apparatus may be adopted. This apparatus allows a high-temperature heat treatment in a short time. Further, when the wafers are processed in a sheet-fed manner, both the pressure and the temperature can be easily controlled. Furthermore, a desorbed gas can be exhausted in a narrow chamber in a short time, thereby reducing the possibility of film reformation on the wafer.

FIG. 44 is a cross section showing an exemplary structure of a RTA apparatus 110 applicable to the first preferred embodiment, and FIG. 45 is a cross section viewed from the position Q4—Q4 of FIG. 44. A chamber 101 and lamps 102a and 102b are arranged in a heat holding bath 104, and a pyrometer 103 and an exhaust pipe 105 are connected to the chamber 101.

The chamber 101 comprises a plane-like upper surface 101a and a plane-like lower surface 101b, a gas introduction port 101c and a gas exhaust port 101d both of which are arranged substantially in parallel to these surfaces. The lower surface 101b is provided with rising lift pins 101e, exhaust holes 101f conducting to the exhaust pipe 105 and a monitoring window 101g which is opened, allowing the temperature to be monitored from the pyrometer 103. The upper surface 101a, the lower surface 101b, the gas introduction port 101c, the gas exhaust port 101d, the lift pins 101e and the monitoring window 101g are resistant to high temperature and made of materials which transmits the light from the lamps 102a. As the material, for example, quartz may be used.

The wafer 100 on which the first layer is provided is placed in the chamber 101, being supported by the lift pin 101e. It is desirable that the gas introduction port 101c and the gas exhaust port 101d should be opposed to each other and a center point Z of the wafer 100 should be present on a central axis of the gas introduction port 101c and the gas exhaust port 101d. For example, the center point Z of the wafer 100 is located away from edges of the gas introduction port 101c and the gas exhaust port 101d by distances d1 and d2 in vertical and horizontal directions, respectively.

The lamps 102a and 102b are arranged above the upper surface 101a and below the lower surface 101b, respectively, through which the wafer 100 is heated. In this case, the gas adopted for the anneal atmosphere (e.g., $N_2$ or Ar) is introduced from the gas introduction port 101c and exhausted from the gas exhaust port 110d and the exhaust holes 101f, and the pressure is thereby set to a predetermined pressure. In this figure, blank arrows indicate a flow of the gas, and from the gas exhaust port 101d, the exhaust holes 101f and the exhaust pipe 105, the gas desorbed from the first layer is also exhausted.

Thus, by arranging the lamps 102a and 102b and placing the wafer 100, the whole wafer, not only the main surface but also back surface thereof, is fully heated. With this, even if the first layer is present not only on the main surface of the wafer 100 but also on the back surface, the gas desorbed from the first layer does not produce an ill effect on film formation of the second layer. Moreover, since the wafer 100 is supported at the above-discussed position by the lift pins 101e, the introduced gas for annealing efficiently goes around to both the sides of the wafer 100.

Further, since the exhaust holes 101f are arranged near the wafer 100, the gas desorbed from the first layer is efficiently exhausted. For this reason, the required vacuum is only about 10 Pa and the process can be executed with much lower vacuum than that in the technique disclosed in the early-mentioned Japanese Patent Application Laid Open Gazette No. 9-275139.

It is desirable that the exhaust holes 101f should be densely arranged around the wafer 100 and near the gas exhaust port 101d. This allows efficient exhaustion of the gas desorbed from the first layer from the vicinity of the wafer 100. Further, it is desirable that the exhaust holes 101f should each have an extension portion 105a extending from the lower surface 101b towards the upper surface 101a up to near the wafer 100. This also allows efficient exhaustion of the gas desorbed from the first layer from the vicinity of the wafer 100. FIG. 46 is a cross section showing the exhaust pipe 105 having extension portions 105a. For example, the distance between an end of the extension portion 105a and the wafer 100 is determined to be about 1 cm.

Figure 47:
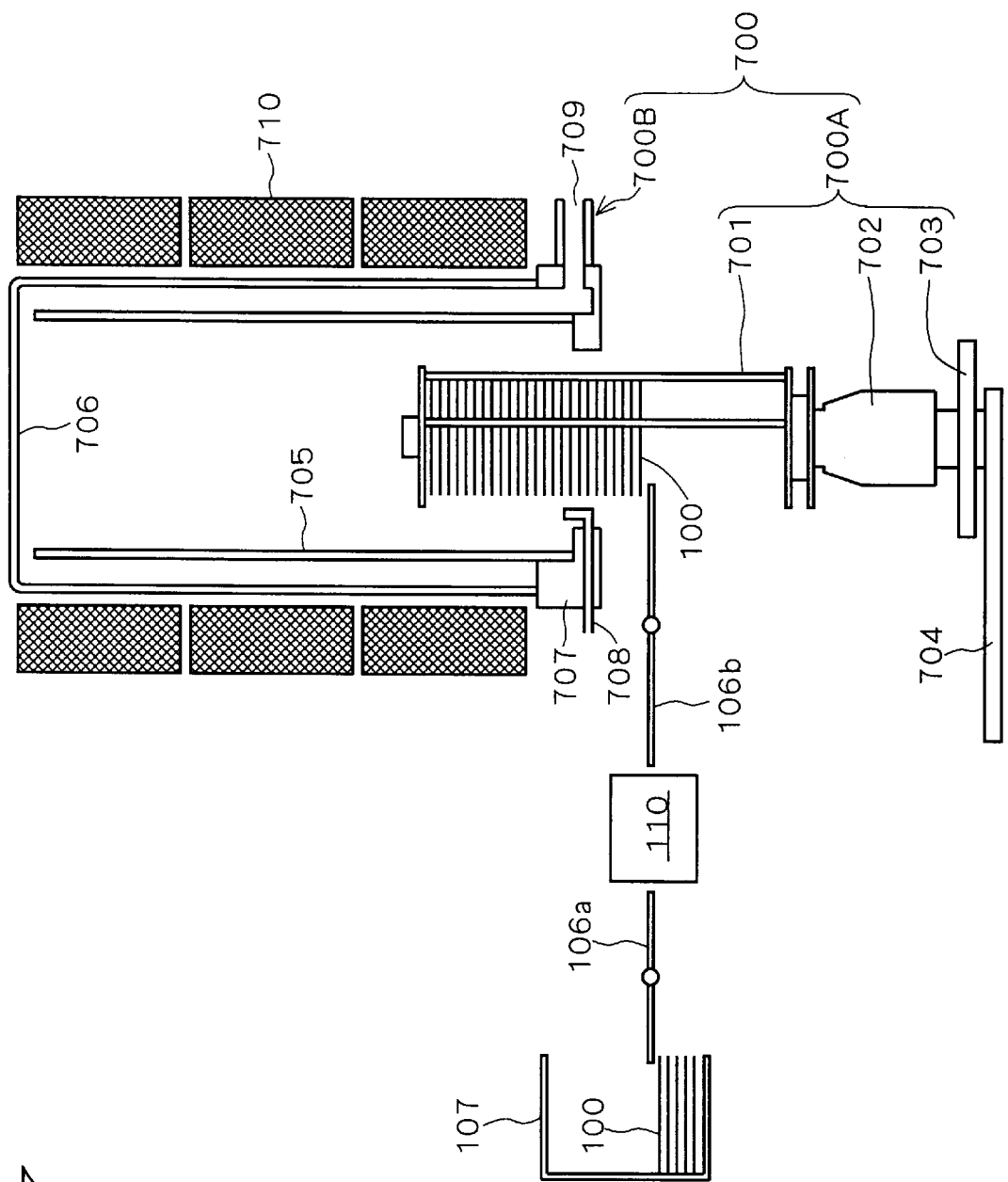

FIG. 47 is a conceptual diagram illustrating a case where combination of the RTA apparatus 110 and a well-known LPCDV apparatus 700 is adopted. The wafer 100 on which the first layer is formed is stored in a cassette 107 and carried to the RTA apparatus 110 by a carrier arm 106a. In the RTA apparatus 110, the annealed wafer 100 is carried to the LPCDV apparatus 700 by the carrier arm 106a.

The LPCDV apparatus 700 comprises a moving portion 700A and a processing portion 700B. The moving portion 700A has a boat 701 on which the wafers to be processed are mounted, a thermal insulation tube 702 on which the boat 701 is mounted, a base 703 for storing the boat 701 and the thermal insulation tube 702 together with the processing portion 700B, and a boat elevator 704. The boat elevator 704 transfers the boat 701, the thermal insulation tube 702 and the base 703 to the processing portion 700B by a not-shown driving mechanism. The boat 701, the thermal insulation tube 702 and the base 703 are made of, e.g., quartz and the boat elevator is made of, e.g., stainless steel.

The processing portion 700B comprises a reaction pipe 705, a pressure vessel 706 enveloping the reaction pipe 705, a manifold 707 for supporting the reaction pipe 705 and the pressure vessel 706, a gas introduction pipe 708 for introducing a gas for the CVD into the reaction pipe 705, an exhaust pipe 709 for exhausting the gas and a heater 710 enveloping the pressure vessel 706 to heat it. The exhaust pipe 709 is connected to a now-shown exhaust apparatus.

Since the RTA apparatus 110 is added to a line for carrying the wafers 100 from the cassette 107 to the boat 701, the exhaustion of the gas desorbed from the first layer and the film formation of the second layer by the CVD method are performed as a series of process, and the process time can be thereby reduced. Further, a high-voltage power supply for the RTA apparatus 110 and pipes and pumps for exhaustion can be placed near the LPCDV apparatus 700, and the area required for the equipment can be thereby reduced.

The Second Preferred Embodiment

Figure 48:
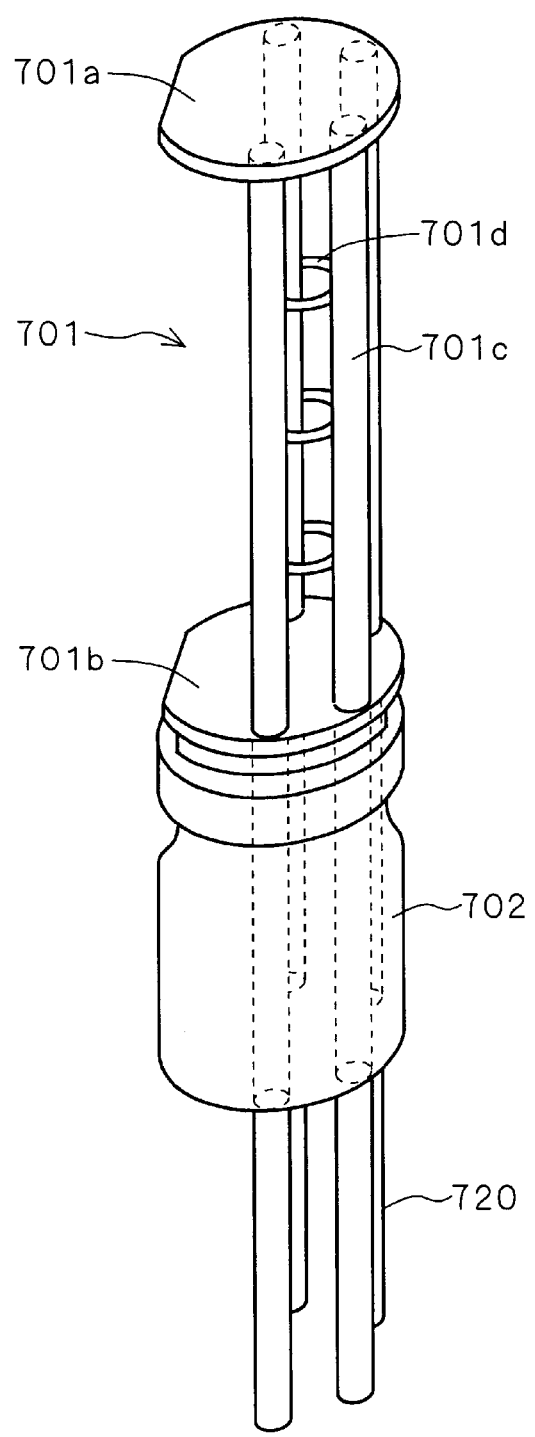

FIG. 48 is a perspective view showing a desirable structure of the boat 701 discussed in the first preferred embodiment. The boat 701 comprises a bottom plate 701b placed on the thermal insulation tube 702, a top plate 701a substantially in parallel to the bottom plate 701b, a plurality of supporting bars 701c for connecting the top plate 701a and the bottom plate 701b, and braces 701d for connecting the supporting bars 701c to one another at predetermined intervals. As discussed later, the supporting bars 701c and the braces 701d have cavities therein, and pipes 720 conducting to the cavities are provided extending towards the opposite side of the top plate 701a and the bottom plate 701b from the thermal insulation tube 702. FIG. 48 shows a case where four supporting bars 701c and four pipes 720 are provided. The top plate 701a, the bottom plate 701b, the supporting bars 701c, the braces 701d and the pipes 720 are made of, e.g., quartz.

Figure 49:
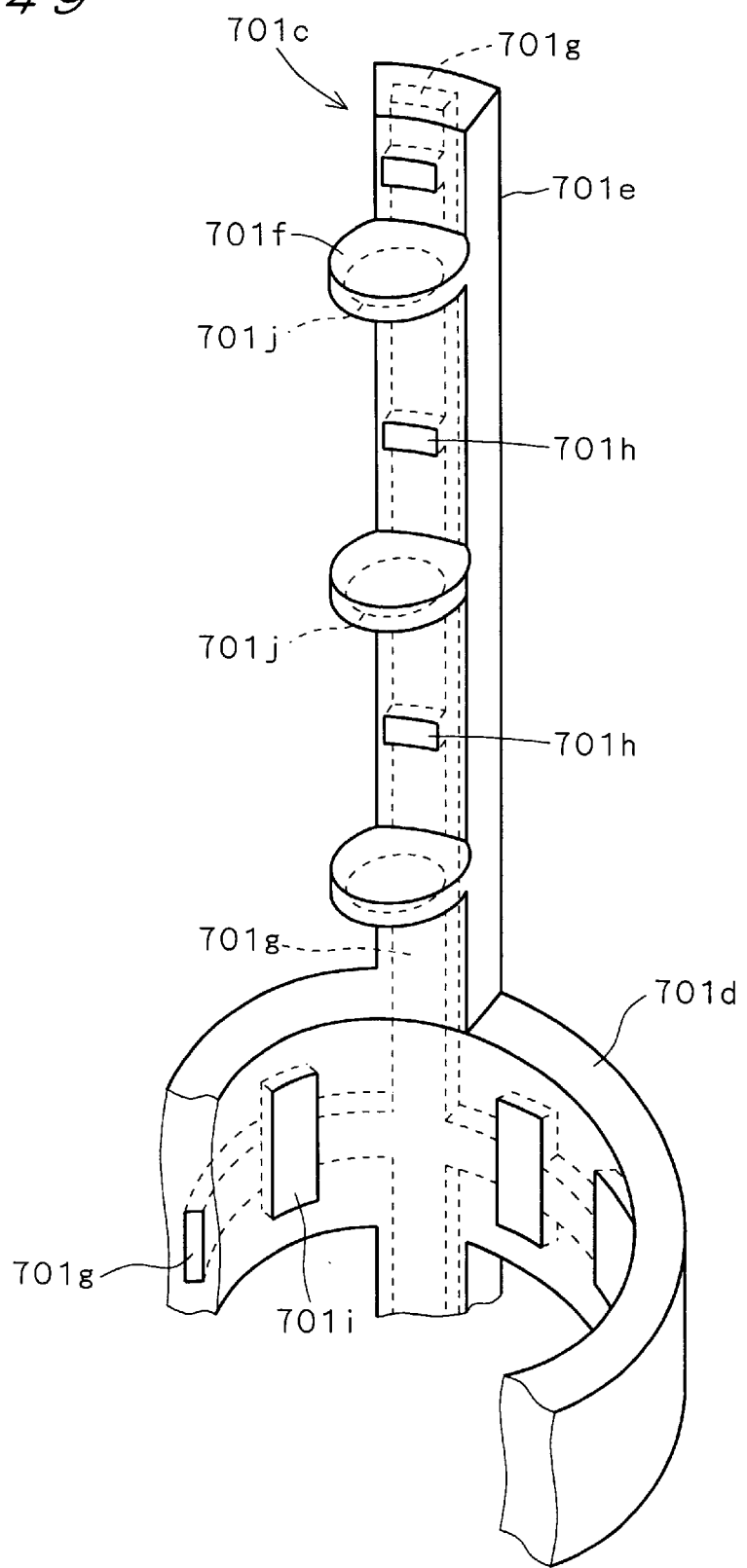

FIG. 49 is a perspective view showing a detailed structure of the supporting bar 701c and the brace 701d. The supporting bar 701c is connected to the top plate 701a and the bottom plate 701b, and has a body 701e extending substantially perpendicular to the top plate 701a and the bottom plate 701b and connecting thereto, and protrusion pieces 701f substantially in parallel to the top plate 701a and the bottom plate 701b, being supported by the body 701e. On a surface of the protrusion piece 701f facing the top plate 701a, the wafer to be processed by the CVD method is placed. The brace 701d is coupled to the body 701e.

The body 701e is provided with an exhaust pipe 701g along a direction where the body 701e is extended. On a side of the body 701e where the protrusion pieces 701f are provided, openings 701h conducting to the exhaust pipe 701g are provided. FIG. 50 is a perspective view showing a structure near the opening 701h. On a side of the protrusion piece 701f facing the bottom plate 701b, i.e., opposite to the surface on which the wafer is mounted, an opening 701j conducting to the exhaust pipe 701g is provided. FIG. 51 is a perspective view showing a structure near the opening 701j. FIG. 52 is a cross section of the body 701e along the section including the openings 701h and 701j. The exhaust pipe 701g conducts to the pipe 720.

The exhaust pipe 701g is also extended inside the brace 701d. The brace 701d is bent, and on the bending inner side, the brace 701d is provided with openings 701i conducting to the exhaust pipe 701g. FIG. 53 is a perspective view showing a structure near the opening 701i.

The protrusion piece 701f on which the wafer is mounted, the body 701e and the brace 701d each have openings 701j, 701h and 701i, respectively, and these openings allows exhaustion from the pipe 720 through the exhaust pipe 701g. Accordingly, in the film formation of the second layer, desorption of the gas from the first layer is performed in parallel and therefore it is possible to reduce the ill effect of the gas on the film formation of the second layer. In particular, the exhaustion from the vicinity of the wafer can be efficiently carried out with the opening 701j.

FIG. 54 is a schematic diagram illustrating a structure of the CVD apparatus employing the boat 701 shown in FIGS. 48 to 53. The pipe 720 and a pipe 721 capable of contracting and extending are added to the well-known LPCDV apparatus shown in FIG. 47. A not-shown exhaust apparatus is connected to the pipe 721. Since the boat 701 goes in/out of the reaction pipe 705 by using the boat elevator 704, the pipe 721 is interposed between the exhaust apparatus and the pipe 720 so as to absorb the variation of distance therebetween. The pipe 721 can be materialized by employing, e.g., stainless steel.

The Third Preferred Embodiment

Figure 55:
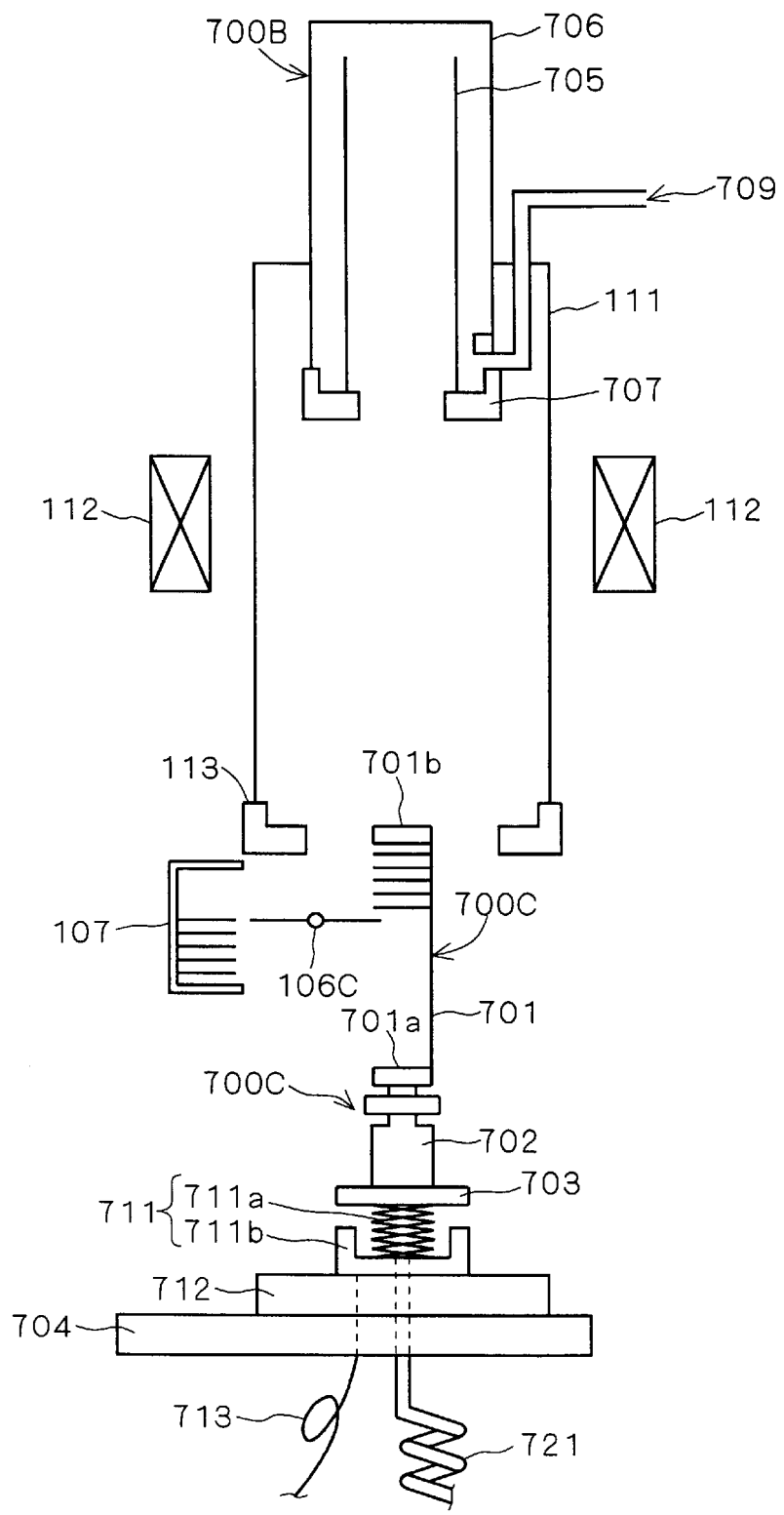
FIGS. 55 to 59 are schematic diagrams showing a structure of an LPCVD (Low Pressure Chemical Vapor Deposition) apparatus in accordance with a third preferred embodiment of the present invention.
Figure 56:
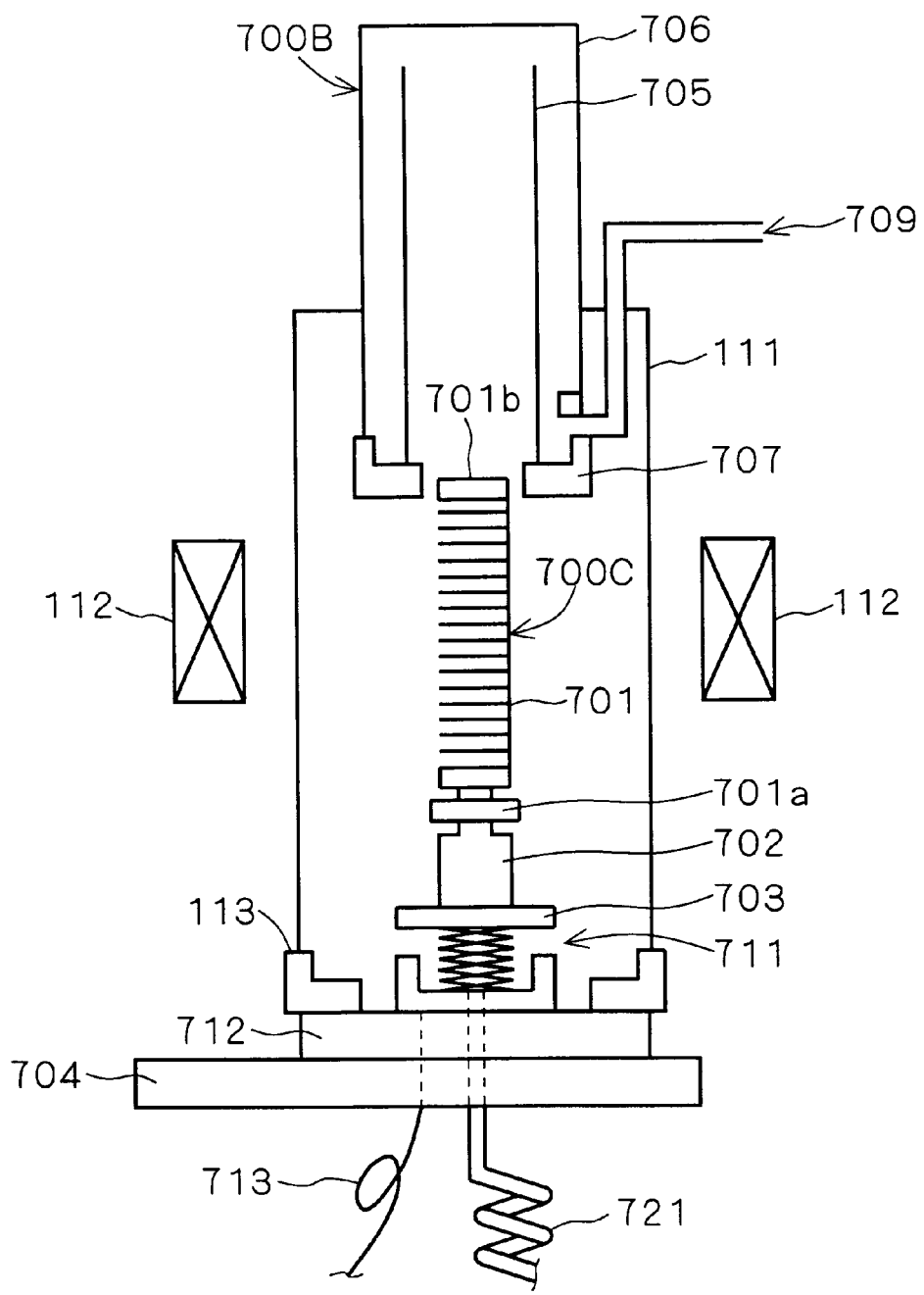
Figure 57:
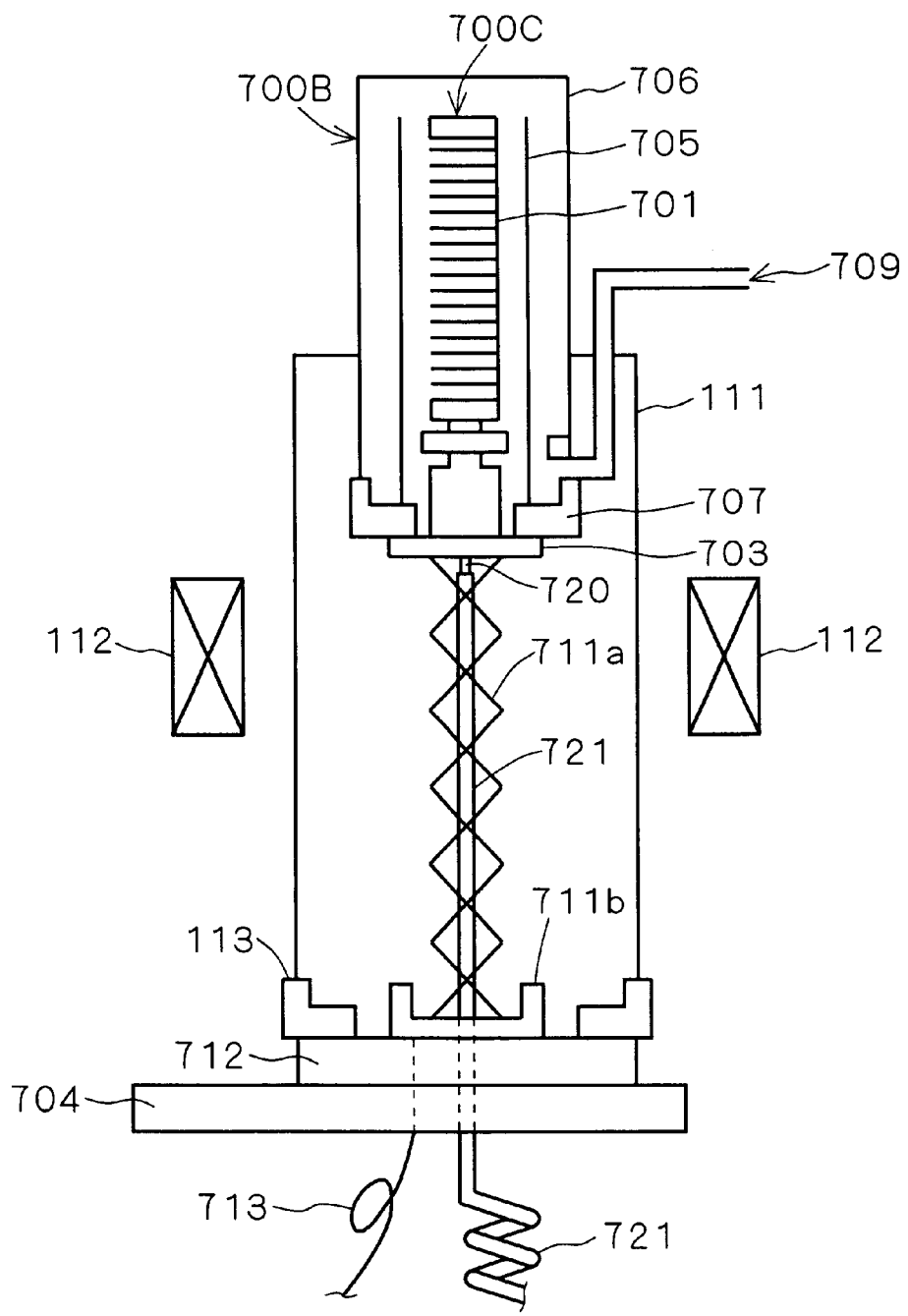

FIGS. 55 to 57 are schematic diagrams showing a structure of an LPCVD apparatus in accordance with the third preferred embodiment of the present invention. A degassing pressure vessel 111 covers at least some portions of the reaction pipe 705 and the pressure vessel 706 of the processing portion 700B shown in FIG. 4, and conducts thereto. The degassing pressure vessel 111 comprises a sealed portion 113 on the opposite side of the processing portion 700B. Sealed is between the degassing pressure vessel 111 and the processing portion 700B, thereby keeping vacuum.

Between the processing portion 700B and the sealed portion 113, tubular RTA apparatus 112 are provided around the degassing pressure vessel 111. As specific examples of the degassing pressure vessel 111 and the RTA apparatus 112, a tubular quartz pipe and lamps arranged in a tubular form may be used.

A moving portion 700C has a structure in which an inner elevator 711 and a base 712 are added between the base 703 and the boat elevator 704 in the structure of the moving portion 700A shown in FIG. 47. The inner elevator 711 is arranged closer to the boat 701 than the base 712. The boat 701 has an exhaust function as well as of mounting the wafer to be processed, and may adopt the structure shown in the second preferred embodiment.

The moving portion 700C further comprises the elastic pipe 721 connected to a not-shown exhaust apparatus and a power supply line 713 for supplying the power to drive the inner elevator 711 from a not-shown power supply. The pipe 721 and the power supply line 713 penetrate the boat elevator 704 and the base 712. The pipe 721 is materialized by employing the stainless steel discussed in the second preferred embodiment.

In FIG. 55, from a state where the moving portion 700C is drawn out from the degassing pressure vessel 111, the boat elevator 704 rises towards to the degassing pressure vessel 111 by a now-shown driving mechanism. In parallel to this operation, the wafer to be processed (on which the first layer is formed) is carried from the cassette 107 to the boat 701 by a carrier arm 106c. Thus, the wafers are sequentially mounted on the boat 701 from the side of top plate 701b to the side of bottom plate 701a. The power supply line 713 and the pipe 721 are capable of contracting and extending, and therefore there arises no problem in the operation even if the moving portion 700C moves away from the not-shown power supply and exhaust apparatus.

In FIG. 56, when the base 712 comes into contact with the sealed portion 113 to seal the degassing pressure vessel 111, the boat elevator 704 stops rising. In this state, the wafers mounted on the boat 701 do not yet enter the reaction pipe 705 and stay near the RTA apparatus 112. In this state, the insides of the reaction pipe 705, the pressure vessel 706 and the degassing pressure vessel 111 are exhausted through the pipe 721 and/or the exhaust pipe 709, to setting the pressure to be equal to or lower than that in the CVD for the film formation of the second layer, e.g., 40 Pa. After the pressure becomes a desirable value, the inner elevator 711 is driven to enter the base 703 and the constituents of the moving portion 700C arranged on the side of the boat 701 from the base 703 into the reaction pipe 705. In parallel to this operation, a heat treatment is performed at a temperature equal to or higher than that in the CVD for the film formation of the second layer, e.g., 800° to 1000° C. by using the RTA apparatus 112. Through the annealing in this ambient, the gas desorbed from the first layer is exhausted mainly through the pipe 721.

In FIG. 57, when the base 703 comes into contact with the manifold 707 to close the reaction pipe 705, the inner elevator 711 stops rising. Since the pipe 721 is capable of extending, the exhaust function is not deteriorated even if the inner elevator 711 rises and accordingly the boat 701 rises in the degassing pressure vessel 111.

Figure 58:
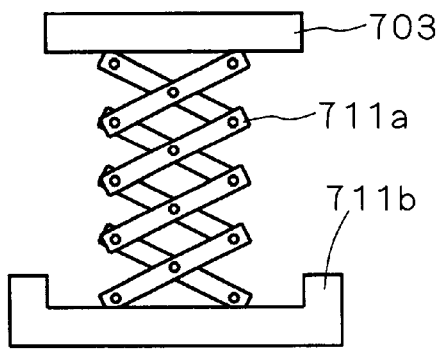
Figure 59:
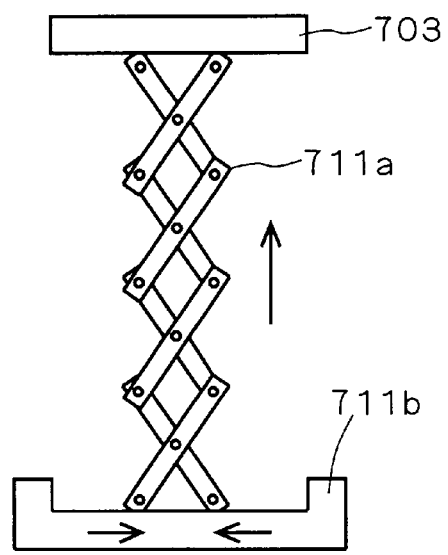

FIGS. 58 and 59 are schematic diagrams showing a mechanism of the inner elevator 711. The inner elevator 711 comprises an extending portion 711a and a driving portion 711b for driving the extending portion 711a. The extending portion 711a has a structure of lazy tongs, and when a pair of ends on one side thereof are closed by the driving portion 711b, the extending portion 711a extends. For this driving, one side and the other side of the extending portion 711a are movably coupled to the driving portion 711b and the base 703, respectively.

In the third preferred embodiment, since annealing is performed by the RTA apparatus 112 immediately before the CVD is performed on the wafer in the reaction pipe 705, the first basic idea of the present invention is achieved in a shorter time than in the case of FIG. 47.

The Fourth Preferred Embodiment

The fourth preferred embodiment is based on the second basic idea of the present invention. Specifically, the back surface of the semiconductor substrate is dry-etched while the main surface of the semiconductor substrate is protected.

Figure 60:
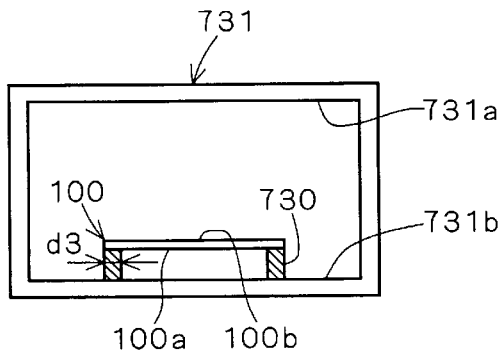
FIG. 60 is a schematic diagram showing an etching technique in accordance with a fourth preferred embodiment of the present invention.

FIG. 60 is a schematic diagram showing an etching technique in accordance with the fourth preferred embodiment of the present invention. The wafer 100 on which the first layer is formed is mounted on a susceptor 730 in a chamber 731. As a structure of the chamber 731, a well-known one may be adopted, and therefore the structure is simply shown in this figure. The susceptor 730 has a ring shape with a width d3 of 1 to 5 mm and supports a perimeter of the main surface 100a of the wafer 100. In a region of about 5 to 7 mm of the outermost perimeter of the wafer 100, since no effective chip can not be usually provided, there arises no problem in manufacture even if the susceptor 730 supports this position.

In the chamber 731, plasma is generated between surfaces 731a and 731b facing each other. The plasma may be generated by an external electrode system or an internal electrode system. The susceptor 730 is mounted on the surface 731b and the wafer 100 is mounted on the susceptor 730. The main surface 100a of the wafer 100 faces the surface 731b of the chamber 731 and the back surface 100b to be etched faces the surface 731a of the chamber 731. The first layer on the back surface 100b of the wafer 100 can be removed by the generated plasma. No plasma goes to the main surface 100a through a clearance between the wafer 100 and the susceptor 730, and the main surface 110a is not exposed to the plasma. Therefore, the manifold 100a is not etched.

Taking the AND-type flash memory shown in (b-1) as an example, before forming the bottom silicon oxide film 7a, the TEOS oxide film 601 formed on the back surface of the silicon substrate 1 is removed by using a mixed gas of $CHF_3$ and $CF_4$, or further the phosphor-doped amorphous silicon film 501 is removed by using $SF_6$ or $CHF_3$.

The Fifth Preferred Embodiment

The fifth preferred embodiment is also based on the second basic idea of the present invention. Specifically, the back surface of the semiconductor substrate is wet-etched while the main surface of the semiconductor substrate is protected.

Figure 61:
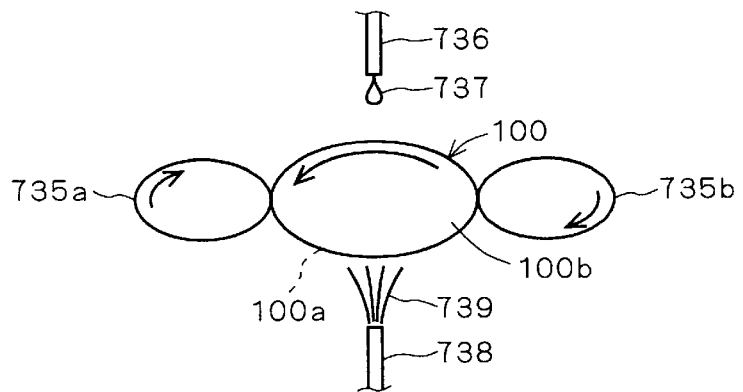
FIG. 61 is a schematic diagram showing an etching technique in accordance with a fifth preferred embodiment of the present invention.

FIG. 61 is a schematic diagram showing an etching technique in accordance with the fifth preferred embodiment of the present invention. Rotation mechanisms 735a and 735b rotatably drive a side end surface of the wafer 100, to rotate the wafer 100. A predetermined liquid etchant 737 is given to the back surface 100b of the wafer 100 from a nozzle 736 and an inert gas 739 such as $N_2$ is sprayed to the main surface 100a from a nozzle 738. Thus, the first layer formed on the back surface 100b can be removed while the etchant is prevented from going around to the main surface 100a from the back surface 100b.

Taking the AND-type flash memory shown in (b-1) as an example, before forming the bottom silicon oxide film 7a, the TEOS oxide film 601 formed on the back surface of the silicon substrate 1 is removed by using a hydrofluoric acid solution ($HF+H_2O$), and the phosphor-doped amorphous silicon film 501 is removed by using an ammonia peroxide mixture (APM) (mixture of $NH_4OH+H_2O_2+H_2O$).

The Sixth Preferred Embodiment

As a technique to protect the main surface of the semiconductor substrate from etching when the back surface thereof is etched, a covering with an etching protection film may be adopted. In this case, a barrel-type etching chamber may be adopted as an etching chamber and the back surface of the semiconductor substrate can be thereby easily etched.

Taking the AND-type flash memory shown in (b-1) as an example, before forming the bottom silicon oxide film 7a, a resist is applied to the main surface side of the silicon substrate 1 and a surface of the resist is harden by ultraviolet radiation. After that, a heat treatment is performed in the dry air at a temperature of 150° C. for sixty minutes. Then, the TEOS oxide film 601 is removed by using the hydrofluoric acid solution ($HF+H_2O$), like in the fifth preferred embodiment. After that, the heat treatment is performed again on the resist which is swollen in the removal of the TEOS oxide film 601 in the dry air at a temperature of 150° C. for 60 minutes. The phosphor-doped amorphous silicon film 501 is thereafter removed by using the ammonia peroxide mixture (APM) (mixture of $NH_4OH+H_2O_2+H_2O$).

Although the number of process steps increases in the sixth preferred embodiment, it is advantageous that an existing etching apparatus can be used.

It is also desirable that the apparatus using the etching technique shown in the fourth to sixth preferred embodiments should replace the RTA apparatus 110 in the structure shown in FIG. 47.

The Seventh Preferred Embodiment

The seventh preferred embodiment is based on the third basic idea of the present invention. Specifically, at least a surface of the first layer formed on the semiconductor substrate is oxidized, and this makes gas desorption harder in the subsequent film formation of the second layer.

Specifically, a rapid thermal oxidation (hereinafter referred to as "RTO") is performed in an oxidizing gas atmosphere such as $H_2/O_2$ atmosphere or $O_2$ atmosphere. In the case where the RTO is performed in the $H_2/O_2$ atmosphere, $H_2$ gas and $O_2$ gas are introduced onto the wafer which is heated up to 1000° C. by, e.g., a lamp at a pressure of 300 Pa or lower. A lot of radicals of H and OH are generated in a chain reaction. With such active oxidation seed, oxidation occurs.

Taking the AND-type flash memory shown in (b-1) as an example, before forming the bottom silicon oxide film 7a, $H_2O$, OH, SiO, $CO_2$ and unreacted $C_2H_5O$ are removed or oxidized from the TEOS oxide film 601 and the phosphor-doped polysilicon film 501 on the main surface and the back surface of the wafer, and therefore it is possible to reduce the gas desorption and film reformation which occur later.

Taking the stacked gate flash memory show in (b-2) as an example, the silicon substrate 901 in an isolation region is etched, the trench isolation oxide films 902 are formed by the HDP method, the tunnel oxide film 904 and the doped amorphous silicon film 905 are formed and patterned to form the floating gate, and then before forming the bottom silicon oxide film 907a, the RTO is performed. In this case, since the gas may be desorbed from the trench isolation oxide films 902 as well as from the doped amorphous silicon film 905, a great effect is produced.

Both in the cases of AND-type flash memory shown in (b-1) and stacked gate flash memory shown in (b-2), since the surface of the floating gate is also oxidized, it is desirable that the film thicknesses of the ONO films 7 and 907 should be determined in consideration of the film thickness of the oxidized floating gate.

The first layer from which a film forming gas is desorbed is formed not only on the main surface of the semiconductor substrate but also on the back surface. Therefore, it is desirable that in performing the RTO, an oxidizing gas should be sufficiently supplied not only to the main surface but also to the back surface and the temperature should be set high. In this case, the RTO can be performed by e.g., diverting the RTA apparatus 110 discussed in the first preferred embodiment with reference to FIG. 44. It is only necessary to use an oxidizing gas, instead of the inert gas, as a gas introduced from the gas introduction port 101c.

On the other hand, in order to oxidize only the back surface, the oxidizing gas should be introduced by using the susceptor 730 and the chamber 731 discussed in the fourth preferred embodiment with reference to FIG. 60 and heated by the lamps arranged around the chamber 731. In this case, the chamber 731 is made of, e.g., quartz. Since the main surface is not oxidized, the surface of the floating gate is not oxidized in both the AND-type flash memory shown in (b-1) and the stacked gate flash memory shown in (b-2). Therefore, in determining the film thickness of the ONO films 7 and 907, it is not necessary to consider the oxide film formed on the surface of the floating gate.

The Eighth Preferred Embodiment

The RTO for oxidizing at least the surface of the first layer may be performed in the LPCVD process for forming the second layer on the semiconductor substrate when the wafer is loaded or after loading the wafer before the film formation, or at both timings. In this case, an oxidizing gas of appropriate amount, such as $O_2$ or a mixed gas of $O_2/Ar$ is introduced and heated.

It is desirable that the structure shown in FIG. 47 should be adopted by using the RTO apparatus 110 which is diverted as the RTO apparatus as discussed in the seventh preferred embodiment.

It is also desirable that adopting the structure of the third preferred embodiment discussed with reference to FIGS. 55 to 57, the oxidizing gas should be introduced from the gas introduction pipe 708 of the processing portion 700B (FIG. 47).

The Ninth Preferred Embodiment

The ninth preferred embodiment is also based on the third basic idea of the present invention. Specifically, a silicon nitride film (which may contain oxygen) is formed only on the back surface of the semiconductor substrate, to thereby made gas desorption harder in subsequent film formation of the second layer.

In order to form the silicon nitride film only on the back surface, using the susceptor 730 and the chamber 731 discussed in the fourth preferred embodiment with reference to FIG. 60, the silicon nitride film is formed of $SiH_4$ (or DCS) and $NH_3$ by the CVD method. The film formation apparatus may be replaced by the RTA apparatus 110 in the structure shown in FIG. 47.

The Tenth Preferred Embodiment

The tenth preferred embodiment is based on the fourth basic idea of the present invention. On the premise that a gas used for film formation of the first layer should be desorbed in film formation of the second layer, a technique to appropriately control the film thickness of the second layer will be suggested. Specifically, in consideration of film reformation with the desorbed gas, a target value of the film thickness of the second layer is changed.

In film formation, generally, as shown in FIG. 71, the process is performed in parallel on the wafer 100 which is formed for actual formation of elements and the wafer 200 which is formed to monitoring the film thickness. Such a batch as includes both the wafers 100 and the wafers 200 is hereinafter referred to as a "production batch". The production batch may be single or plural.

Then, prior to a process of the production batch, a film formation process is performed by using dummy wafers. Such a batch as includes the dummy wafers is hereinafter referred to as "preceding batch". The data indicated by solid circle in FIG. 1 and the data indicated in FIG. 2 are data on dummy wafers. For example, in the case of AND-type flash memory shown in (b-1), the dummy wafer is a bare silicon wafer or a wafer on which a DCS-HTO film as the second layer or a TEOS film as the first layer is formed.

In a case where a wafer on which a TEOS film is formed as the first layer is used as a dummy wafer, the film formation process for the second layer in the preceding batch is affected by film reformation due to the gas desorbed from the first layer. Therefore, the film formation of the second layer can be performed with high precision on the production batch on the basis of the film formation rate obtained from the result of the film formation process in the preceding batch.

In a case where a bare silicon wafer or a wafer on which a DCS-HTO film is formed as the second layer is used as a dummy wafer, however, the film formation of the second layer in the preceding batch is not affected by film reformation due to the gas desorbed from the first layer. Therefore, it becomes necessary to grasp the effect of film reformation. This will be discussed, referring to the background-art film formation process. Table 2 shows a flow of film formation process in the background art.

TABLE 2

| Batch | Wafer | Target Value of Film Thickness | Film Formation Time | Measured Value |
|---|---|---|---|---|
| ① preceding batch | Dummy | 5.0 nm | 120 min. | 6.0 nm |
| ② production batch I | 100, 200 | 5.0 nm | 100 min. | 5.5 nm |
| ③ production batch II | 100, 200 | 5.0 nm | 98 min. | 5.3 nm |
| ④ production batch III | 100, 200 | 5.0 nm | 94 min. | 5.0 nm |

First, it is assumed that in the preceding batch of process ①, a film formation process for the DCS-HTO film is performed with a target value of 5.0 nm for 120 minutes and a film thickness of 6.0 nm is obtained. In other words, the film formation rate on the dummy wafer is 0.05 nm/min. Since the film thickness required in the production batch is 5.0 nm, a film formation is performed for 100 minutes which is obtained by dividing 5.0 nm by 0.05 nm/min in the production batch I of process ②.

Since a gas is desorbed from the first layer, such as TEOS oxide film, formed on the wafer 100 as discussed earlier, however, film reformation occurs in the production batch I and a film having a thickness thicker than 5.0 nm, e.g., 5.5 nm is formed. In the production batch II of process ③ after that, a film formation is performed for 98 minutes in consideration of temperature change in the CVD apparatus. In the example shown in Table 2, a film having a still thicker thickness of 5.3 nm is formed in the production batch II. Therefore, in the next production batch III of process ④, a film formation is performed for a further reduced time, i.e., 94 minutes, and consequently a film having a thickness of 5.0 nm is obtained.

In contrast to this, determination of the target value for film thickness is changed in the tenth preferred embodiment. Table 3 shows a flow of film formation process in the tenth preferred embodiment.

TABLE 3

| Batch | Wafer | Target Value of Film Thickness | Film Formation Time | Measured Value |
|---|---|---|---|---|
| ① preceding batch I | Dummy | 5.0 nm | 120 min. | 6.0 nm |
| ② production batch I | 100, 200 | 5.0 nm | 100 min. | 5.5 nm |
| ③ preceding batch II | Dummy | 4.7 nm | 94 min. | 4.7 nm |
| ④ production batch II | 100, 200 | 4.7 nm | 94 min. | 5.0 nm |

Like in Table 2, it is known from the result on the preceding batch I of process ① that the film formation rate is 0.05 nm/min and a film formation is performed for 100 minutes, to obtain a film having a thickness of 5.5 nm in the production batch I of process ②. It is thought that the increase in film thickness by 10% should be due to the desorbed gas. Then, in consideration of the effect of the desorbed gas, the target value for film thickness is determined to be 4.7 nm, and a film formation is performed for 94 minutes in the preceding batch II of process ③. Since no gas is desorbed when the dummy wafer is used, the second layer is formed with a film thickness of 4.7 nm. With the target value for film thickness determined to be 4.7 nm which is thinner than the original target value of 5.0 nm, a film formation is performed in the production batch II of process ④, to achieve a film of thickness of 5.0 nm.

In the film formation process of the tenth preferred embodiment, unlike in the background-art film formation process, the difference in film formation rate between the preceding batch in which gas desorption does not occur and the production batch in which gas desorption occurs is once checked. Then, the film formation rate is reviewed on the basis of the difference. Changing the point of view, considering that the film formation rate obtained from the result on the preceding batch I of process ① as a reference rate, this means a change of the target value for film thickness. This reduces the number of production batches with large error in film thickness in the film formation of the second layer as compared with the background-art film formation process. For example, when the film thickness allows a margin of 5.0 nm±0.25 nm, the production batches I and II are defective in the background-art film formation process. In contrast to this, only the production batch I is defective in the film formation process of the tenth preferred embodiment.

Thus, the film formation condition for the second layer with a predetermined film thickness is first obtained by using the dummy wafer. Then, under the obtained film formation condition, the second layer is formed on the wafer on which the first layer is formed. The film formation condition is modified on the basis of the film thickness of the second layer obtained in the film formation. With the modified film formation condition, the second layer is formed again on the dummy wafer and the wafer on which the first layer is formed. In such a film formation process, it is possible to estimate the effect of desorption of the gas used for the formation of the first layer in the film formation of the second layer, from the first and second film formation processes. Therefore, it is possible to form the second layer with a predetermined film thickness in the following production batches.

Further, the film formation rate is varied to some degree depending on the number of lots (accordingly the number of wafers) in the production batch. Therefore, it is desirable that the film formation in the preceding batch should be processed by types of the production batches, to determine the film formation rate. For example, when one lot consists of 25 wafers, it is desirable that the film formation in the preceding batch should be performed for each case of four lots, three lots, two lots, one lot and sheet-by-sheet film formation.

The Eleventh Preferred Embodiment

The eleventh preferred embodiment is also based on the fourth basic idea of the present invention. When the film formation is started in the production batch by using a film formation apparatus, the batches are classified by types and thicknesses of the films to be processed and then processed. If the film formation process is performed, however, depending simply on the film types and film thickness, without consideration of types of semiconductor devices which are eventually materialized on the wafer used in the production batch and processes executed before the film formation process in the production batch, there arises a possibility that a gas might be desorbed from a film deposited on the main surface and back surface of the wafer to be processed, causing the above-discussed problem of film reformation, to thicken a film as compared with a desired film thickness.

Then, in the eleventh preferred embodiment, the film formation time for the production batch which are subjected to film formation is automatically determined on the basis of history of the film formation process.

Figure 62:
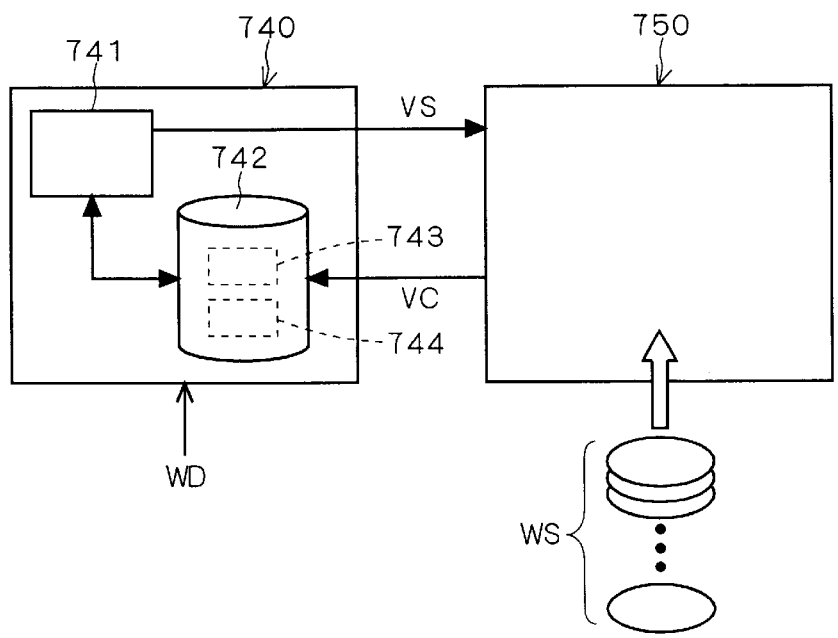
FIG. 62 is a schematic diagram showing an outline of a system to which an eleventh preferred embodiment of the present invention is applicable.

FIG. 62 is a schematic diagram showing an outline of a system to which the eleventh preferred embodiment of the present invention is applicable. A film formation apparatus 750 and a control unit 740 can communicate with each other. The control unit 740 gives designation of film formation time VS to the film formation apparatus 750 and the film formation apparatus 750 occasionally reports a process condition VC to the control unit 740. A production batch WS is supplied to the film formation apparatus 750 as a subject for film formation. The type of production batch WS and wafer information WD for specifying processes executed until the present time are given to the control unit 740.

The control unit 740 is provided with a control body 741 and a database 742 between which information is transferred. The database 742 stores recipe data 743 and process histories 744. FIG. 63 is a diagram schematically showing the recipe data 743. Though the recipe data 743 is illustrated as card group with tabs in this figure for convenience, the recipe data 743 may actually take any form. In a card on device type A described are processes 1A, 2A, . . . NA which are required to obtain the device type A, film structures $X_{1A}$, $X_{2A}$, . . . $X_{NA}$ which are found on the main surface side as the result of these processes and film structures $Y_{1A}$, $Y_{2A}$, . . . $Y_{NA}$ which are found on the back surface side as the result of these processes. These processes 1A, 2A, . . . NA include not only film formation processes but also processes for removing films such as etching process. This is because the film structures $X_{1A}$, $X_{2A}$, . . . $X_{NA}$, $Y_{1A}$, $Y_{2A}$, . . . $Y_{NA}$ are changed by both formation and removal of the films. These film structures are stored in the process history 744, being associated with the process condition VC.

In the following discussion of the eleventh preferred embodiment, assuming that all the wafers used in one production batch are wafers used for obtaining the same device type, and the film type and the film thickness for the production batch are already determined, a procedure to determine the film formation time for obtaining the determined film thickness on the determined film type will be presented. When there are a plurality of production batches in which the device type, the film type and the film thickness are variously different, the production batches should be classified by device types, film types and film thicknesses.

Figure 64:
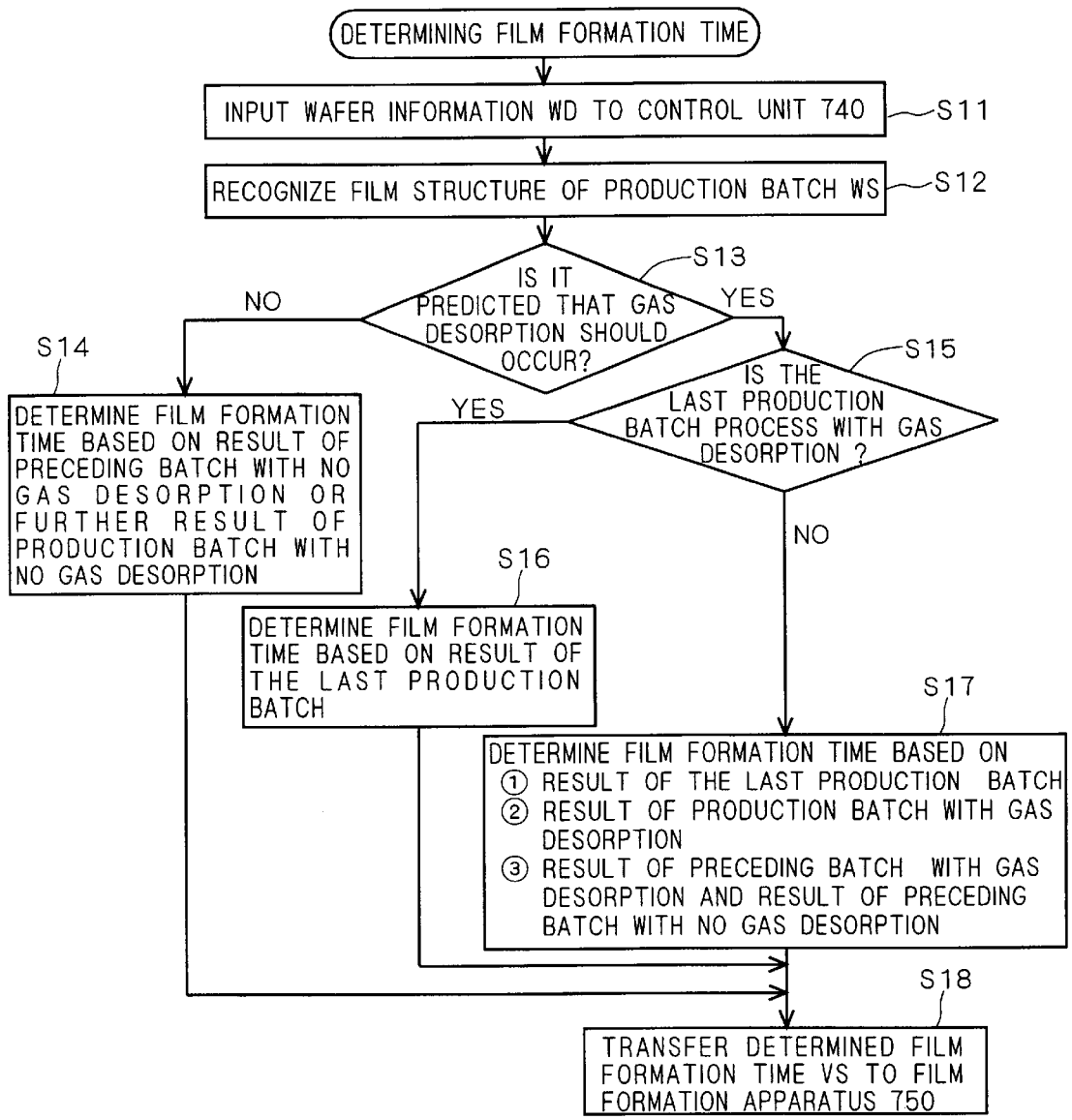
FIG. 64 is a flowchart showing a procedure in accordance with the eleventh preferred embodiment of the present invention.

FIG. 64 is a flowchart showing a procedure for determining the film formation time in accordance with the eleventh preferred embodiment of the present invention. In the step S11, first, the wafer information WD on the production batch WS that is subjected to film formation by the film formation apparatus 750 is inputted to the control unit 74. Subsequently, in the step S12, the control unit 740, more specifically the control body 741 accesses the database 742 to refer to the recipe data 743. Then, the control body 741 recognizes the current condition of the production batch WS, i.e., the film structure immediately before the film formation process on the basis of the wafer information WD.

In the step S13, considering the current film structure of the production batch WS, whether gas desorption occurs or not in the present film formation process is predicted. Taking the stacked gate flash memory shown in (b-2) as an example, when the bottom silicon oxide film 907a is formed, the doped amorphous silicon film 905 is already present on the main surface of the silicon substrate 901. In such a case, it is predicted that gas desorption should occur by the process for forming the bottom silicon oxide film 907a. When the wafer information WD indicates that the type of the production batch WS is a stacked gate flash memory and the doped amorphous silicon film 905 is already formed until the present time, occurrence of gas desorption is predicted with reference to the recipe data 743.

If it is not predicted that gas desorption should occur, the film formation time is determined in the step S14. Specifically, the control body 741 obtains the result on a preceding batch for forming the same film type as in the present film formation process under the condition that a gas should not be desorbed, from the process history 744. From the result, the film formation rate is calculated and the film formation time needed for obtaining the film thickness required in the present film formation process is determined. At this time, the film formation time of the present film formation process may be determined also in consideration of the result on a production batch for forming the same film type as in the present film formation process under the condition that a gas should not be desorbed, which is obtained from the process history 744. In other words, the film formation time for obtaining a desired film thickness is determined with reference to a film formation process on the same film type in which gas desorption does not occur. This is an adequate determination, in consideration that occurrence of gas desorption is not predicted in the present film formation process.

When occurrence of gas desorption is predicted in the step S13, in the step S15, it is judged whether or not the last production batch is a process in which gas desorption occurs. This judgment is based on the process history 744. In this judgment, "the last production batch" is a production batch on a film formation process for forming the same film type as in the present film formation process. Taking the AND-type flash memory shown in (b-1) as an example, gas desorption occurs in the film formation of the bottom silicon oxide film 7a on the phosphor-doped amorphous silicon film 9, but gas desorption does not occur in the film formation of the silicon oxide film 11 on the tungsten silicide film 8b, even though both these processes are performed to obtain the silicon oxide films.

If the last production batch is a process in which gas desorption occurs, in the step S16, the film formation time is determined on the basis of the result on the last production batch. In other words, with reference to the result on a film formation process for the same film type in which gas desorption occurs, on which the current condition of the film formation apparatus 750 is reflected, the film formation time for obtaining the desired film thickness is determined. This is an adequate determination, in consideration that occurrence of gas desorption is predicted in the present film formation process.

If it is predicted that gas desorption should occur in the present film formation process and the last production batch is not a process in which gas desorption occurs, in the step S17, the film formation time is determined. Specifically, the control body 741 searches the process history 744, and the film formation time of the present film formation process is determined on the basis of the first result and at least one of the second and third results which are discussed below.

The first result is a result on the last production batch, i.e., a result on the last one of the production batches in which the same film type as in the present film formation process is formed and gas desorption does not occur. The second result is a result on a production batch in which the same film type as in the present film formation process is formed and gas desorption occurs (accordingly, not the last production batch). The third result is a result on a preceding batch in which the same film type as in the present film formation process is formed and gas desorption does not occur, and a result on a preceding batch in which the same film type as in the present film formation process is formed and gas desorption occurs.

When the second result is obtained, the effect of whether gas desorption occurs or not on the film formation process of the production batch can be estimated by comparison between the first and second results, and the film formation time for obtaining the desired film thickness can be thereby determined. Further, when the third result is obtained, the effect of whether gas desorption occurs or not on the film formation process of the preceding batch can be estimated, and the film formation time for obtaining the desired film thickness can be determined by considering the effect of film reformation together with the first result.

After that, in the step S18, the determined film formation time VS is transferred from the control unit 740 to the film formation apparatus 750.

With such a procedure, grasp of film structure, judgment on whether gas desorption occurs or not and determination of film formation time are automatically performed, and accordingly no interruption of the film formation process is needed. Therefore, stagnation in the process is reduced. Further, though count error on the number of batch processes and lots, error in referring to history data and calculation error are likely to occur in manual operation, the eleventh preferred embodiment prevents error and produces a great effect of saving manpower. When a process is performed on a small number of device types, especially, the eleventh preferred embodiment is effective.

The Twelfth Preferred Embodiment

The twelfth preferred embodiment is also based on the fourth basic idea of the present invention. The twelfth preferred embodiment shows a case where the same film formation process is performed on a plurality of lots in which the films to be formed have the same type and thickness and the devices to be eventually obtained have various types. In this case, the film formation time is determined by referring to the respective process histories for each lot, and film formation is thereby achieved with the desired film thickness.

Figure 65:
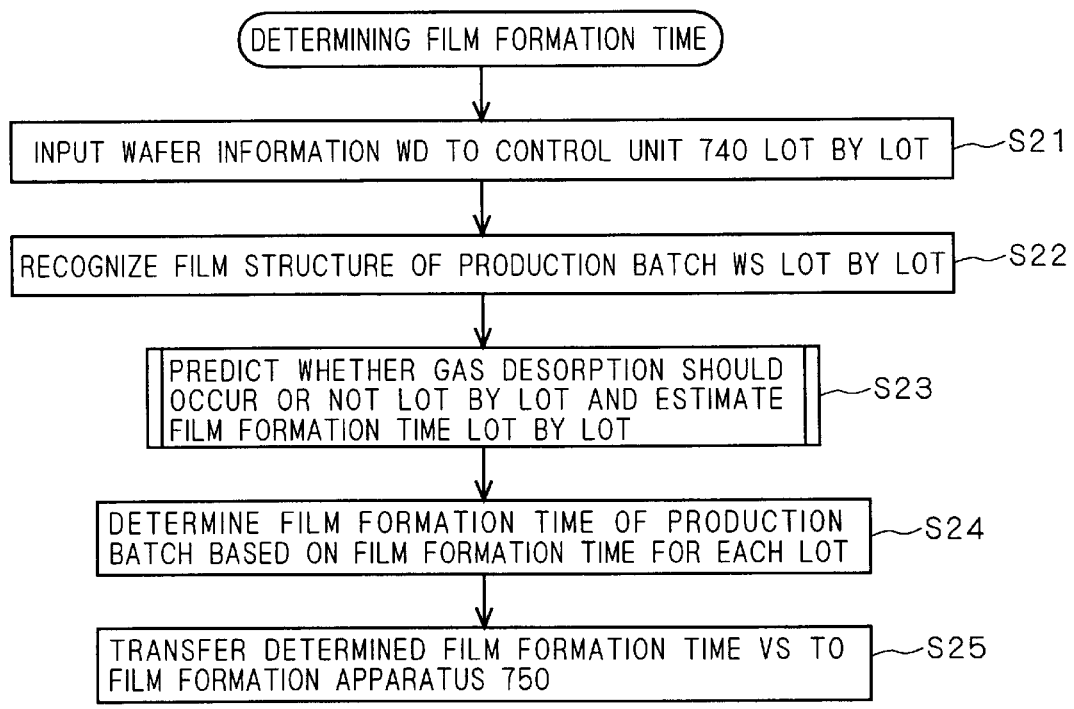
FIG. 65 is a flowchart showing a procedure in accordance with a twelfth preferred embodiment of the present invention.

The system shown in FIG. 62 is also applicable to the twelfth preferred embodiment. FIG. 65 is a flowchart showing a procedure to determine the film formation time in accordance with the twelfth preferred embodiment of the present invention. In the step S21, first, the wafer information WD on the production batch WS which is subjected to film formation by the film formation apparatus 750 is inputted to the control unit 740 lot by lot. In the step S22, the control unit 740, for example, the control body 741 accesses the database 742 to refer to the recipe data 743. Then, the control body 741 recognizes the current film structure of the production batch WS on the basis of the wafer information WD lot by lot.

Then, in the step S23, whether gas desorption should occur or not in the present film formation process is predicted, like in the eleventh preferred embodiment, lot by lot, and further the film formation time is estimated lot by lot. Even if the present film formation process in the production batch WS is a lot in which gas desorption occurs, the film structure is different depending on the type of lot and accordingly whether or not film reformation should occur due to the gas desorption is different. For example, in a film formation process for forming a silicon oxide film, there may be a case where a TEOS oxide film is exposed in some lots and a doped amorphous silicon film is exposed in the other lots.

In the step S24, the film formation time of the production batch is determined on the basis of the film formation time for each lot. For example, it is only necessary to calculate addition average of film formation times based on the number of lots. After that, in the step S25, the determined film formation time VS is transferred from the control unit 740 to the film formation apparatus 750.

Since the number of process lots in one production batch increases in the twelfth preferred embodiment, it is possible to save film-forming materials and the film formation time.

The Thirteenth Preferred Embodiment

In the eleventh and twelfth preferred embodiments, the wafer information WD may have identification numbers for identifying lots which are subjected to film formation. In this case, the recipe data 743 has a function of associating the identification numbers with process steps. For example, the identification numbers may be associated with the process steps through the association with the device type.

In the steps S12 and S22, the film structure is recognized lot by lot. Further, these preferred embodiments are applicable not only to the production batch WS but also to a batch including experimental lots with no device type determined and product lots for obtaining products. This is because even the experimental lots, being identified by using the identification numbers to allow process steps in an experiment to be associated with the identification numbers in the recipe data 743, can be treated like the product lots.

Table 4 indicates association between the identification numbers of experimental lots and process steps, schematically showing the function of the recipe data 743.

TABLE 4

| Identification Number | Film Structure | Process Step |
|---|---|---|
| #101 | Film Structure $Z_{101}$ | Process Step $H_{101}$ |
| #102 | Film Structure $Z_{102}$ | Process Step $H_{102}$ |
| #103 | Film Structure $Z_{103}$ | Process Step $H_{103}$ |
| ... | ... | ... |

The film structures and the process steps associated with the identification numbers #101, #102 and #103 of the experimental lots are film structures $Z_{101}$, $Z_{102}$, $Z_{103}$ and process steps $H_{101}$, $H_{102}$, $H_{103}$, respectively. Therefore, if the identification numbers of the experimental lots are obtained from the wafer information WD, it becomes possible to predict whether gas desorption should occur or not through searching the recipe data 743.

The Fourteenth Preferred Embodiment

The film structure of the wafer which are subjected to film formation may be recognized through measurement besides it is recognized on the basis of the wafer information WD as shown in the eleventh to thirteenth preferred embodiments.

Figure 66:
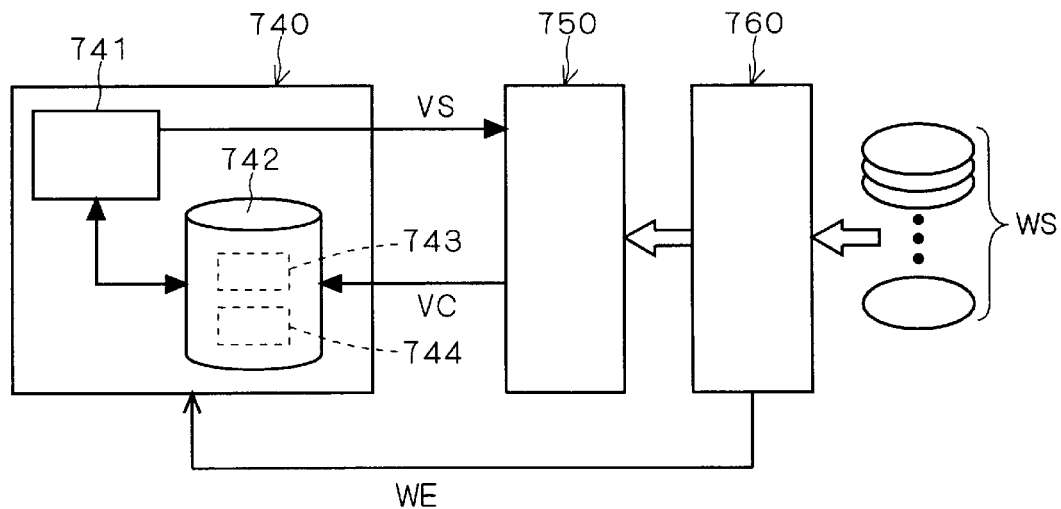
FIG. 66 is a schematic diagram showing an outline of a system to which a fourteenth preferred embodiment of the present invention is applicable.

FIG. 66 is a schematic diagram showing an outline of a system to which the fourteenth preferred embodiment of the present invention is applicable. The control unit 740 shown in the eleventh preferred embodiment with reference to FIG. 62 can be also adopted in the fourteenth preferred embodiment. Instead of the wafer information WD, however, film structure information WE is inputted thereto. The film structure information WE is obtained from a film structure measuring apparatus 760 for measuring the film structure of the wafer in the production batch WS. Therefore, the recipe data 743 is not necessarily needed.

It is not necessary to measure the film structures of all the wafers in the lots used in the production batch WS in the film structure measuring apparatus 760. Only one of a plurality of wafers which have been subjected to the same processes until the present time has to be measured. When a plurality of lots having different device types are subjected to the same film formation process, like in the twelfth preferred embodiment, it is natural that the film structure should be measured lot by lot.

For measurement of the film structure, for example, an ellipsometry can be adopted. By ellipsometry, the film type can be identified for a short time without a large-scale apparatus since the measurement can be made under atmospheric pressure. For example, though Japanese Patent Application Laid Open Gazette No. 9-275139 shows a technique to identify the film type by measuring gas concentration with a quadrupole mass spectrometer, high resolution is needed when a plurality of films are measured. In contrast to this, the measurement of the fourteenth preferred embodiment can be easily performed. Further, information on the back surface can be obtained by turning the wafer over and performing measurement like on the main surface.

The wafer of which the film structure is measured by the film structure measuring apparatus 760 is carried to the film formation apparatus 750 where the film formation process is performed thereon. The film formation time in this case is determined by the control unit 740 as the film formation time VS. The film formation apparatus 750 occasionally reports the process condition VC to the control unit 740.

Figure 67:
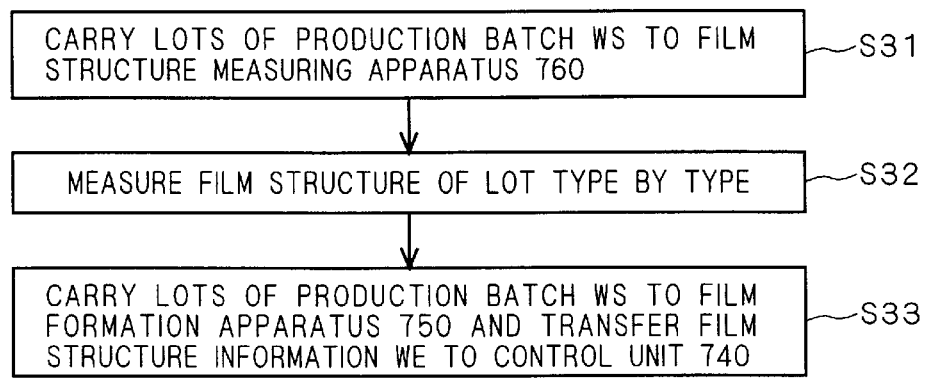
FIG. 67 is a flowchart showing a procedure in accordance with the fourteenth preferred embodiment of the present invention.

FIG. 67 is a flowchart showing the steps S31 to S33 which can replace the steps S11 and S12 discussed in the eleventh preferred embodiment with reference to FIG. 64 and the steps S21 and S22 discussed in the twelfth preferred embodiment with reference to FIG. 65. In the step S31, the lots of the production batch WS are carried to the film structure measuring apparatus 760. Subsequently, in the step S32, the film structure of the lot is measured by device types in the film structure measuring apparatus 760. If the lots of the production batch WS are lots for obtaining the same device type, only the film structure of one lot has to be measured. Then, in the step S33, the lots of the production batch WS are carried to the film formation apparatus 750 and the film structure data WE is transferred to the control unit 740.

After that, the step S13 and the following steps are executed like in the eleventh preferred embodiment or the step S23 and the following steps are executed like in the twelfth preferred embodiment. Then, the determined film formation time VS is transferred to the film formation apparatus 750 like in the steps S18 and S25.

Thus, in the fourteenth preferred embodiment, the same film formation process can be performed on a plurality of lots having different device types, even if the histories on the lots are uncertain, only if the lots have the same film type and film thickness, and further the effect of film reformation can be reduced.

For example, by replacing the film structure measuring apparatus 760 by the RTA apparatus 110 shown in FIG. 47, the fourteenth preferred embodiment can be achieved.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device, comprising the steps of:
    (a) forming a first layer by performing the chemical vapor deposition method on a semiconductor substrate at a first temperature and a first pressure for a first period;
    (b) performing a heat treatment under an inert gas atmosphere while exhausting a gas from the vicinity of said semiconductor substrate; and
    (c) forming a second layer by performing the chemical vapor deposition method at a second temperature higher than said first temperature and a second pressure lower than said first pressure for a second period,
    wherein said heat treatment is performed in said step (b) after the step (a) and before the step (c) at a third temperature equal to or higher than said second temperature and a third pressure equal to or lower than said second pressure.

2. The method of manufacturing a semiconductor device according to claim 1, wherein
    said heat treatment in said step (b) is performed for a third period equal to or longer than said second period.

3. The method of manufacturing a semiconductor device according to claim 1, wherein
    a rapid thermal annealing is adopted as said heat treatment in said step (b) entirely on said semiconductor substrate.

4. The method of manufacturing a semiconductor device according to claim 2, wherein
    a rapid thermal annealing is adopted as said heat treatment entirely on said semiconductor substrate in said step (b).

5. A method of manufacturing a semiconductor device, comprising the steps of:
    (a) forming a first layer on both a main surface and a back surface of said semiconductor substrate by performing the chemical vapor deposition method on said semiconductor substrate at a first temperature and a first pressure;
    (b) removing said first layer formed on said back surface; and
    (c) forming a second layer by performing the chemical vapor deposition method at a second temperature higher than said first temperature and a second pressure lower than said first pressure for a second period.

6. The method of manufacturing a semiconductor device according to claim 5, wherein
    said back surface is etched by using plasma while said main surface is not exposed to said plasma in said step (b).

7. The method of manufacturing a semiconductor device according to claim 5, wherein
    said back surface is etched by using a liquid etchant while a gas is sprayed on said main surface in said step (b).

8. The method of manufacturing a semiconductor device according to claim 5, wherein
    an etching is performed on said semiconductor substrate with an etching protection film formed on said main surface in said step (b).

9. A method of manufacturing a semiconductor device, comprising the steps of:
    (a) forming a first layer on both a main surface and a back surface of a semiconductor substrate by performing the chemical vapor deposition method on said semiconductor substrate at a first temperature and a first pressure;
    (b) covering said first layer formed on said back surface; and
    (c) forming a second layer by performing the chemical vapor deposition method at a second temperature higher than said first temperature and a second pressure lower than said first pressure,
    wherein said first layer is covered in said step (b) with a film which prevents gas desorption from said first layer in said step (c).

10. The method of manufacturing a semiconductor device according to claim 9, wherein
    at least a surface of said first layer is oxidized in said step (b).

11. The method of manufacturing a semiconductor device according to claim 9, wherein
    said semiconductor substrate is heated while an oxidizing gas is supplied for said back surface in said step (b).

* * * * *

UNITED STATES PATENT AND TRADEMARK OFFICE
CERTIFICATE OF CORRECTION

PATENT NO.     : 6,723,641 B2
DATED          : April 20, 2004
INVENTOR(S)    : Yuzuriha It is certified that error appears in the above-identified patent and that said Letters Patent is hereby corrected as shown below:

<u>Title page,</u>
Item [73], Assignee, should read:
-- [73] Assignee:  Renesas Technology Corp.
                    Tokyo (JP) --

Signed and Sealed this

Fifteenth Day of June, 2004

JON W. DUDAS
*Acting Director of the United States Patent and Trademark Office*